United States Patent
Hussein et al.

(10) Patent No.: US 10,984,937 B2
(45) Date of Patent: Apr. 20, 2021

(54) ELECTROMAGNETIC TOOL FOR TRANSFERRING MICRO DEVICES AND METHODS OF FABRICATION

(71) Applicant: LuxNour Technologies Inc., Portland, OR (US)

(72) Inventors: Makarem A. Hussein, Portland, OR (US); Mohamed G. Zanaty, Neuchatel (CH)

(73) Assignee: LuxNour Technologies Inc., Portland, OR (US)

(*) Notice: Subject to any disclaimer, the term of this patent is extended or adjusted under 35 U.S.C. 154(b) by 147 days.

(21) Appl. No.: 16/129,730

(22) Filed: Sep. 12, 2018

(65) Prior Publication Data

US 2020/0082965 A1 Mar. 12, 2020

(51) Int. Cl.
| | | |
|---|---|---|
| H01F 7/128 | (2006.01) | |
| H01L 21/04 | (2006.01) | |
| H01L 33/56 | (2010.01) | |
| H01F 7/06 | (2006.01) | |
| H01F 7/02 | (2006.01) | |
| B23Q 3/18 | (2006.01) | |
| B23Q 3/00 | (2006.01) | |

(52) U.S. Cl.
CPC .............. H01F 7/064 (2013.01); B23Q 3/00 (2013.01); B23Q 3/18 (2013.01); H01F 7/0242 (2013.01)

(58) Field of Classification Search
CPC .......... H01F 7/064; H01F 7/128; H01F 7/206; H01L 21/042; H01L 33/56; H01L 21/67144; H01L 21/681; H01L 25/0753; H01L 33/0095; H01L 21/67; B23Q 3/00; B23Q 3/06; B23Q 3/061
USPC ........................................ 335/285, 286, 289
See application file for complete search history.

(56) References Cited

U.S. PATENT DOCUMENTS

| | | | |
|---|---|---|---|
| 7,782,164 B2* | 8/2010 | Tiberghien .......... | B29C 45/1742 335/285 |
| 8,443,837 B2* | 5/2013 | Kimura ............... | B29C 45/7312 137/614.04 |
| 2016/0336304 A1* | 11/2016 | Wu ...................... | H01L 21/6835 |
| 2019/0318951 A1* | 10/2019 | Chang ................. | H01L 21/6835 |
| 2019/0393069 A1* | 12/2019 | Paranjpe ............. | H01L 25/0753 |
| 2020/0083069 A1* | 3/2020 | Hussein ............. | H01L 25/0753 |

* cited by examiner

*Primary Examiner* — Bernard Rojas
(74) *Attorney, Agent, or Firm* — Green, Howard & Mughal LLP

(57) ABSTRACT

An electromagnetic apparatus includes a non-magnetic body structure above a substrate. The electromagnetic apparatus further includes at least one isolation structure including a dielectric material on a portion of the body structure and a magnetic structure having two separate portions, one on each side of the isolation structure. A first magnetic structure portion is on a first sidewall of the isolation structure on an upper surface and on a first sidewall of the body structure and a second magnetic structure portion is on an opposite second sidewall of the isolation structure onto an upper surface and on to a second sidewall of the body structure. The electromagnetic apparatus further includes an electromagnet on a side opposite to the isolation structure. The electromagnet is coupled with the magnetic structure and is a source of the magnetic flux lines when energized.

21 Claims, 32 Drawing Sheets

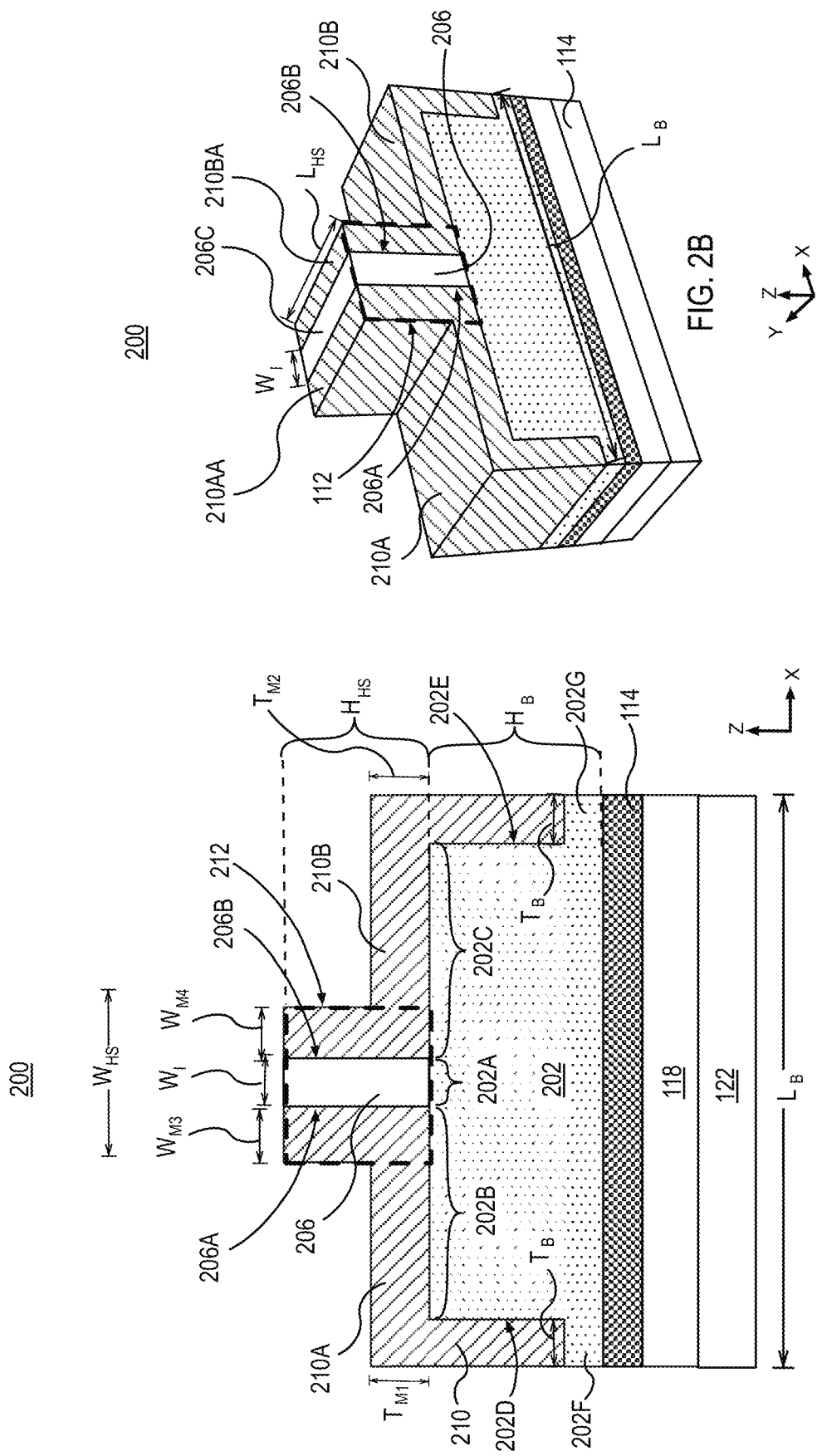

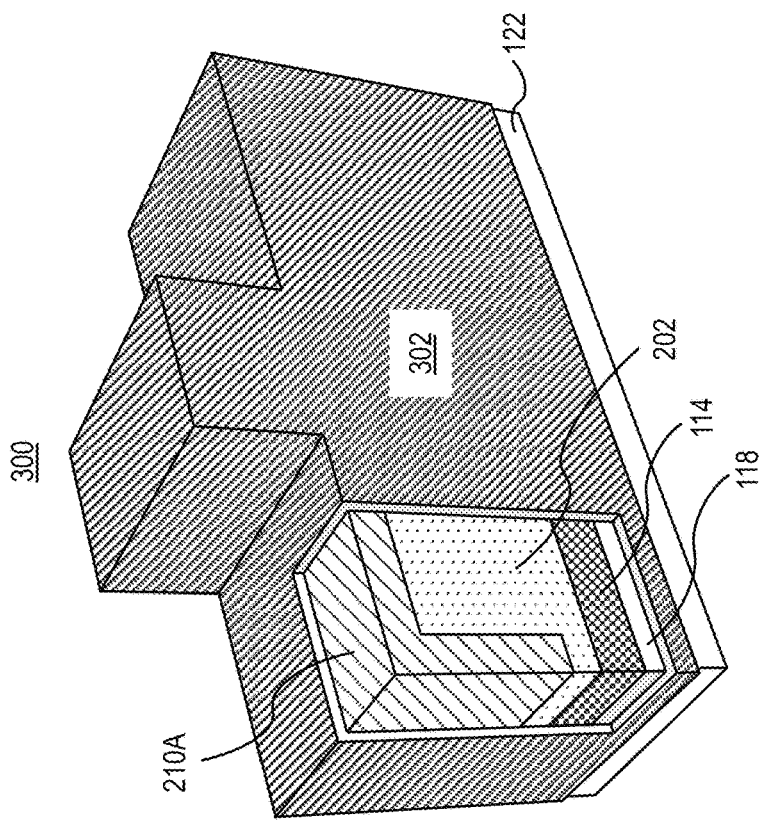
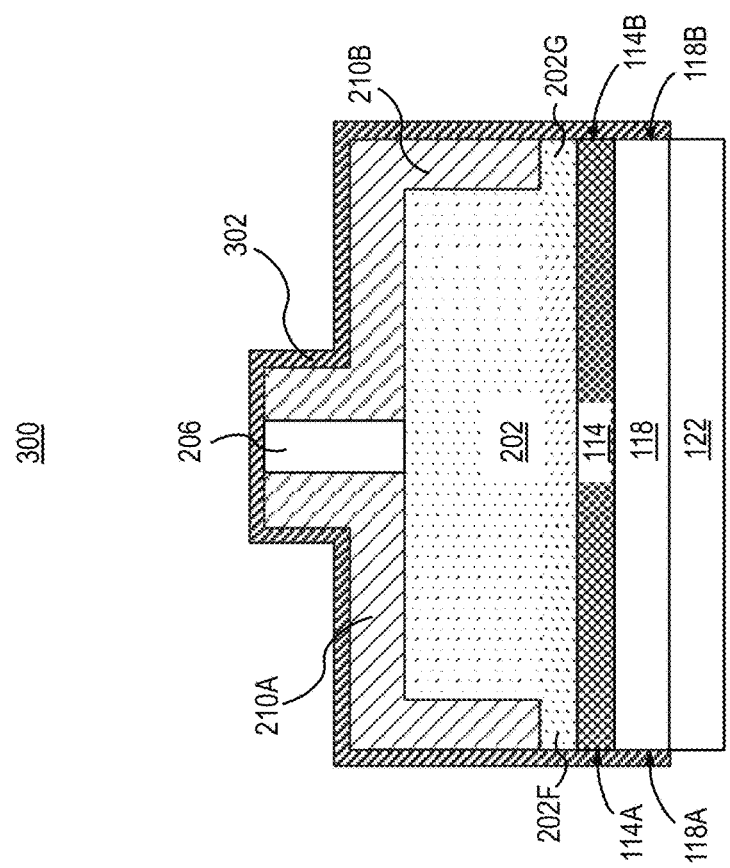
FIG. 3B
FIG. 3A

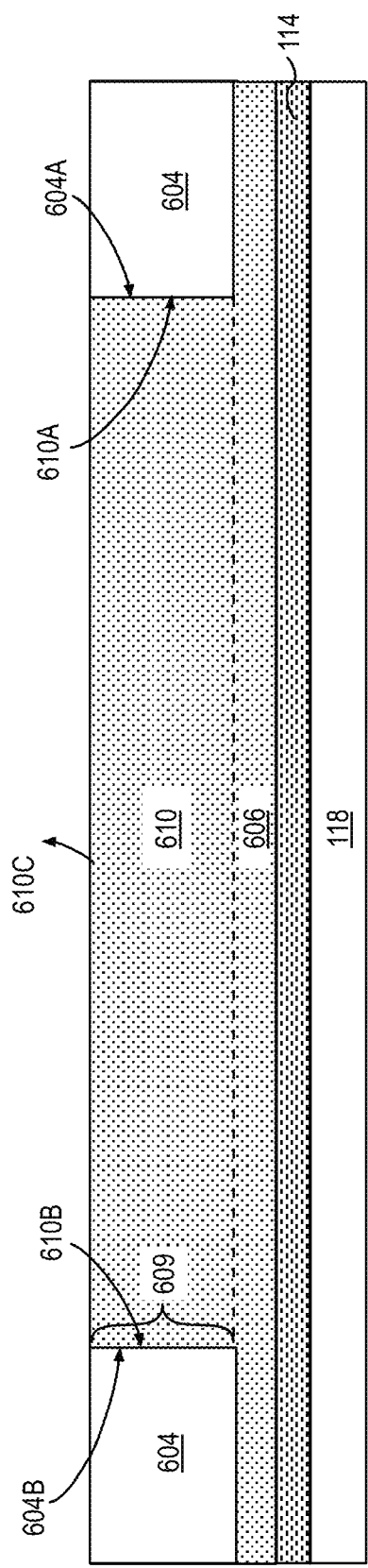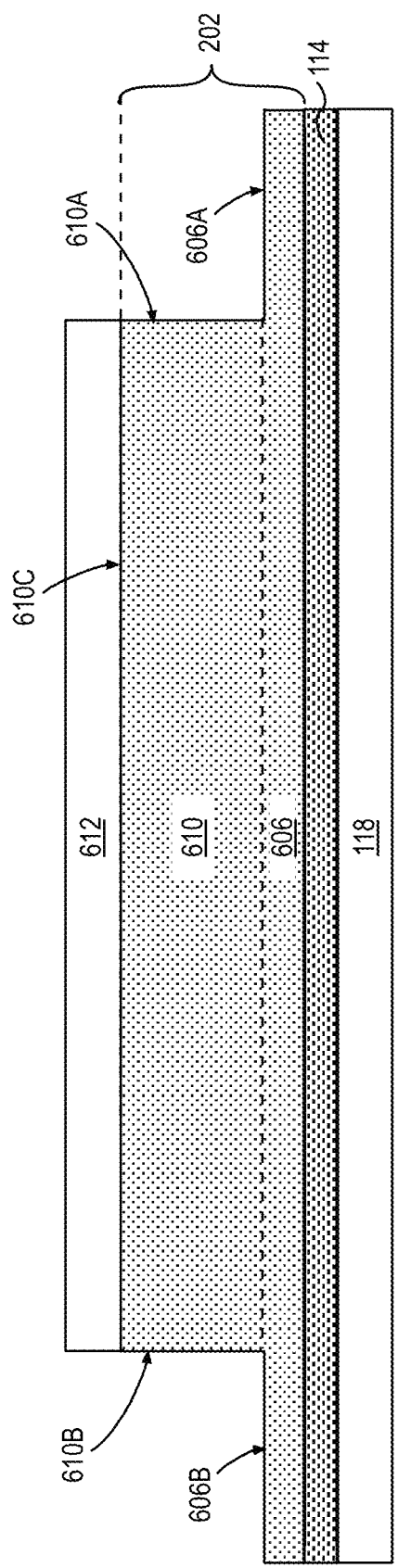

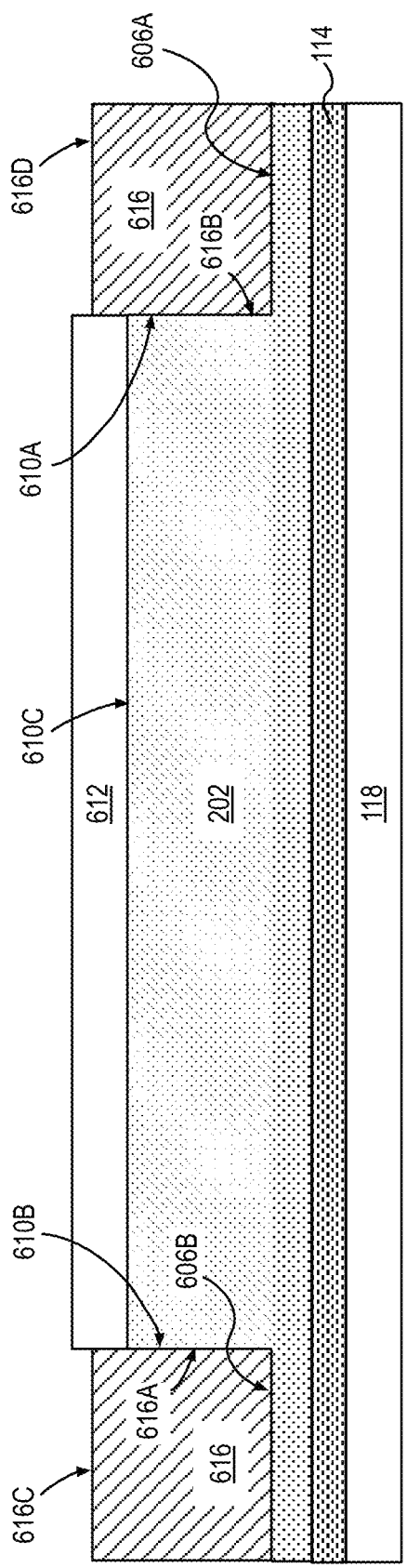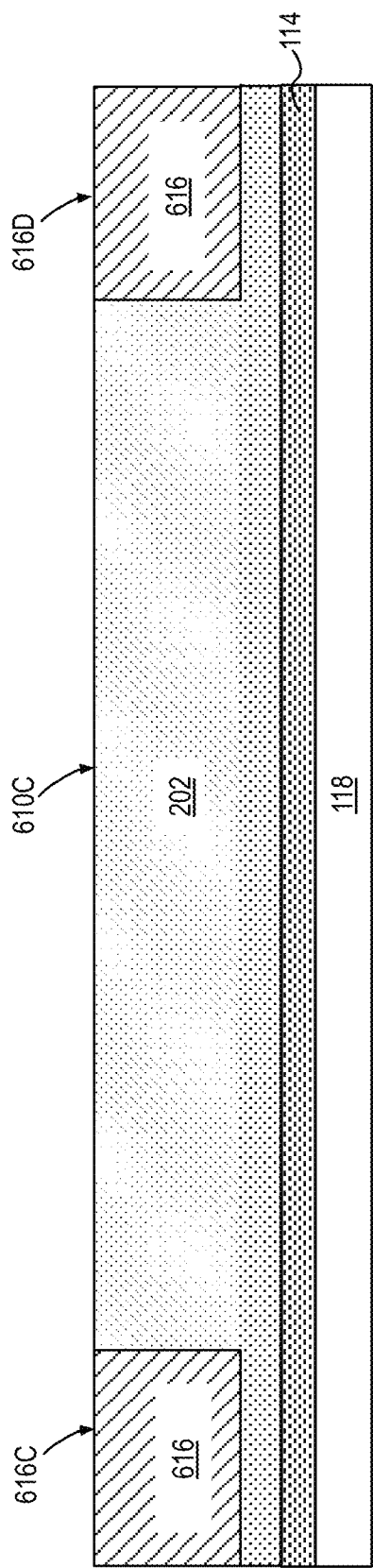

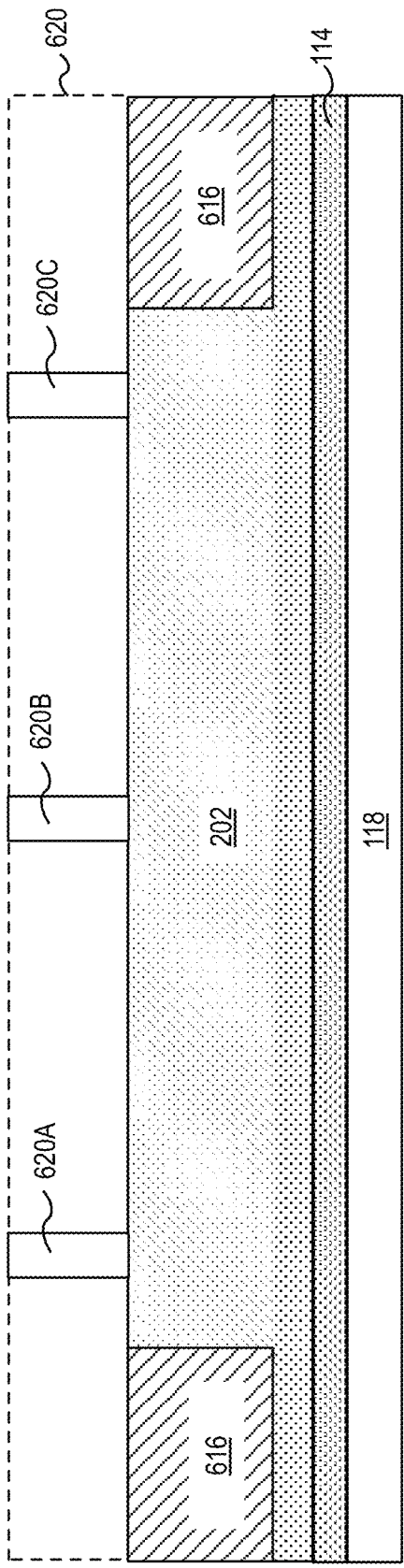
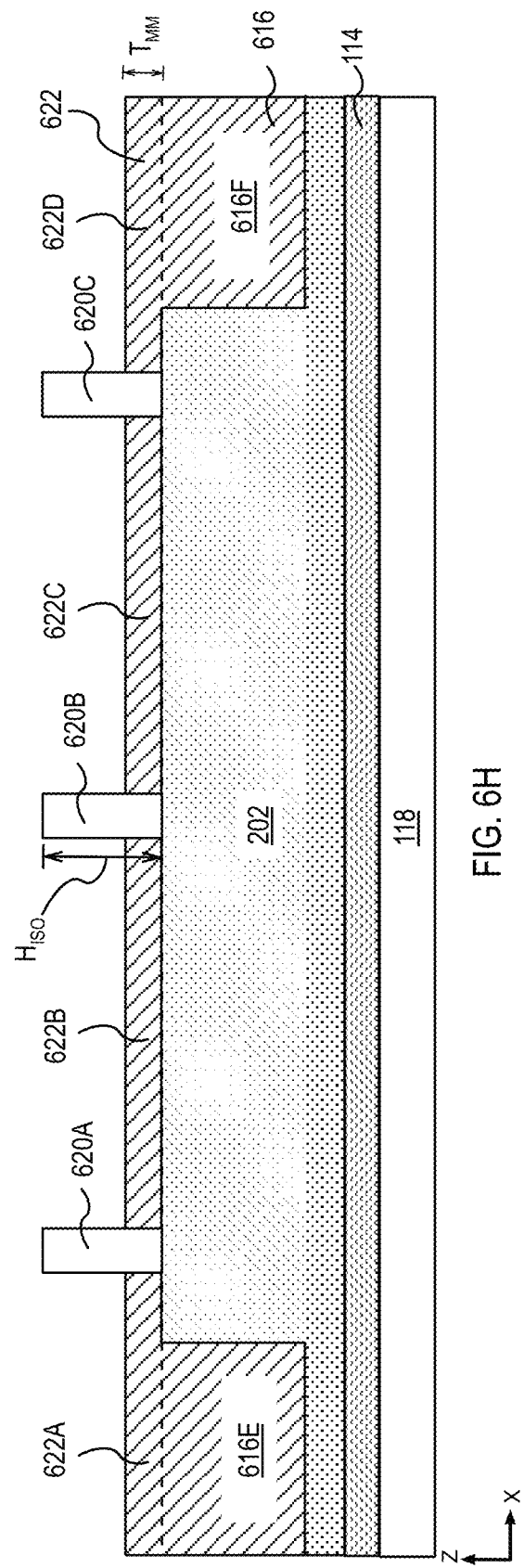
FIG. 6G
FIG. 6H

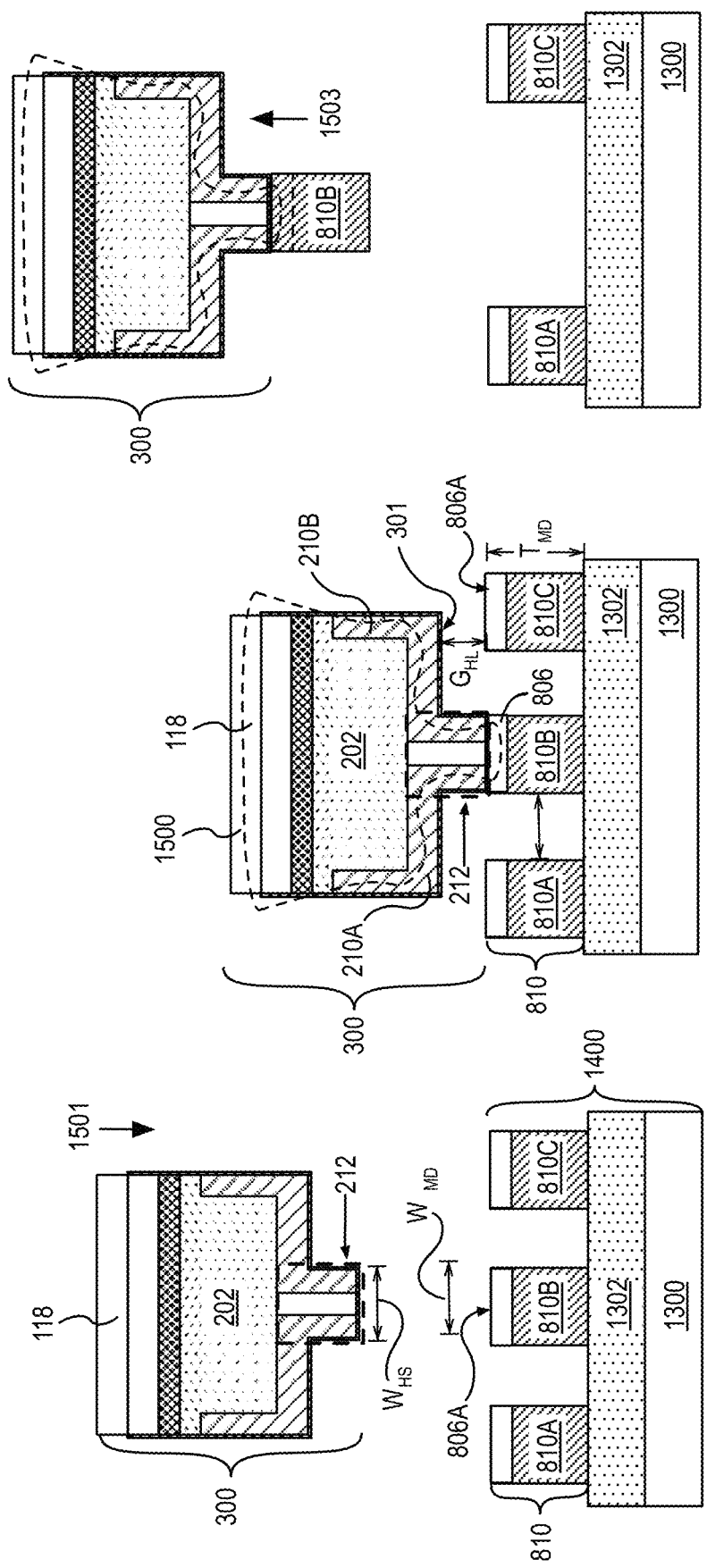

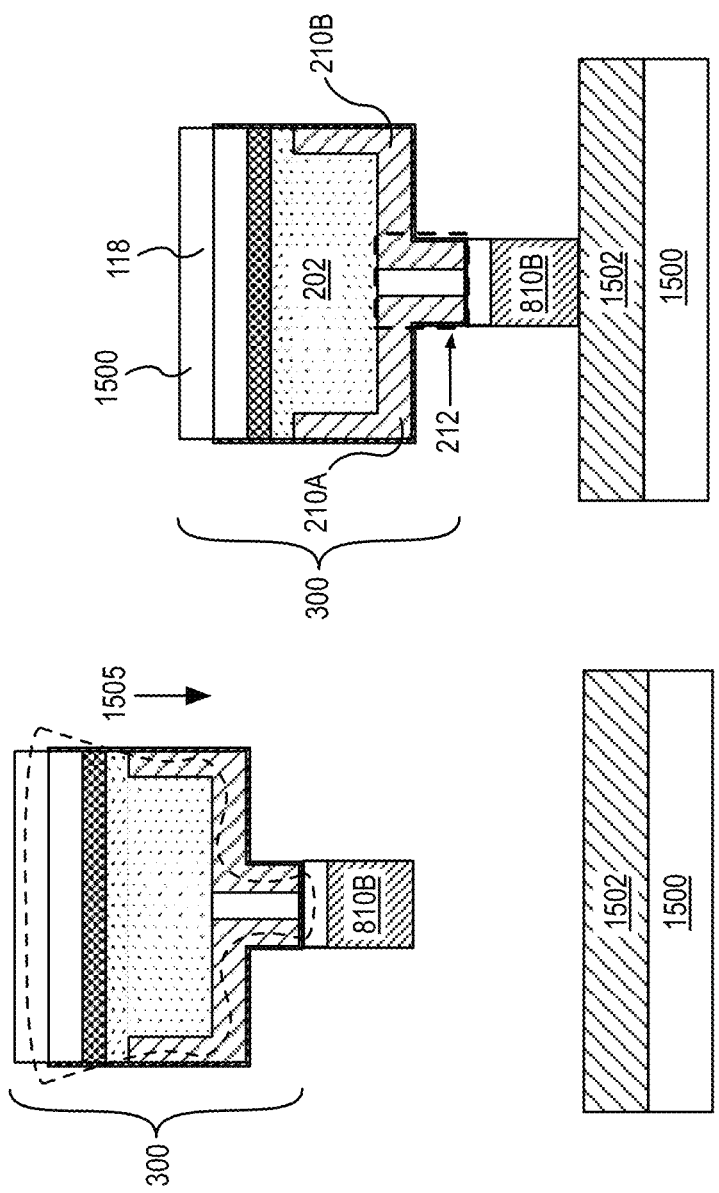
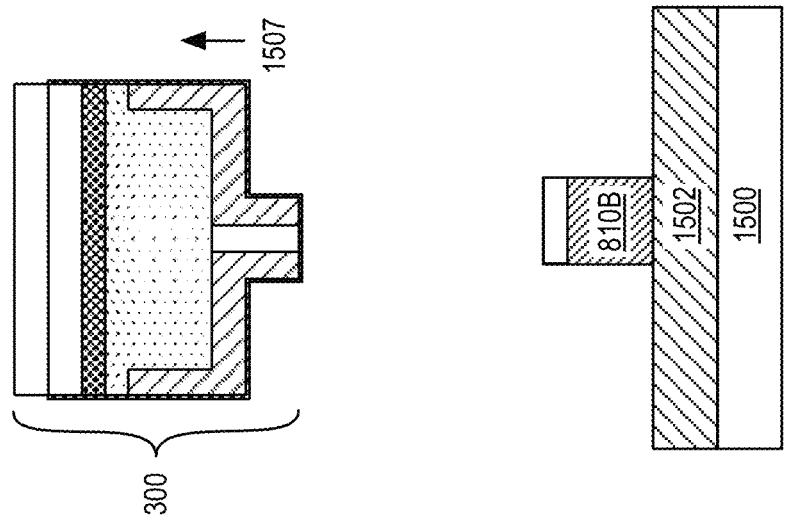

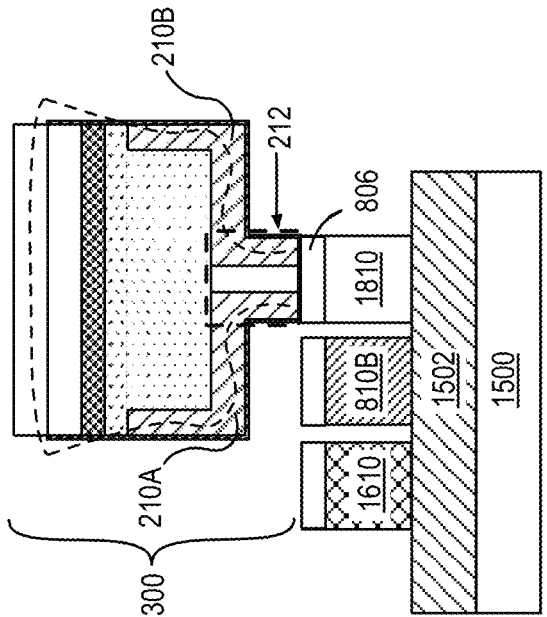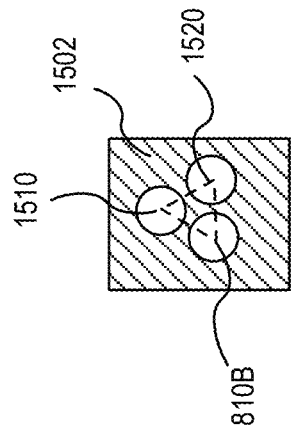
FIG. 20B
FIG. 21
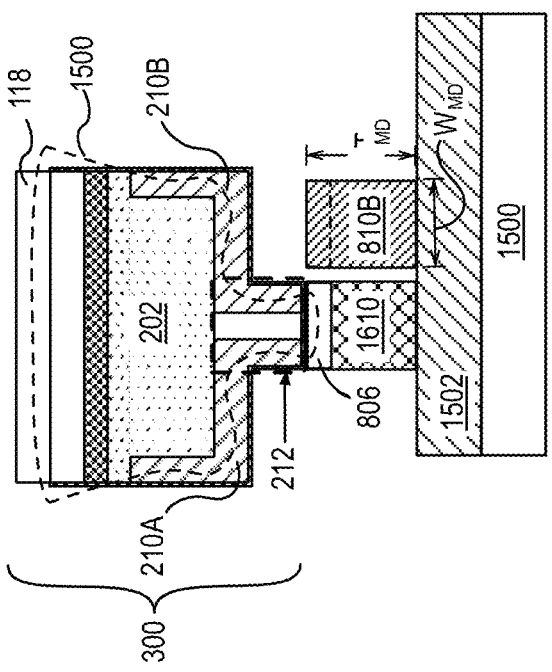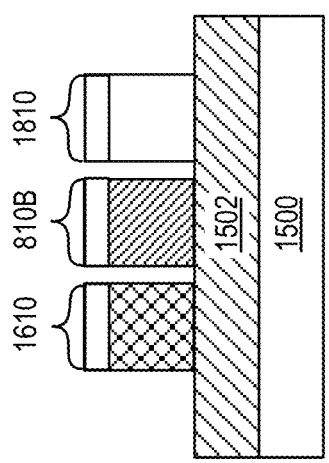
FIG. 20A
FIG. 20C

ELECTROMAGNETIC TOOL FOR TRANSFERRING MICRO DEVICES AND METHODS OF FABRICATION

BACKGROUND

Recently, enabling massive parallel transfer of microstructures has received intense focus, especially in the field of micro-LED (mLED) based display. Development of capabilities for parallel transfer of large volumes of mLED devices can enable high volume manufacturability of mLED device-based display.

However, it is a formidable technical challenge to selectively move large number of mLEDs between different substrates under typical manufacturing variabilities in mLED height and critical dimensions. It has thus become increasingly relevant to develop transfer technology that is both selective and tolerant to variation in mLED device height.

BRIEF DESCRIPTION OF THE DRAWINGS

The material described herein is illustrated by way of example, and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion. Thus, it is to be understood that practical implementations may only approximate the illustrated ideals. For example, smooth surfaces and square intersections may be drawn in disregard of finite roughness, corner-rounding, and imperfect angular intersections, characteristic of structures formed by nanofabrication techniques. Further, where considered appropriate, reference labels have been repeated among the figures to indicate corresponding or analogous elements.

FIG. 2A illustrates a cross-sectional view of an electromagnetic apparatus, in accordance with an embodiment of the present disclosure.

FIG. 2B illustrates an isometric view of the electromagnetic apparatus depicted in FIG. 2A, in accordance with an embodiment of the present disclosure.

FIG. 3A illustrates a cross-sectional view of an electromagnetic apparatus coated with a hermetic seal, in accordance with an embodiment of the present disclosure.

FIG. 3B illustrates an isometric view of the electromagnetic apparatus coated with the hermetic seal depicted in FIG. 3A, in accordance with an embodiment of the present disclosure.

FIG. 6C illustrates a cross-sectional view of the structure in FIG. 6B following the formation of a second layer of non-magnetic material on a portion of the first layer of non-magnetic material.

FIG. 6D illustrates the structure of FIG. 6C following the removal of the first mask followed by a formation of a second mask on the second layer of non-magnetic material.

FIG. 6E illustrates the structure of FIG. 6D following the formation of a first layer of magnetic material on portions of the first layer of non-magnetic material.

FIG. 6F illustrates the structure of FIG. 6E following removal of the second mask and planarization of the second layer of non-magnetic material and the first layer of magnetic material.

FIG. 6G illustrates the structure of FIG. 6H following the formation of a plurality of structures including a dielectric material on portions of the second layer of non-magnetic material.

FIG. 6H illustrates the structure of FIG. 6G following the formation of a second layer of magnetic material preferentially on the first layer of magnetic material and on the second layer of non-magnetic material.

FIG. 15A illustrates a cross sectional view of an electromagnetic apparatus directed towards an array of mLED device structures.

FIG. 15B illustrates a cross sectional view of the structure of FIG. 15A after a head structure of electromagnetic apparatus is in physical contact with an mLED device structure.

FIG. 15C illustrates a cross sectional view of the structure of FIG. 15B after the electromagnetic apparatus including the mLED device structure is raised.

FIG. 15D illustrates a cross sectional view of the electromagnetic apparatus and the mLED device structure attached directed towards an adhesion layer on an assembly substrate.

FIG. 15E illustrates a cross sectional view of the structure of FIG. 15D after mLED device structure is placed on the adhesion layer.

FIG. 15F illustrates a cross sectional view of the structure of FIG. 15E following placement of the mLED device structure on the adhesion layer and removal of the electromagnetic apparatus.

FIG. 20A illustrates a cross sectional view of the structure of FIG. 15F after the placement of a second mLED device structure adjacent to the mLED device structure.

FIG. 20B illustrates a cross sectional view of the structure of FIG. 20A after the placement of a third mLED device structure adjacent to the mLED device structure.

FIG. 20C illustrates a cross sectional view of the structure of FIG. 20B after the electromagnet is deactivated and raised.

FIG. 21 illustrates a plan-view depicting an arrangement of a first, a second and a third mLED device structure on an adhesion layer, in accordance with embodiments of the present disclosure.

DESCRIPTION OF THE EMBODIMENTS

Figure 1B:
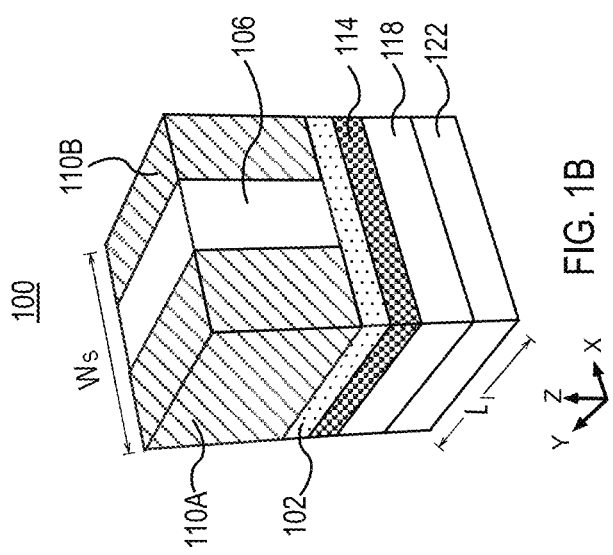
FIG. 1B illustrates an isometric view of the electromagnetic apparatus depicted in FIG. 1A, in accordance with an embodiment of the present disclosure.

Electromagnetic apparatus and methods of fabrication are described. The disclosure described herein presents a new solution to the specific challenge of selectively picking and transferring micro-devices by implementing an electromagnetic apparatus that is tolerant to variations in the micro-device height. In the following description, numerous specific details are set forth, such as novel structural schemes and detailed fabrication methods, in order to provide a thorough understanding of embodiments of the present disclosure. It will be apparent to one skilled in the art that embodiments of the present disclosure may be practiced without these specific details. In other instances, well-known features, such as transistor operations and switching operations associated with embedded memory, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Here, an in-plane magnet refers to a magnet that has magnetization in a direction substantially along the plane of the magnet. For example, a magnet with a magnetization which is in an x or y direction and is in a range of 0 (or 180 degrees)+/−20 degrees relative to an x-y plane of a device.

The term "free" or "unfixed" here with reference to a magnet refers to a magnet whose magnetization direction can change along its easy axis upon application of an external field or force (e.g., Oersted field, spin torque, etc.). Conversely, the term "fixed" or "pinned" here with reference to a magnet refers to a magnet whose magnetization direction is pinned or fixed along an axis and which may not change due to application of an external field (e.g., electrical field, Oersted field, spin torque).

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top." "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

In an embodiment, an electromagnetic apparatus that is capable of selectively removing large volumes of scaled micro-LED devices may enable higher adoption of mLED-based display technology. In particular, one aspect of micro-LED display technology involves transfer of mLED devices from the substrate, on which these where fabricated, onto a display matrix substrate that contains driving circuitry required to activate the mLEDs. Substrate bonding and transfer printing techniques are commonly used for some applications. However, selective micro transfer of mLED continues to be a challenge.

Since most materials of interest are challenging to "pick-up" in their as-grown form using currently available technology, one strategy to achieve "pickable" devices is to utilize engineered sacrificial layers underneath the device layers of interest. In spite of this, balancing the kinematics of the adhesion remains a practical problem that becomes even harder when normal variability in the manufacturing process of the micro-devices is considered.

In some embodiments, the micro-devices which are produced by a high-volume manufacturing process may have some intrinsic height variation, creating a challenge for tools that rely on, for example, electrostatic phenomenon to pick up the micro devices. Height variations may result in an air-gap between the tool performing the picking up and the micro-device. In some instances, a gap as small as 10 nm may introduce capacitance that can drastically increase the required applied voltage. In practice, existence of such air gap is expected due to allowed tolerances in the manufacturing process of the mLED devices that may result in height variation of up to several 100's of nanometers, corresponding to height variability in the order of +/−10%.

The embodiments of the present disclosure describe an electromagnetic apparatus that is tolerant to variations in the mLED device height and can selectively transfer mLED devices from a provider substrate to a host substrate while maintaining pattern fidelity. Depending on requirements, the electromagnetic apparatus may be customized making it suitable for small scale displays and for large area displays such as for TVs.

In accordance with an embodiment of the present disclosure, an electromagnetic apparatus includes a body structure having a non-magnetic material above a substrate. The body structure promotes the subsequent masking and selective growth of magnetic materials. The electromagnetic apparatus further includes at least one isolation structure including a dielectric material on a portion of the body structure. In one embodiment, the electromagnetic apparatus further includes a magnetic structure having two separate portions, one on each side of the isolation structure. A first magnetic structure portion extends from a first sidewall of the isolation structure onto an upper surface and on to a first sidewall of the body structure and a second magnetic structure portion extends from an opposite second sidewall of the isolation structure onto an upper surface and on to a second sidewall of the body structure (opposite to the first sidewall of the body structure). The magnetic structure does not extend over and is discontinuous over the isolation structure. Collectively, the isolation structure and a part of the first and the second magnetic structure portions that extend along the two opposing sidewalls of isolation structure is known as a head structure. The head structure is a non-moving component of the electromagnetic apparatus that comes in contact with mLED devices intended to be picked up and transferred from one substrate to another. The magnetic structure includes a material that has high permeability to collect and direct magnetic flux lines. The electromagnetic apparatus further includes an electromagnet on a side opposite to the isolation structure. The electromagnet is coupled with the magnetic structure and is a source of the magnetic flux lines when energized.

When the electromagnetic apparatus is brought in the vicinity of an mLED device and the electromagnet is energized, flux lines are directed into a path that goes from one magnetic structure portion on one side of the isolation structure through the mLED device into the second magnetic structure portion on an opposite side of the isolation structure. The presence of the discontinuity of magnetic material in the head structure increases reluctance for the magnetic flux lines, forcing them to pass through a magnetic material in the mLED device itself, which results in an electromagnetic force that picks up the micro-device from the designated substrate.

Depending on embodiments, the number of isolation structures may be varied from a single structure to several hundred thousand in an array, depending on the size of the mLED to be transferred. In the array, the isolation structures may be separated by a distance that depends on the size and density of the mLED devices in the provider or native substrate and on the density and pitch of the mLED devices in the host substrate.

Figure 1C:
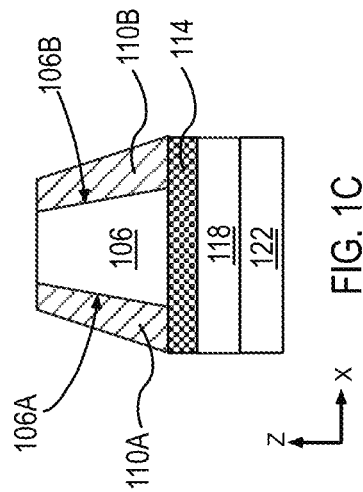
FIG. 1C illustrates a cross section of an electromagnetic apparatus, where sidewalls of the isolation structure are tapered, in accordance with an embodiment of the present disclosure.
Figure 1A:
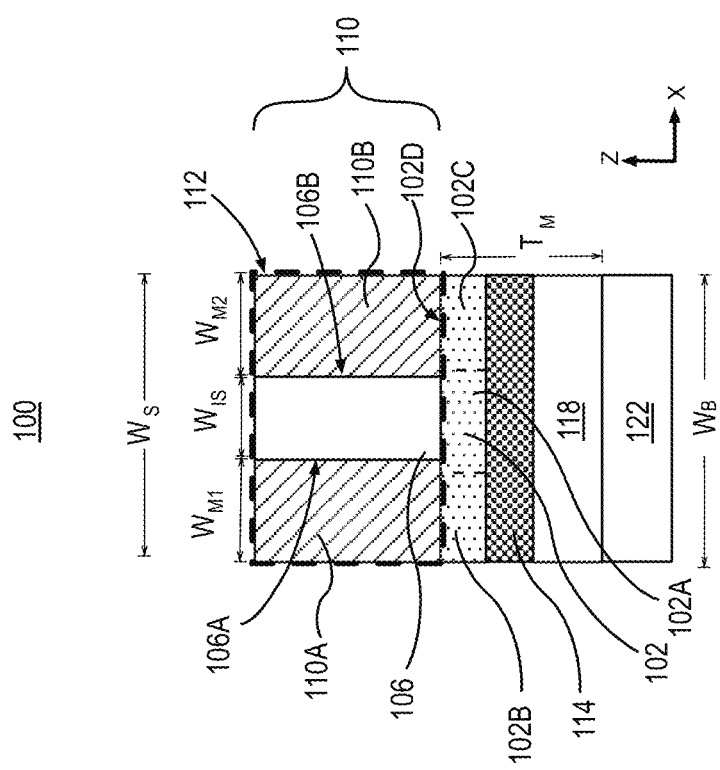
FIG. 1A illustrates a cross-sectional view of an electromagnetic apparatus, in accordance with an embodiment of the present disclosure.

FIG. 1A illustrates a cross-sectional view of an electromagnetic apparatus 100, in accordance with an embodiment of the present disclosure. The electromagnetic apparatus 100 includes a base structure 102 including a non-magnetic material above a substrate 118 and an isolation structure 106 including a dielectric, on a portion 102A of the base structure 102. The electromagnetic apparatus 100 further includes a structure 110 including a first sidewall portion 110A adjacent to a first sidewall 106A of the isolation structure 106 and above a portion 102B of the base structure 102. Sidewall portion 110A of the structure 110 includes a magnetic material. Structure 110 further includes sidewall portion 110B adjacent to sidewall 106B, opposite to sidewall 106A, of isolation structure 106. As illustrated, sidewall portion 110B is above portion 102C of base structure 102. Sidewall portions 110A and 110B of structure 110 and isolation structure 106, as illustrated, are collectively referred to as head structure 112 (inside dashed lines). Electromagnetic apparatus 100 further includes electromagnet 122 below and coupled magnetically with magnetic material of structure 110.

In an embodiment, structure 110 includes a magnetic material having one or more of: mu-alloy, perma-alloy, an alloy of iron and nickel, an alloy of nickel, and cobalt, or an alloy of nickel, cobalt and iron. Structure 110 is designed to confine magnetic flux from electromagnet 122 when electromagnetic apparatus 100 is operational. As such, the magnetic material of structure 110 is preferably of high magnetic permeability. In an embodiment, the magnetic material has a permeability greater than 50.

In an embodiment, sidewall portion 110A has a width $W_{M1}$, defined by a distance along an X axis as illustrated in FIG. 1A. Sidewall portion 110B has a width $W_{M2}$ along the X axis and isolation structure 106 has a width $W_{IS}$ along the X axis. In an embodiment, the width of isolation structure 106, $W_{IS}$ is determined from the magnetic reluctance required for delivering the maximum electromagnetic force to the mLED. According to one embodiment, $W_{IS}$ is comparable to $W_{M1}$ or $W_{M2}$, such as is shown in the cross-sectional illustration of FIG. 1A. The overall size of head $W_S$ is usually comparable to the size of mLED to be picked. In some embodiments, isolation structure 106 has a width $W_{IS}$ that is between 5 nm and 20 micro-meters (microns). A width $W_{IS}$ between 5 nm and 2 microns is less than a width of mLED devices that head structure 112 is designed to pick. In some embodiments, each of the widths $W_{M1}$, $W_{M2}$ are between 10 nm and 5 microns. In some embodiments, width $W_{IS}$ is between 20% to 30% of the combined total width of $W_{M1}$, $W_{M2}$ and $W_{IS}$. Depending on embodiments, the combined total width of $W_{M1}$, $W_{M2}$ and $W_S$ is between 15 nm-60 microns. In an embodiment, isolation structure 106 includes a dielectric material having silicon and oxygen (e.g., $SiO_2$), silicon and carbon (e.g., SiC) or silicon and nitrogen (e.g., $Si_3N_4$). In other embodiments, isolation structure 106 includes carbon doped silicon oxide or even an airgap.

As head structure 112 is designed to mechanically contact an LED structure, it is advantageous for the top surface of the head structure to be substantially planar. As illustrated, top surfaces of sidewall portion 110A, sidewall portion 110B and isolation structure 106 are co-planar or substantially co-planar.

As illustrated, sidewalls 106A and 106B are vertical relative to planar surface 102D of the base structure 102. However, in other embodiments, the sidewalls 106A and 106B each have a slope that is less than 90 degrees relative to planar surface 102D, such as is illustrated in FIG. 1C. In one such embodiment, sidewall portions 110A and 110B are substantially conformal with sloped sidewalls 106A and 106B.

Referring again to FIG. 1A, base structure 102 includes non-magnetic metal, such as but not limited to, copper, and tungsten or an alloy of these metals. Depending on the embodiment, base structure 102 has a thickness between 100 nm and 10000 nm. In an embodiment, base structure 102 has a width, WB that is substantially equal to the combined widths $W_{M1}$, $W_{M2}$ and $W_{IS}$, as illustrated.

In an embodiment, substrate 118 includes a suitable material such as but not limited to, quartz, single crystal silicon, polycrystalline silicon and silicon on insulator (SOI). In another embodiment, substrate 118 includes other rigid or flex materials suitable for subsequent metal and dielectric deposition processes. In an illustrative embodiment, substrate 118 includes a layer of dielectric material above a semiconductor material, such as but not limited to, single crystal silicon, polycrystalline silicon, silicon germanium or a suitable group III-N or a group III-V compound.

In an embodiment, adhesion layer 114 is between substrate 118 and base structure 102. In an embodiment, adhesion layer 114 includes a combination of nitrogen and one or more metals such as titanium, tungsten or tantalum (e.g., TiN, TaN). Adhesion layer 114 may have a thickness between 10 nm and 100 nm.

In an embodiment, electromagnet 122 generates magnetic flux of desired intensity to deliver needed force to selectively pick one or more designated mLEDs.

FIG. 1B illustrates an isometric view of electromagnetic apparatus 100. In an illustrative embodiment, electromagnetic apparatus 100 has a block structure. Electromagnetic apparatus 100 has length, $L_1$, along the Y-axis that is determined by the corresponding dimension on the mLED device to be picked up.

FIG. 2A illustrates a cross-sectional view of electromagnetic apparatus 200, in accordance with an embodiment of the present disclosure. The electromagnetic apparatus further includes isolation structure 206 on body structure portion 202A. Electromagnetic apparatus 200 further includes magnetic structure 210. Magnetic structure 210 includes first magnetic structure 210A adjacent to sidewall 206A of isolation structure 206. Magnetic structure 210A extends continuously onto body structure portion 202B and adjacent to sidewall 202D of body structure 202. Magnetic structure 210A is also above body structure portion 202F that extends beyond sidewall 202D, as illustrated in FIG. 2A. Magnetic structure 210 includes second magnetic structure 210B adjacent to sidewall 206B opposite to sidewall 206A. Magnetic structure 210B extends continuously onto body structure portion 202C and adjacent to sidewall 202E of body structure 202. Magnetic structure 210A is also above body structure portion 202G, that extends beyond sidewall 202E, as illustrated in FIG. 2A. As illustrated, isolation structure 206 and portions of magnetic structure 210A and 210B adjacent to isolation structure 206 are collectively referred to as head structure 212 (inside dashed lines). Electromagnetic apparatus 200 further includes electromagnet 122 coupled with magnetic structure 210.

Magnetic structure 210A adjacent to sidewall 202D has a thickness, $T_B$. In an embodiment, thickness, $T_B$ is substantially similar to thickness $T_{M1}$, of magnetic structure 210A on body structure portion 202B. In an embodiment, thickness, $T_{M1}$ is same or substantially same as width, $W_{M3}$, of magnetic structure 210A adjacent to sidewall 206A.

Magnetic structure 210B, adjacent to sidewall 202E has thickness, $T_B$. In an embodiment, thickness, $T_B$, is substantially similar to thickness, $T_{M2}$ of magnetic structure 210B on body structure portion 202C. In an embodiment, $T_{M1}$ is same or substantially same as width, $W_{M4}$, of magnetic structure 210B adjacent to sidewall 206B.

In an embodiment, the width $W_{M3}$ and $W_{M4}$ are equal or substantially equal to balance a magnetic flux generated through magnetic structure 210 when electromagnet 122 is operational. Similarly, $T_{M1}$ and $T_{M2}$ are equal or substantially equal to balance magnetic flux through magnetic structure 210. A balanced magnetic flux through magnetic structures 210A and 210B can provide mechanical stability when electromagnetic apparatus 200 is utilized to pick up mLED devices during operation.

In an embodiment, head structure 212 has height, $H_{HS}$, and body structure 202 has height, $H_B$. As illustrated head structure 212 has height, $H_{HS}$ that is less than height $H_B$, of body structure 202. The height, ($H_{HS}$–$T_{M2}$) may be equal to approximately half a thickness of an mLED device to be picked by head structure 112.

In an illustrative embodiment, head structure 212 has width $W_{HS}$, that is less than length $L_B$ of body structure 202. Width $W_{HS}$ may be designed to be similar or substantially similar to width of an mLED device to be picked during operation.

In other embodiments body structure 202 may have length $L_B$, to accommodate a plurality of head structures each resembling head structure 212 and having one or more features such as width $W_{HS}$, height $H_{HS}$ and length $L_{HS}$ of head structure 212, as will be described in FIG. 4A below.

In one embodiment, thickness of magnetic portion $T_B$ is preferably much larger than thickness $H_{HS}$ allowing for confining larger portion of the magnetic flux lines parallel to direction $L_B$. In an embodiment, magnetic structure 210B includes a material that is same or substantially same as a material of magnetic structure 210A. In such an embodiment, magnetic structure 210A and 210B each include a material that is same or substantially same as magnetic material of sidewall portion 110A.

FIG. 2B illustrates an isometric view of the electromagnetic apparatus 200. In the illustrative embodiment, the head structure 112 has a length, $L_{HS}$, along a Y-axis. As illustrated, top surface 210AA of the magnetic structure 210A, adjacent to the sidewall 206A, top surface 210BA of the magnetic structure 210B, adjacent to the sidewall 206B, and a top surface 206C of the isolation structure 206 are coplanar or substantially co-planar.

Also, as shown in FIG. 2B, magnetic structures 210A and 210B are not physically connected anywhere in electromagnetic apparatus 200. In an embodiment, magnetic structures 210A and 210B are separated by an amount equivalent to width $W_1$ of isolation structure 206 along length, $L_{HS}$ of head structure 212. The presence of isolation structure 206 introduces a discontinuity in magnetic material between magnetic structure 210A and 210B and creates a large magnetic reluctance when electromagnet 122 is energized. The magnetic reluctance is designed to be sufficiently large to force magnetic flux generated by operational electromagnet 122 to pass from one magnetic structure (e.g., 210A) to another magnetic structure (e.g., 210B) through mLED when a top surface of head structure 112 is positioned adjacent to an mLED device.

FIG. 3A illustrates a cross-sectional view of electromagnetic apparatus 300 in accordance with an embodiment of the present disclosure. In an embodiment, electromagnetic apparatus 300 includes encapsulation 302 on the structure of electromagnetic apparatus 300 described in association with FIGS. 2A and 2B.

In the illustrative embodiment, encapsulation 302 is on a top surface of isolation structure 206, on exposed surfaces of magnetic structure 210A and 210B, on sidewalls of body structure portions 202F and 202G, on sidewalls 114A and 114B of adhesion layer 114 and on sidewalls 118A and 118B of substrate 118. In an embodiment, encapsulation 302 includes a hermetic dielectric material such as silicon nitride, or silicon carbide. Encapsulation 302 protects the various layers and structures of electromagnetic apparatus 200 from an external environment during operation and has a thickness between 5 nm and 20 nm. In some embodiments (not illustrated), encapsulation 302 is also between substrate 118 and the electromagnet 122.

FIG. 3B illustrates an isometric view of electromagnetic apparatus 300 depicted in FIG. 3A. In the illustrative embodiment, encapsulation layer 302 is adjacent to all exposed faces of electromagnetic apparatus 200 but excludes electromagnet 122. In the illustrative embodiment, a cut out in encapsulation layer 302 illustrates a portion of electromagnetic apparatus 200.

Figure 4A:
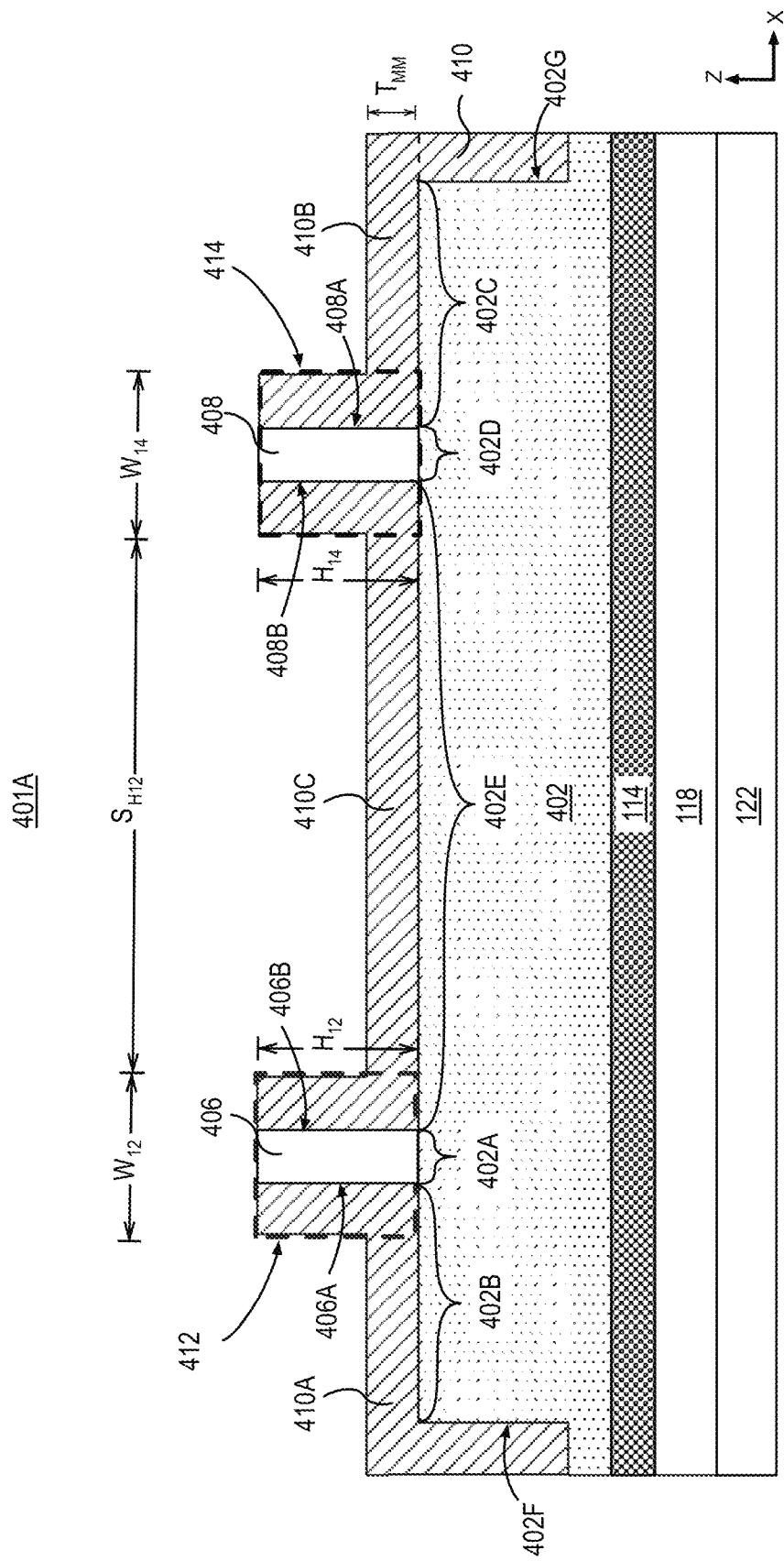
FIG. 4A illustrates a cross-sectional view of an electromagnetic apparatus including an array of pick up heads, in accordance with an embodiment of the present disclosure.

FIG. 4A illustrates a cross sectional view of electromagnetic apparatus 401A with an array of extruded heads, in accordance with embodiments of the present disclosure. Electromagnetic apparatus 401A includes body structure 402 having a non-magnetic material, isolation structure 406 including a dielectric material on body structure portion 402A. Isolation structure 408 including the dielectric material is on body structure portion 402D as illustrated. Electromagnetic array 401A further includes magnetic structure 410 that has one or more features of magnetic structure 210. For example, magnetic structure 410 includes magnetic structure portion 410A adjacent to isolation structure sidewall 406A, magnetic structure portion 410A extends continuously onto body structure portion 402B, and adjacent to body structure sidewall 402F. Magnetic structure 410 includes magnetic structure portion 410B adjacent to isolation structure sidewall 408A, where magnetic structure portion 410B extends continuously onto body structure portion 402C and adjacent to body structure sidewall 402G. Electromagnetic array 401A further includes magnetic structure portion 410C adjacent to isolation structure sidewall 406B and adjacent to isolation structure sidewall 408B. Magnetic structure portion 410C extends onto body structure portion 402E, continuously between isolation structure sidewalls 406B and 408B. In an embodiment, magnetic structure portions 410A, 410B and 410C include same material as the material of magnetic structure 210A and 210B.

As illustrated, isolation structure 406, and magnetic structure portions 410A and 410C adjacent to isolation structure sidewalls 406A and 406B are collectively referred to as head structure 412 (inside dashed lines). Head structure 412 has one or more features of head structure 212 such as having width $W_{12}$, and height $H_{12}$ that is same or substantially same as width $W_{HS}$, and height, $H_{HS}$, of head structure 212. In some embodiments head structure 412 is separated from head structure 414 in electromagnetic apparatus 401A by width $S_{H12}$.

As illustrated, isolation structure 408, and magnetic structure portions 410C and 410B adjacent to isolation structure sidewalls 408B and 408A are collectively referred to as head structure 414 (inside dashed lines). Head structure 414 has one or more features of head structure 212 such as having width $W_{14}$, and height $H_{14}$, that is same or substantially same as width $W_{HS}$, and height $H_{HS}$, of head structure 212.

The relative size of widths and heights of head structures 412 and 414 may depend on the size of the micro device to be picked up. In an embodiment, head structures 412 and 414 have width $W_{12}$ and $W_{14}$, respectively and height $H_{12}$ and $H_{14}$, respectively, that are all same or substantially same.

Figure 7:
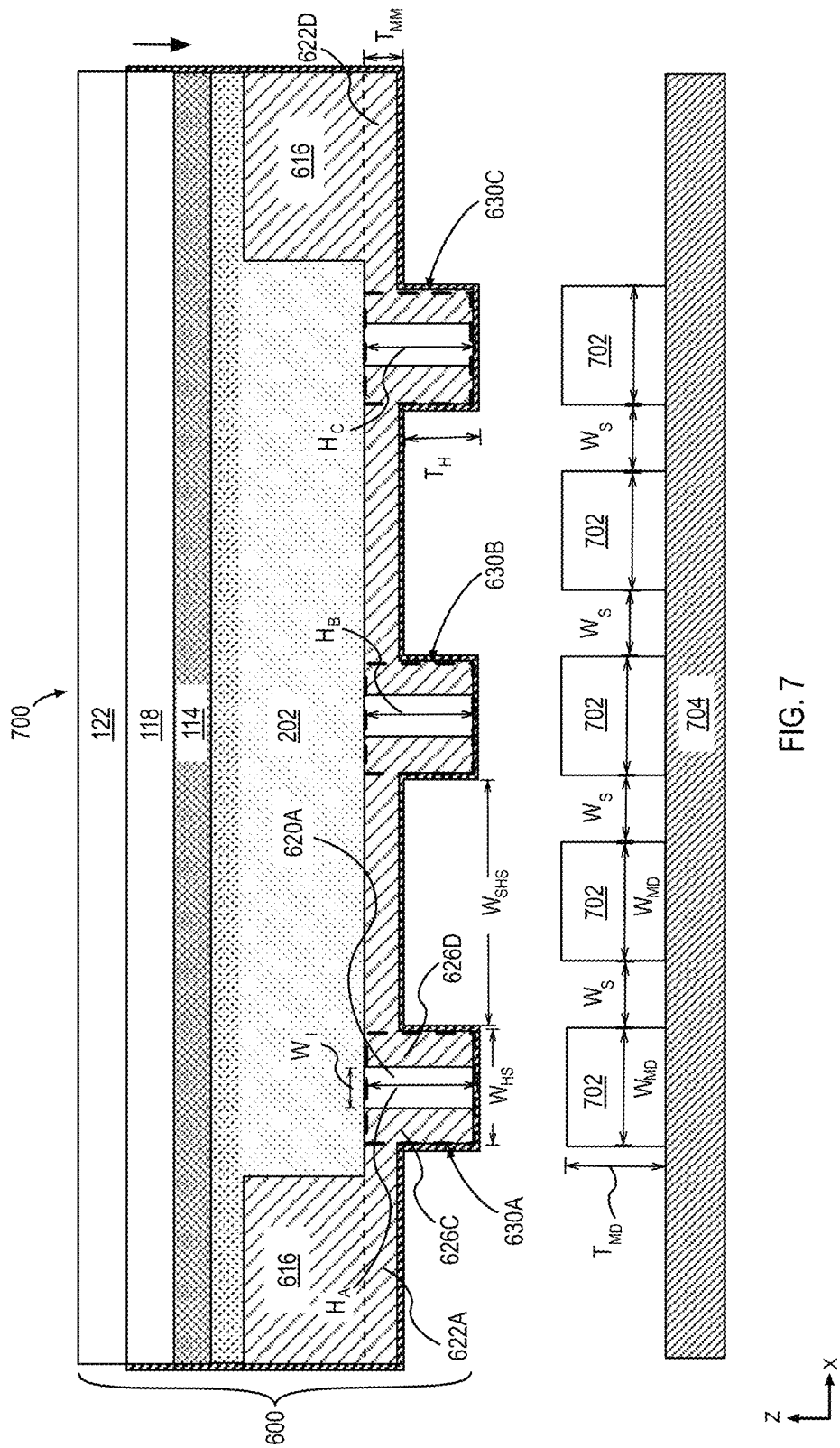
FIG. 7 illustrates an electromagnetic array apparatus above a plurality of micro devices above a substrate.

Head structures 412 and 414 each have height $H_{12}$ and $H_{14}$, respectively, that is greater than sum of thicknesses, $T_{MM}$, of magnetic material 410 and approximately half a thickness of mLED devices (not shown) that head structures 412, and 414 are designed to pick from a substrate (to be discussed in FIG. 7).

In an embodiment, body structure 402 includes a material that is same or substantially same as material of body structure 202. In an embodiment, isolation structures 406 and 408 each include a material that is same or substantially same as the material of isolation structure 206.

Figure 4B:
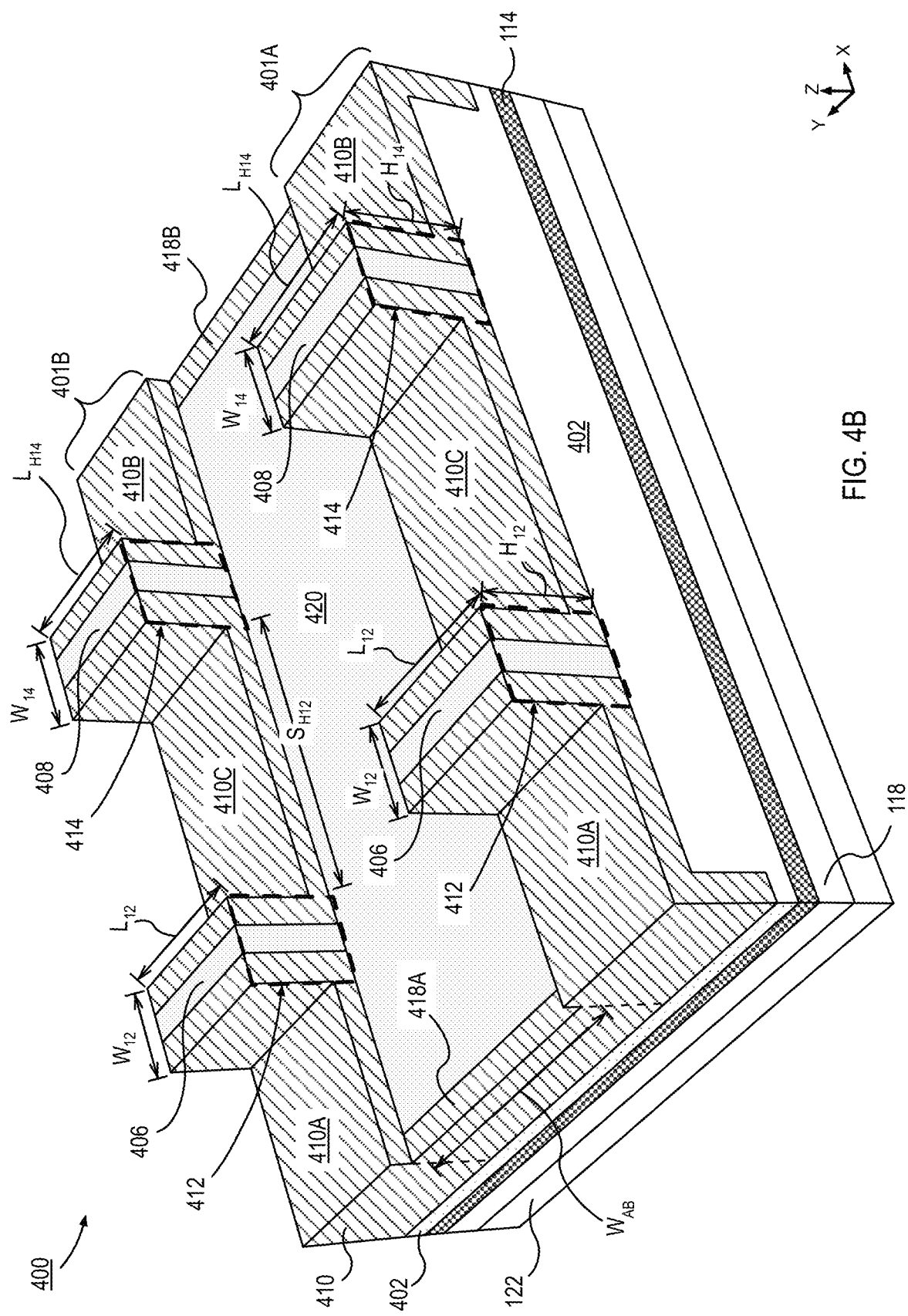
FIG. 4B illustrates an isometric view of an electromagnetic apparatus including a plurality of arrays of pick up heads, in accordance with an embodiment of the present disclosure.

FIG. 4B illustrates an isometric view of electromagnetic apparatus 400, in accordance with embodiments of the present disclosure. In an illustrative embodiment, electromagnetic apparatus 400 includes a first electromagnetic array 401A (described in FIG. 4A) and second electromagnetic array 401B, where first electromagnetic array 401A and second electromagnetic array 401B are magnetically coupled when electromagnetic apparatus 400 is energized.

In an illustrative embodiment, electromagnetic array 401B includes one or more structural embodiments of the electromagnetic array 401A such as a plurality of head structures such as head structures 412 and 414 (inside dashed lines), the body structure 402, magnetic structure portions 410A, 410B and 410C. In an illustrative embodiment, head structure 412 in electromagnetic array 401B has width $W_{12}$, length $L_{12}$, and height $H_{12}$ that is same or substantially same as width $W_{12}$, length $L_{12}$, and height, $H_{12}$ of head structure 412 in electromagnetic array 401A. In an illustrative embodiment, head structure 414 in electromagnetic array 401B has width $W_{14}$, length $L_{14}$, and height $H_{14}$ that is same or substantially same as width $W_{14}$, length $L_{14}$, and height, $H_{14}$ of head structure 414 in electromagnetic array 401A.

In an illustrative embodiment, electromagnetic arrays 401A and 401B share body structure 402 but magnetic structure 410 of electromagnetic array 401B is separated from magnetic structure 410 of electromagnetic array 401A by dielectric layer 420. Dielectric layer has width $W_{AB}$ (along the Y-direction as shown). The width $W_{AB}$ may depend on the spatial arrangement of the mLEDs on a provider substrate and on a desired spatial arrangement of a receiving substrate.

In some embodiments, head structure 412 in electromagnetic array 401A is aligned with head structure 414 in electromagnetic array 401B. For example, in an illustrative embodiment, head structure 412 in electromagnetic array 401A is aligned with head structure 414 in electromagnetic array 401B along the X-axis, but separated along an orthogonal direction, such as along a Y-axis. Head structure 412 in electromagnetic array 401A is on same plane as head structure 414 in electromagnetic array 401B. In some such embodiments, head structure 412 is also separated from head structure 414 in electromagnetic array 401B by width $S_{H12}$.

In an illustrative embodiment, magnetic structure 418A adjacent to dielectric layer 420 couples magnetic structure portion 410A of the electromagnetic array 401B with the magnetic structure portion 410A of electromagnetic array 401A. Second magnetic structure 418B couples magnetic structure portion 410B of electromagnetic array 401B with magnetic structure portion 410B of electromagnetic array 401A. Electromagnet 122 couples each of magnetic structures 410 in electromagnetic arrays 401A and 401B. In an illustrative embodiment, head structures 412, and 414 are simultaneously capable of magnetically coupling mLED devices when electromagnet 122 is energized.

In an embodiment, adhesion layer 114 and substrate 118 is shared between arrays 401A and 401B as illustrated in FIG. 4B.

Figure 4C:
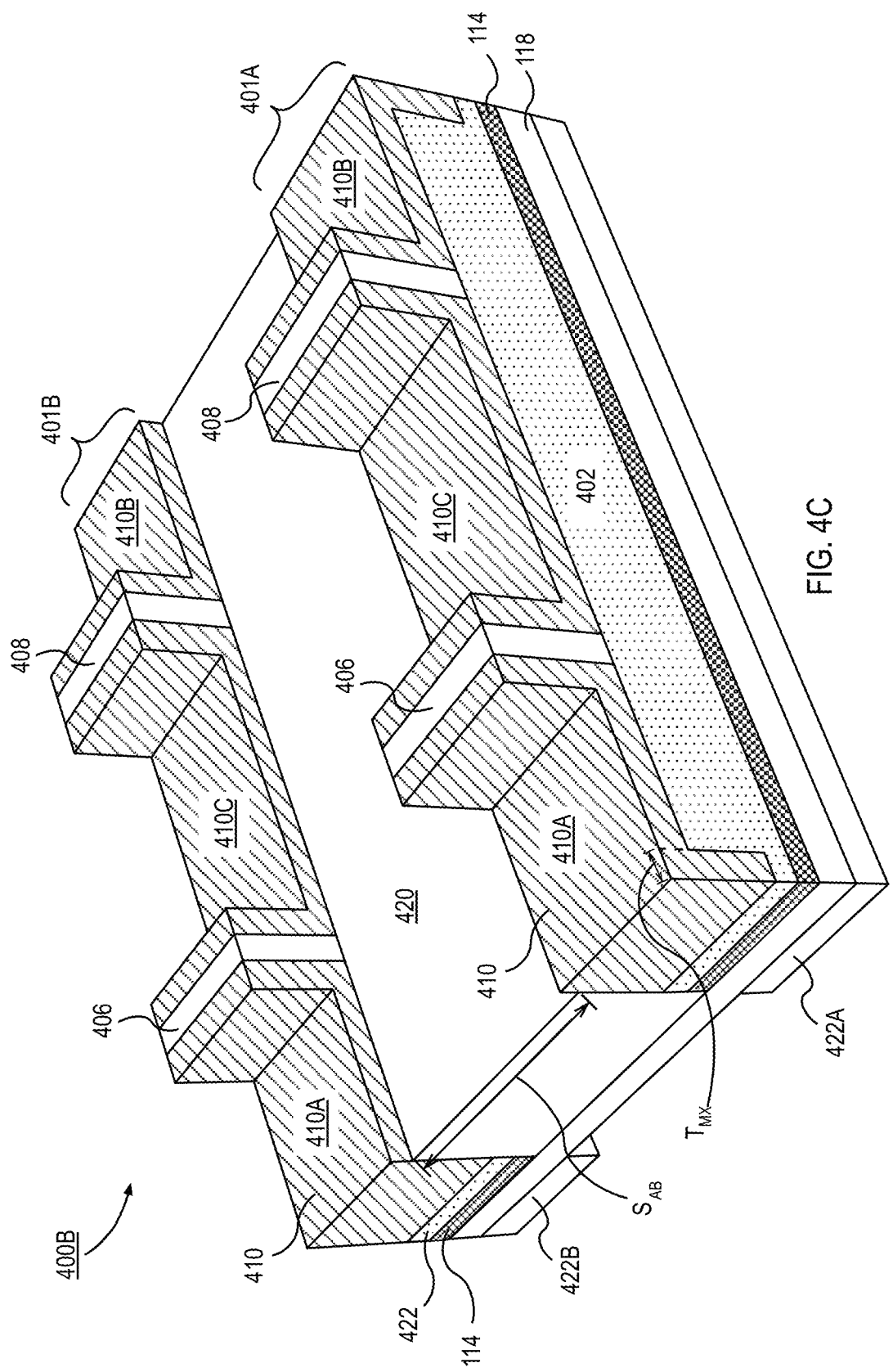
FIG. 4C illustrates an isometric view of an electromagnetic apparatus including a plurality of independent arrays of pick up heads, in accordance with an embodiment of the present disclosure.

FIG. 4C illustrates an isometric view of electromagnetic apparatus 400B including a plurality of operable electromagnetic arrays 401A and 401B, in accordance with an embodiment of the present disclosure. In an illustrative embodiment, electromagnetic array 401A includes electromagnet 422A and the array 401B includes an electromagnet 422B. Electromagnet 422A may be operated in tandem or independently of electromagnet 422B.

In an illustrative embodiment, electromagnetic arrays 401A and 401B are separated from each other by distance SAB. Distance SAB may be governed by spatial distribution of mLEDs targeted for pick and/or placement and strength of electric current used to energize the electromagnet.

As shown, adhesion layer 114 is uncoupled between first electromagnetic array 401A and second electromagnetic array 401B. In an illustrative embodiment, adhesion layer 114 is separated by dielectric layer 420.

In FIGS. 4A-4C, although two head structures are illustrated, electromagnetic apparatus can have as many as 100,000 or more in a single array.

Figure 5:
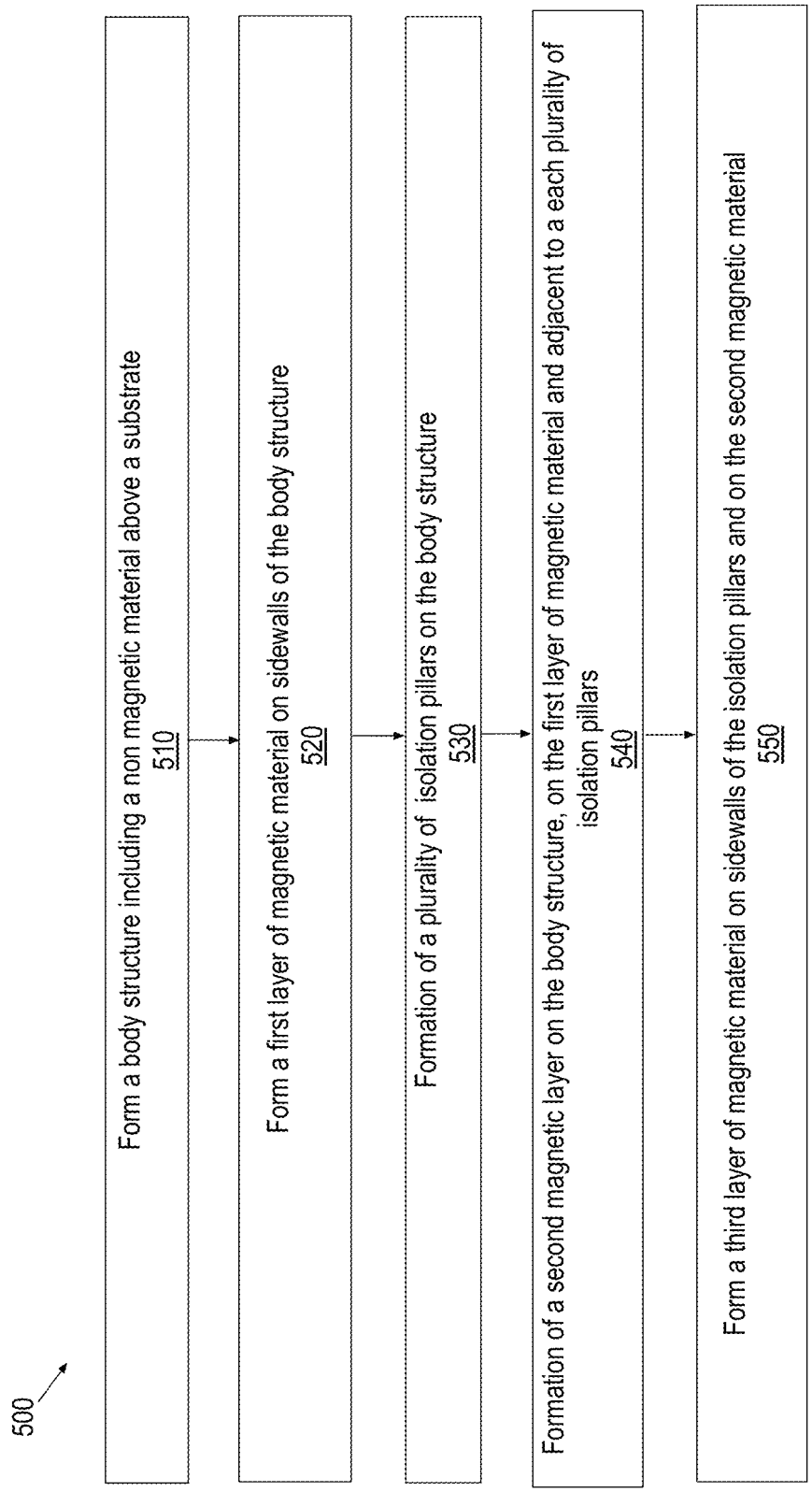
FIG. 5 illustrates a flow diagram depicting the method to make an electromagnetic apparatus, in accordance with an embodiment of the present disclosure.

FIG. 5 illustrates a flow diagram depicting a method 500 to fabricate an electromagnetic apparatus with one or more features of electromagnetic apparatus 401A. Method 500 begins at operation 510 by forming a body structure above a substrate, where the body structure has a base structure and a core structure on a portion of the base structure. The method continues at operation 520 with a selective formation of a first layer of magnetic material on the base structure and on sidewalls of the core structure. Method 500 then continues at operation 530 with formation of a plurality of isolation pillars on the core structure. Method 500 continues at operation 540 with formation of a second layer of magnetic material on the body structure, adjacent to a portion of each of the plurality of isolation pillars and on a portion of the first layer of magnetic material. The method concludes at operation 550 with formation of a third layer of magnetic material on each of the sidewalls of the plurality of isolation pillars, and on portions of the second layer of magnetic material.

Figure 6A:
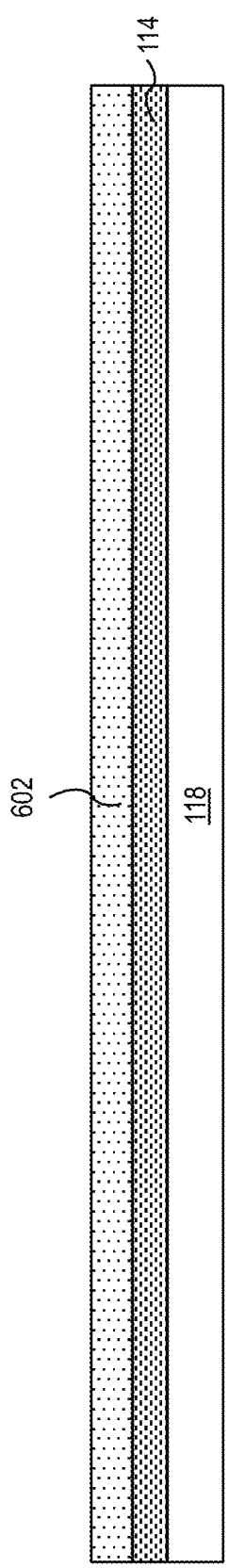
FIG. 6A illustrates a first layer of non-magnetic material formed above a substrate.

FIG. 6A illustrates adhesion layer 114 formed above substrate 118 and seed layer 602 formed above adhesion layer 114.

The adhesion layer 114 provides strong bonding between the substrate 118 and the seed layer 602. In an embodiment, adhesion layer 114 is deposited to a thickness between 10 nm and 100 nm. In some embodiments adhesion layer 114 is deposited using a chemical vapor deposition process or plasma enhanced chemical vapor deposition process.

In an embodiment, seed layer 602 includes a metal or a metal alloy, such as but not limited to copper, tantalum, ruthenium or tungsten. In an embodiment, seed layer 602 is not magnetic and is a metal that is adequate for subsequent electroplating process of both magnetic and non-magnetic materials originating from this layer. In some embodiments seed layer 606 is deposited using a physical sputter deposition process.

Figure 6B:
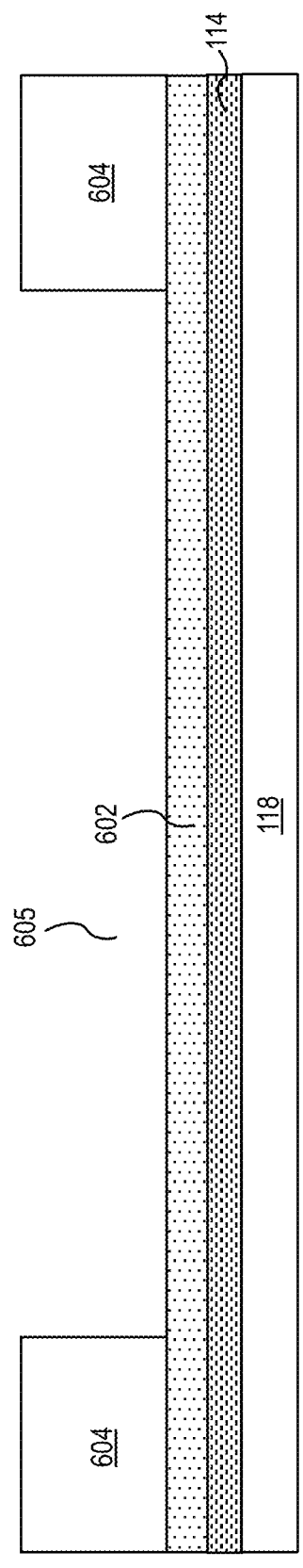
FIG. 6B illustrates a cross-sectional view of the structure in FIG. 6A following the formation of a first mask on the first layer of non-magnetic material.

FIG. 6B illustrates a cross-sectional view of the structure in FIG. 6A following the formation of mask 604 on the seed layer 602. In an embodiment, mask 604 defines shape, size and location of a bulk structure, which is to be subsequently formed. In an illustrative embodiment, mask 604 defines opening 605 where a bulk structure is to be subsequently formed.

In some embodiments, mask 604 is formed by a lithographic process. In other embodiments, mask 604 includes a dielectric material that has been patterned. The height of mask 604 may depend on how much spatial buffer is required for separating substrate 118 from a head structure to be subsequently formed. In some embodiments, practical height of mask 604 ranges between 100 nanometers to 3 micrometers.

FIG. 6C illustrates a cross-sectional view of the structure in FIG. 6B following the formation of non-magnetic material 610 in the opening 605, on a portion of seed layer 602. Non-magnetic material 610 forms a bulk core of electromagnetic apparatus being fabricated. Non-magnetic material 610 may include a material such as but not limited to copper, tantalum, ruthenium, or tungsten. In other embodiments, non-magnetic material 610 may include a material that is different from seed layer 602.

In an embodiment, non-magnetic material 610 is formed using electroplating or electroless plating process, if it is a non-magnetic metal or metal alloy. In an embodiment, non-magnetic material 610 conforms to sidewalls 604A and 604B of mask 604. In the illustrative embodiment, sidewalls 604A and 604B are vertical or substantially vertical and non-magnetic material 610 has sidewalls 610A and 610B that are vertical or substantially vertical as deposited.

Uppermost surface 610C of the non-magnetic material 610 may be planar or substantially planar as deposited. Further processing may be required to achieve desired planarity as will be discussed further below.

FIG. 6D illustrates the structure of FIG. 6C following removal of mask 604 followed by formation of mask 612 on non-magnetic material 610. In an embodiment, mask 604 (not shown) is removed by a wet chemical process selective to seed layer 602 and nonmagnetic material 610. In an embodiment, wet chemical process does not react with non-magnetic material 610, and sidewalls 610A and 610B remain substantially unaltered as deposited. As shown, uppermost surfaces 606A and 606B of seed layer 602 are also unaffected by the wet etch. After removal of mask 604, seed layer 602 and non-magnetic material 610 form a body structure such as body structure 202 (described in association with FIG. 2A).

In an embodiment, second mask 612 is formed on uppermost surface 610C. Sidewalls 610A and 610B and uppermost surfaces 606A and 606B remain exposed after formation of mask 612. In an embodiment, mask 612 is formed by lithographic techniques.

FIG. 6E illustrates the structure of FIG. 6D following formation of magnetic material 616 on body structure 202. In an embodiment, magnetic material 616 is formed on uppermost surfaces 606A and 606B and adjacent to sidewalls 610A and 610B of body structure 202. In an embodiment, magnetic material 616 is deposited using electroplating or electroless deposition process. In an embodiment, magnetic material 616 includes a material that is t same or substantially same as the material of magnetic structure 210. In an illustrative embodiment, sidewalls 610A and 610B of body structure 202 are vertical or substantially vertical and resultant sidewalls 616A and 616B of magnetic material 616 are formed vertically or substantially vertically guided by sidewalls 610A and 610B. Vertical regions, such as sidewalls 616A and 616B, may readily confine magnetic flux lines generated by an electromagnet that will be subsequently coupled with magnetic material 616.

As shown, magnetic material 616 has uppermost surfaces 616C and 616D that are on a plane that is higher than a plane defining surface 610C of the body structure 202. In such an embodiment, magnetic material 616 and body structure 202 may be planarized in a subsequent operation.

FIG. 6F illustrates the structure of FIG. 6E following removal of mask 612 and planarization of upper portions of body structure 202 and top portions of magnetic material 616. In an embodiment, mask 612 is removed using a process similar to the process utilized to remove mask 604. In one such embodiment, mask 612 is removed selectively to magnetic material 616 and body structure 202. After removal of mask 612, body structure 202 and magnetic material 616 may be planarized. In an embodiment, the planarization process includes a chemical-mechanical polish (CMP) process. A CMP process may planarize the upper portions of body structure 202 and magnetic material 616 such that uppermost surfaces 616C and 616D are co-planar or substantially co-planar with uppermost surface 610C of body structure 202. Planar uppermost surface 610C may help to reduce variability in heights of head structures that will be subsequently formed.

FIG. 6G illustrates the structure of FIG. 6H following formation of a plurality of isolation structures on surface 610C of the body structure 202. In an embodiment, a dielectric layer 620 is deposited on surface 610C and on magnetic material 616. In an embodiment, the dielectric material (indicated by the dashed lines 620) includes a material such as silicon oxide, silicon nitride, carbon doped oxide, polyimide, spin-on-glass or carbon doped nitride. In an embodiment, mask is formed on the dielectric material and the dielectric material is subsequently patterned to form one or more isolation structures. The dielectric material may be deposited to a thickness that is greater than a final height of the isolation structure to accommodate losses from downstream processing (e.g., from planarization). In an embodiment, the patterning is performed using a plasma etch process. The plasma etch process may be highly anisotropic to produce isolation structures 620A, 620B and 620C having vertical or substantially vertical sidewalls. In another embodiment, the isolation structures 620A, 620B and 620C is directly formed using a photo-imageable polyimide (PIPI) that is deposited and patterned without the need for an etch process.

In the illustrative embodiment, three isolation structures 620A, 620B and 620C are shown. The spacing between each isolation structure is governed by a thickness of the magnetic material to be formed adjacent to the isolation structure in a subsequent operation as well as by the size and spacing of mLED structures to be picked up from an external substrate.

FIG. 6H illustrates the structure of FIG. 6G following formation of second magnetic material 622 on magnetic material 616 and on portions of body structure 202. In an illustrative embodiment, magnetic material 622 includes magnetic material portions 622A and 622D that are formed above magnetic material portions 616E and 616F respectively. As shown, magnetic material portions 622B and 622C are formed on body structure 202. Portions of magnetic material portions 622D and 622C are also formed on body structure 202. In an embodiment, magnetic material 622 is deposited to a thickness equivalent to one fourth to one half of the height of the mLED, corresponding to a thickness between 1 micrometer to 3 micrometers. As shown, magnetic material 622 has thickness, $T_{MM}$, that is less than height $H_{ISO}$, of isolation structures 620A, 620B or 620C.

In an embodiment, magnetic material 622 includes a material that is same or substantially same as the magnetic material 616. In other embodiments, the magnetic material 622 may include a material that is different from the magnetic material 616.

Figure 6I:
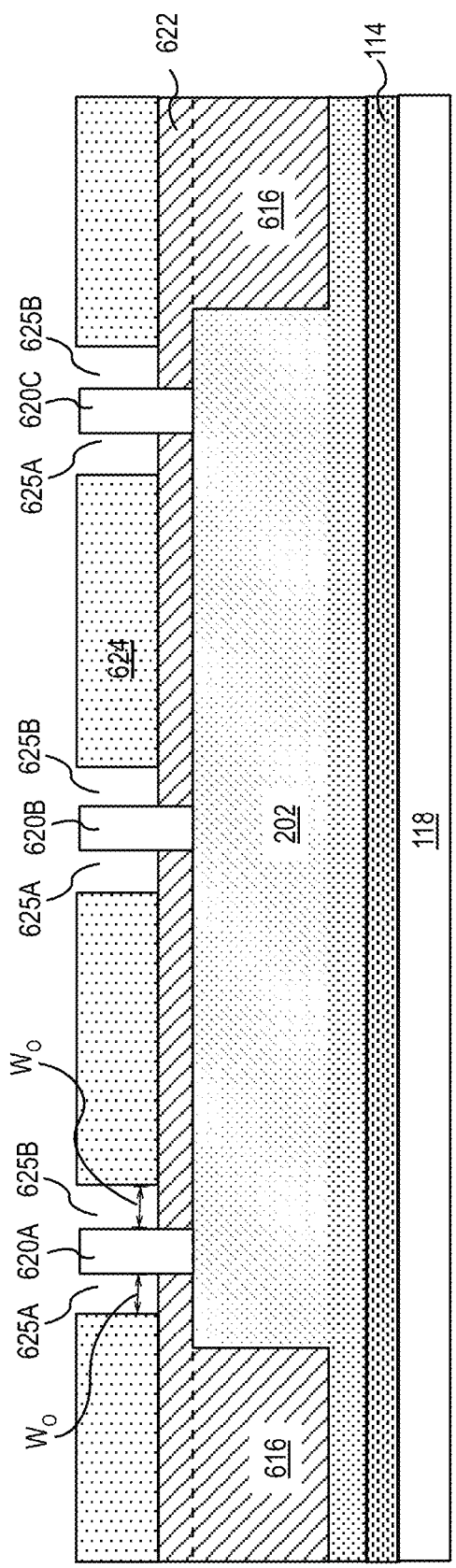
FIG. 6I illustrates the structure of FIG. 6H following the formation of a third mask defining openings adjacent to each of the plurality of structures, exposing portions of the second layer of magnetic material.

FIG. 6I illustrates the structure of FIG. 6H following the formation of a third mask 624 on the magnetic material 622. The mask includes openings 625A and 625B adjacent to each isolation structure 620A, 620B and 620C. Each of the openings 625A and 625B is designed to have a width, $W_O$, that determines a width of a third magnetic material region to be formed in a subsequent operation. In an embodiment, mask 624 includes a material that is same or substantially same as the material of mask 612, such as a photoresist or PIPI.

Figure 6J:
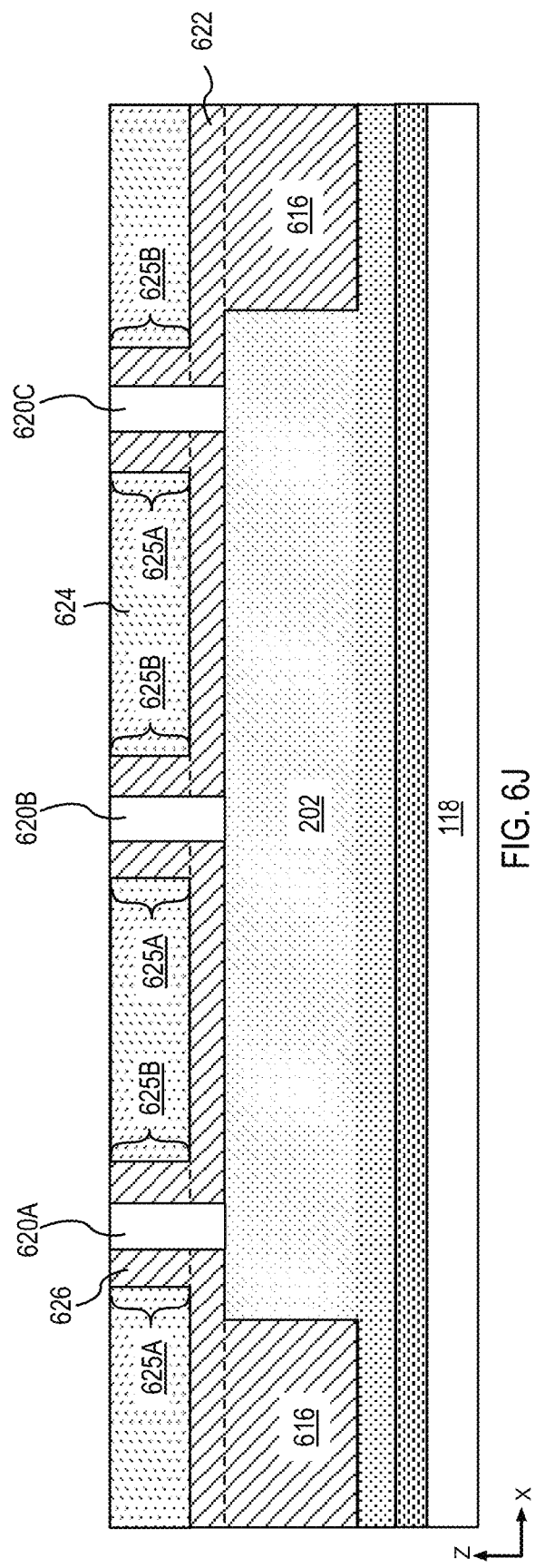
FIG. 6J illustrates the structure of FIG. 6I following the formation of a third layer of magnetic material selectively on the second layer of magnetic material.

FIG. 6J illustrates the structure of FIG. 6I following the formation of a third magnetic material 626 selectively on magnetic material 622 in each of openings 625A and 625B. In an embodiment, magnetic material 626 is deposited by an electroplating or electroless deposition process and includes a material that is same or substantially same as the material of magnetic material 622. In an illustrative embodiment, magnetic material 626 is formed in each of openings 625A and 625B, on magnetic material 622 adjacent to each isolation structure 620A, 620B and 620C. It is to be appreciated that magnetic material 626 may be separated by isolation structures 620A, 620B and 620C.

Figure 6K:
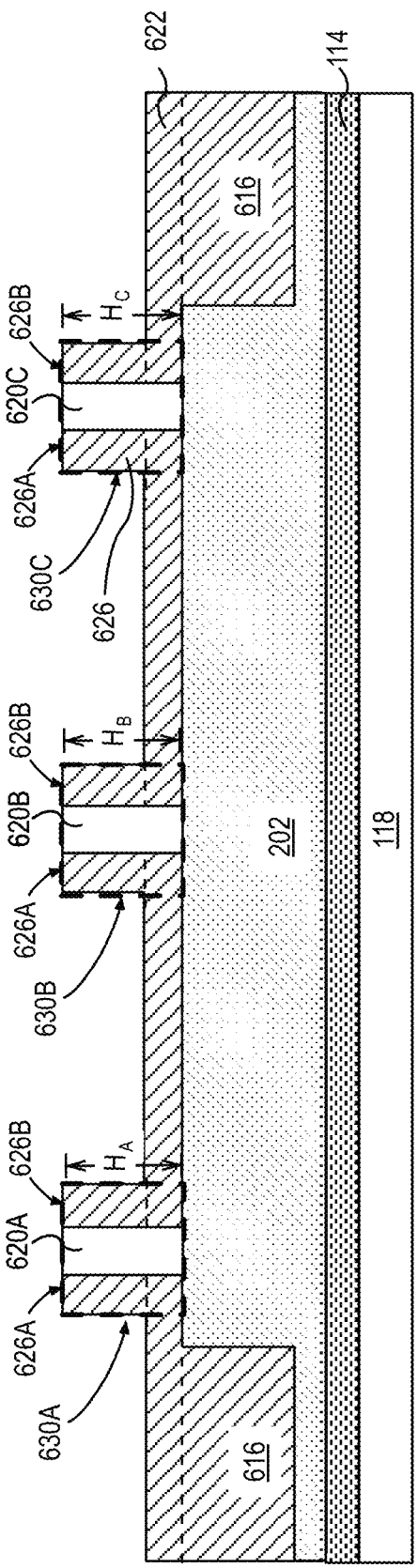
FIG. 6K illustrates the structure of FIG. 6J following the removal of the third mask.

FIG. 6K illustrates the structure of FIG. 6J following the removal of mask 624 selective to magnetic material 626, and each isolation structure 620A, 620B and 620C.

Figure 6L:
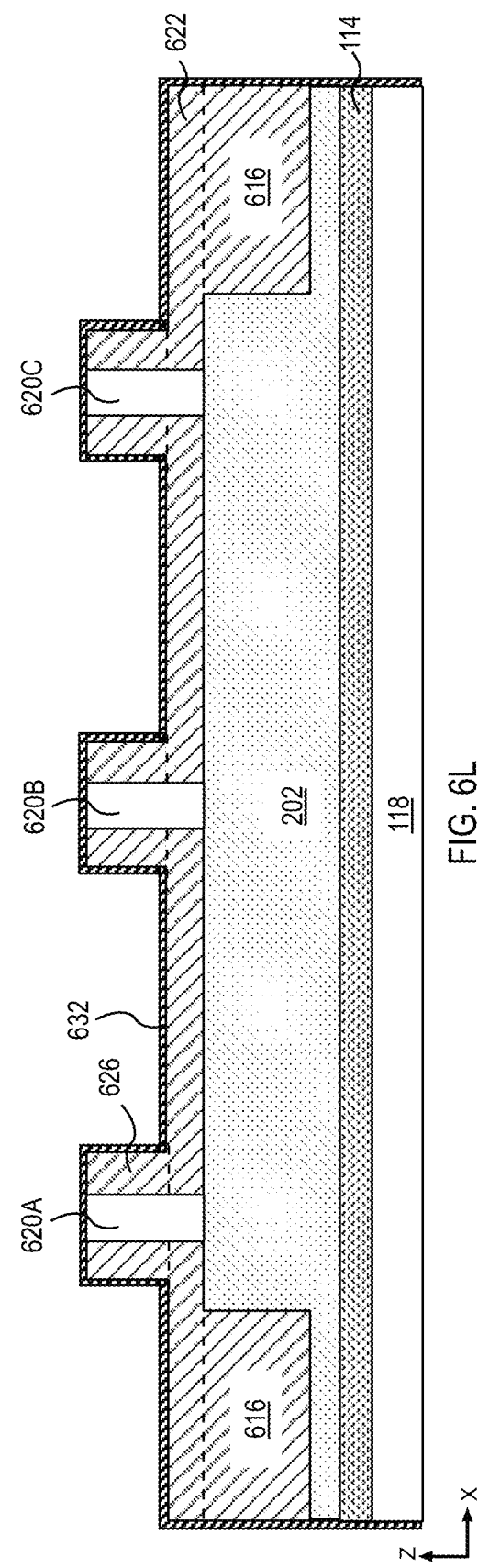
FIG. 6L illustrates the structure of FIG. 6K following the formation of an encapsulation layer.

FIG. 6L illustrates the structure of FIG. 6K following the formation of an encapsulation layer 632 on electromagnetic apparatus 600. In an illustrative embodiment, encapsulation layer 632 is deposited conformally on head structures 630A, 630B and 630C, on magnetic material 622 and on sidewalls of magnetic material 616. Encapsulation layer 632 is designed to protect electromagnetic apparatus 600 from wear and from an external environment during use. In an embodiment, encapsulation layer 632 includes a hermitic material such as silicon nitride. Other hermetic, insulating and non-magnetic materials such as silicon carbide may also be used. Encapsulation layer 632 may be deposited to a thickness between 10 nm-30 nm.

FIG. 7 illustrates a cross sectional view of electromagnetic apparatus 600 in close proximity to a plurality of mLED devices 700 on a substrate 712. In an embodiment, electromagnetic apparatus 600 is well-aligned to the mLED devices 700 directly placed below head structures 630A, 630B and 630C designed to be picked up from substrate 702 by a magnetic force.

In an illustrative embodiment, head structure 630A is distant from head structure 630B by spacing, $W_{SHS}$. Spacing $W_{SHS}$ is designed based on spacing, $W_S$ between mLED devices 700 and the size of mLED, $W_{MD}$.

Head structures 630A, 630B and 630C each have width $W_{HS}$, and each mLED device 700 has width $W_{MD}$. In an illustrative embodiment, $W_{HS}$ is equal or substantially equal to $W_{MD}$.

In an embodiment, spacing, $W_{SHS}$, between head structures may be related to width, $W_{MD}$, and spacing, $W_S$, between each successive mLED device 702 by relation [1]:

$$W_{SHS} = n\, W_{MD} + [n+1] W_S \qquad [1]$$

where "n" is the number of mLED devices 700 to be skipped during the pick-up process of adjacent mLEDs. In an illustrative embodiment, where n=1, apparatus 600 will pick-up only every other mLED. In some such embodiments, spacing between each successive head structure, $W_{SHS}$ is equal to $W_{MD}+2\ W_S$. In an embodiment, when $W_{MD}$ is equal to or substantially equal to spacing $W_S$, between each successive micro-device 702A and 702B, then $W_{SHS}$ is equal to 3 $W_{MD}$. In an illustrative embodiment, $W_{MD}$ is greater than spacing $W_S$.

In an embodiment, head structures 630A, 630B, 630C each have height, $T_H$, which is greater than at least half a thickness, $T_{MD}$, of micro-device 702. In one such embodiment, damage during operation of electromagnetic apparatus 600 may be prevented when thickness $T_H$, is greater than tolerances allowed for mLEDs thickness.

Electromagnetic apparatus 600 relies on employing discontinuity in magnetic flux across each head structure 630A, 630B, and 630C for its operation, as will be described further below. Substrate 702 may include a material that is same or substantially same as material of substrate 118. Intermediate layers may be present between mLED devices 700 and substrate 702, as will be discussed below.

In an embodiment, a large collection of mLED devices, including mLED devices 700 are first fabricated on a provider or a native substrate that is unique to the desired color emitted by mLED device. The process of fabricating the mLED device utilizes known methodology. In an embodiment of the present disclosure, a ferromagnetic layer is usually deposited on the mLED device during its fabrication, as part of the interconnect structures needed to supply power from external source to the mLED for its operation. The existence of this ferromagnetic material on an mLED device provides for continuity of magnetic flux across each head structure 630A, 630B, and 630C, when electromagnetic apparatus 600 is operational.

In one embodiment, the mLED devices undergo at least two transfer processes to be employed in an mLED-based display product. A first transfer process includes removing mLED devices of a single color (type) from a native substrate and placing them on an intermediate substrate. To enable the first transfer process, a sacrificial layer is deposited on the native substrate prior to the epitaxial deposition process required to fabricate the active area of the mLED. The sacrificial layer must be compatible with the epitaxial growth process utilized in forming the mLED. An example of such sacrificial layer is AlN. In an embodiment, the first transfer process relies on magnetically coupling the mLED devices to a bulk electromagnet, while chemically etching the sacrificial layer that bonds the mLED device structures to the native substrate. An activated bulk electromagnet may maintain spatial separation between mLED device structures, during the chemical etch process and during a subsequent transfer to an intermediate substrate. Once the mLED device structures are released from the native substrate, they are transported by the bulk electromagnet to be placed onto an adhesion layer, of known quantifiable adhesion properties, above the intermediate substrate. After the mLED device structures are placed on the adhesion layer, the bulk electromagnet is deactivated and the mLED device structures adhere to the adhesion layer. The bulk electromagnet may be different from the electromagnetic apparatus described above. The significance of the first transfer process is to provide the second transfer with known uniform adhesion between the mLEDs and the electromagnetic apparatus to enable robust transfer.

A second transfer process includes picking the mLED device structures from the intermediate substrate and placing them on an assembly substrate that is physically separate from the intermediate substrate. The second transfer utilizes the electromagnetic apparatus to magnetically couple a selection of mLED device structures that matches a pattern of head structures in the electromagnetic apparatus. The ferromagnetic material in the mLED device structures provides a path for flux continuity when the electromagnetic apparatus is activated. The electromagnetic apparatus is designed to deliver enough force to release the mLEDs from the intermediate substrate. Thus, the electromagnetic apparatus only picks mLED device structures that are substantially directly under the head structure.

In an embodiment, the size of the head structures, and the spacing between the head structures can be tailored to meet the size and spatial distribution of the mLED device pattern intended to be realized on the assembly substrate (second transfer process).

The first and second transfer process may be repeated for different mLED device structures so that the assembly substrate can assemble different types of mLED device structures in various configurations. In an exemplary embodiment, mLED device structures of three different colors to be placed on a common assembly substrate to form a pixel, each have same or substantially same size and relative spacing between adjacent mLED device structures. It is to be appreciated that a relative spacing between mLED device structures of a given color are preserved throughout the second transfer process.

FIGS. 8 through 13 describe a method to enable bulk transfer of a large collection of mLEDs of a single device type (for e.g., red, blue or green mLED) from a native substrate to an intermediate substrate.

Figure 8:
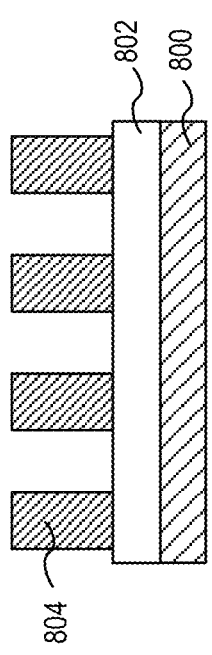
FIG. 8 is a cross-sectional illustration of a plurality of mLED devices on a sacrificial layer formed above a substrate.

FIG. 8 is a cross-sectional illustration of a plurality of devices such as mLED 804 above layer 802 formed above substrate 800. Depending on embodiments, mLED 804 may include a single device type such as blue, red or green mLED. mLED 804 is fabricated using known techniques above substrate 802. In an embodiment, layer 802 includes a sacrificial material such as aluminum nitride which is compatible with epitaxial growth process, essential for fabrication of mLED 804, while is also removable by wet etch process during the first transfer process. Layer 802 may have a thickness between 20 nm to 500 nm.

Figure 9B:
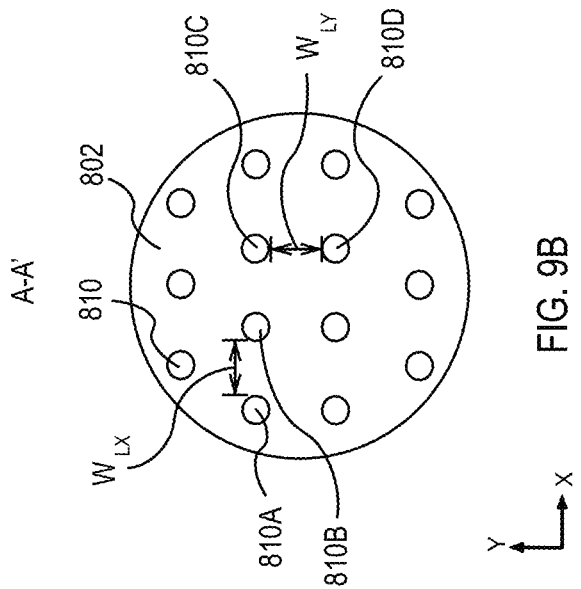
FIG. 9B is a plan-view illustration of the structure of FIG. 9A.
Figure 9A:
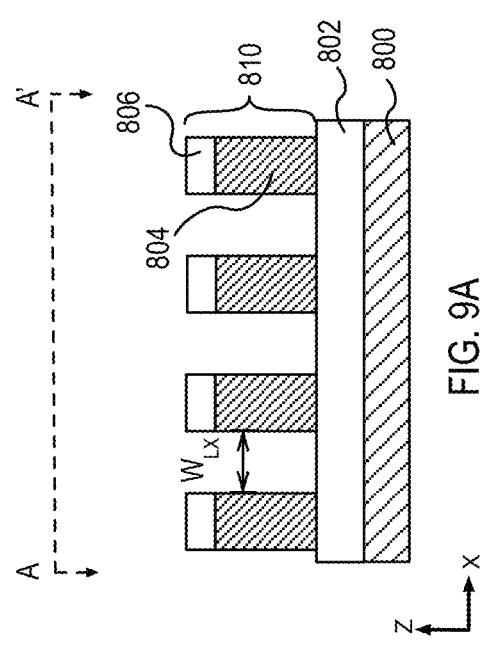
FIG. 9A is a cross-sectional illustration of the structure of FIG. 8 following the formation of a cap including a ferromagnetic material on each mLED device to form mLED device structures.

FIG. 9A is a cross-sectional illustration of the structure of FIG. 8 following formation of cap 806 including a ferromagnetic material, on each mLED 804. The combination of cap 806 and mLED 804 is referred to as mLED device structure 810. In an embodiment, cap 806 includes a ferromagnetic metal such as Co, Ni, Fe, or alloys of magnetic metals such as Co, Ni, Fe, or alloys thereof. In an embodiment, cap 806 has a thickness between 100 nm to 2 micrometers. For practical considerations, cap 806 is likely to be already accounted for during the formation of the interconnects needed to conduct power from an external source to the mLED device. In an embodiment, a combination of physical sputtering, electro and electroless plating techniques can be utilized.

FIG. 9B is a plan-view illustration of the structure of FIG. 9A. An array including a plurality of mLED device structures 810 are depicted. In the illustrative embodiment, mLED device structures 810 have a circular plan view profile. In other embodiments, mLED device structures 810 can have a rectangular plan view profile.

After fabrication of the plurality of mLED device structures 810, a series of operations are performed to transfer a plurality of mLED device structures 810. The transfer operation begins as illustrated in FIG. 10.

Figure 10:
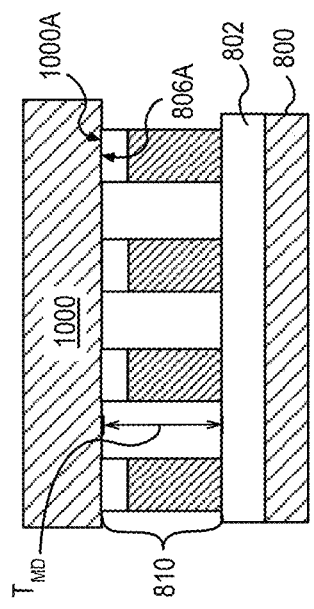
FIG. 10 illustrates a cross sectional view of an electromagnet 1000 directed toward the mLED device structures.

FIG. 10 illustrates a cross sectional view of electromagnet 1000 directed in the negative Z direction (as denoted by arrow 1001) toward mLED device structures 810. The electromagnet has electromagnet surface 1000A that will subsequently make contact with uppermost surface 806A of mLED device structures 810.

Figure 11:
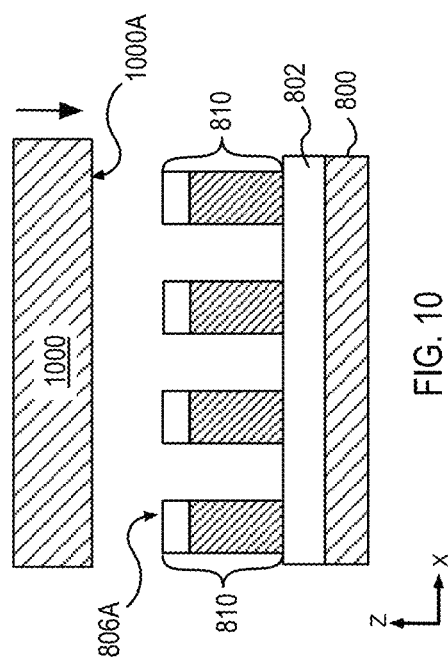
FIG. 11 illustrates a cross sectional view of the electromagnet surface of the electromagnet after making contact with an uppermost surface of each of the one or more mLED device structures.

FIG. 11 illustrates a cross sectional view of electromagnet surface 1000A of electromagnet 1000 after making contact with uppermost surface 806A of each mLED device structure 810. Electromagnet 1000 will exert a force to attract mLED device structures 810 to electromagnet surface 1000A. In an embodiment, the electromagnet provides enough force to overcome variability in mLED height introduced during the manufacturing process. All mLEDs are coupled to the electromagnet.

Figure 12A:
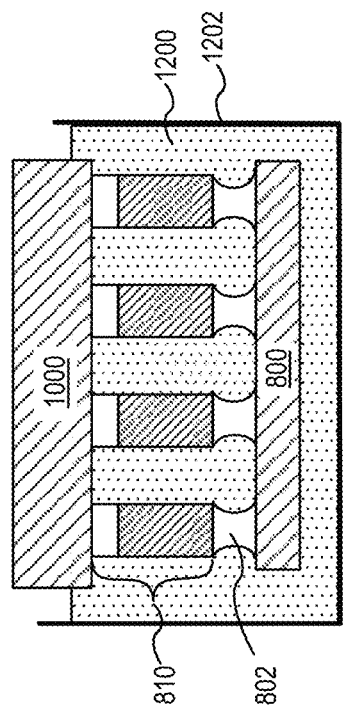
FIG. 12A illustrates the structure of FIG. 11 after immersing the substrate including the mLED device structures in a chemical solution.

FIG. 12A illustrates the structure of FIG. 11 after immersing in chemical solution 1200 held in housing 1202. In an embodiment, mLED device structures 810 and layer 802 are fully immersed in solution 1200. In an illustrative embodiment, electromagnet 1000 is also partially immersed in solution 1200 such that electromagnet surface 1000A is in solution 1200. Solution 1200 is chosen to chemically react with and dissolve layer 802, but not with mLED device structures 810. Experts in the art recognize the need to apply a sheath or layer of protective material on the electromagnet itself to protect from wet etch while immersed.

Figure 12B:
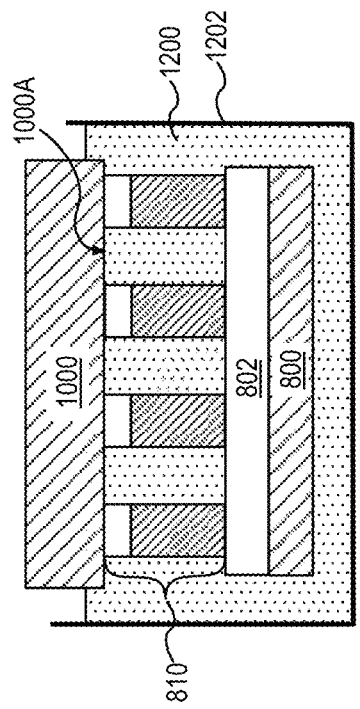
FIG. 12B illustrates the structure of FIG. 12A after a partial chemical etch of the sacrificial layer.

FIG. 12B illustrates the structure of FIG. 12A after a partial chemical etch of layer 802. The chemical solution will depend on the material of layer 802. Electromagnet 1000 will continue to hold mLED device structures 810 through magnetic force while chemical solution 1200 etches layer 802. In an illustrative embodiment, substrate 800 is supported (by a stand, not shown) to prevent unwanted stress on layer 802 during the chemical etch process.

Figure 12C:
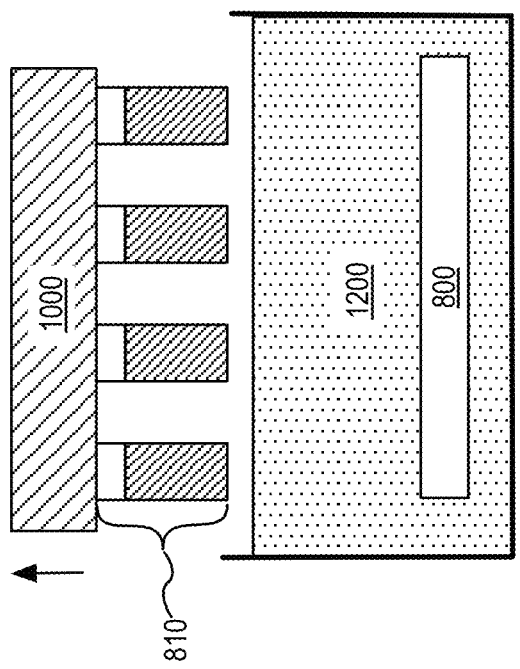
FIG. 12C illustrates the structure of FIG. 12A after the sacrificial layer is fully removed.

FIG. 12C illustrates the structure of FIG. 12A after layer 802 is removed. The magnetic force will continue to hold mLED device structures 810 after layer 802 is etched.

Figure 12D:
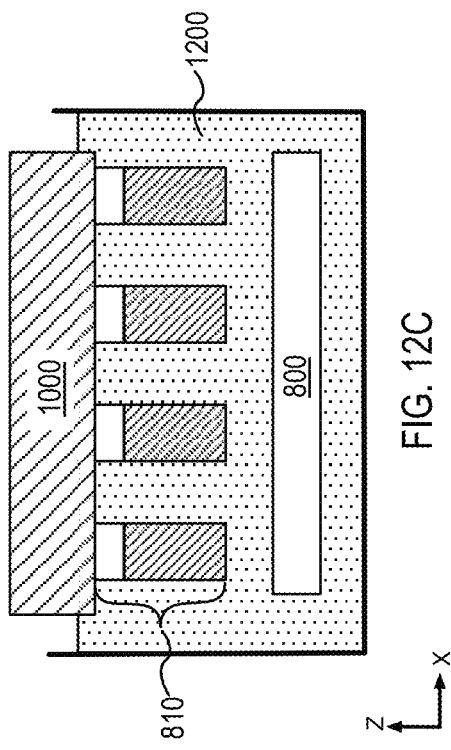
FIG. 12D illustrates the structure of FIG. 12C after the electromagnet and the device structures are removed from the chemical solution.

FIG. 12D illustrates the structure of FIG. 12C after electromagnet 1000 and device structures 810 are removed from the chemical solution. In an embodiment, mLED device structures 810 are rinsed and dried. In an embodiment, when mLED device structures 810 are rinsed and dried, the spatial position between mLED device structures 810 is maintained.

Figure 13:
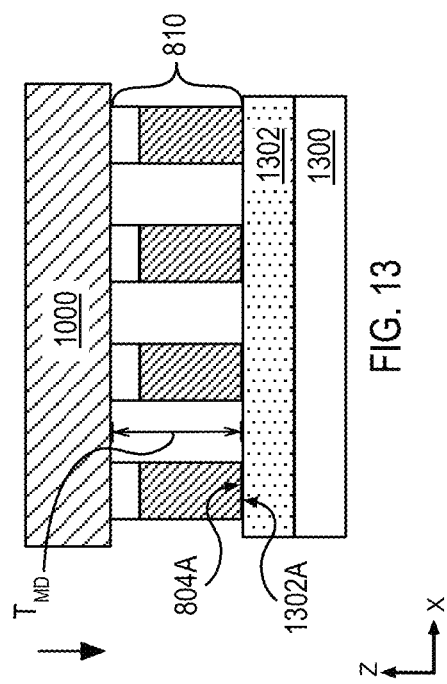
FIG. 13 illustrates a cross sectional view following the placement of the mLED device structures depicted in FIG. 12D, on an uppermost surface of an adhesion layer formed above an intermediate substrate.

FIG. 13 illustrates a cross sectional view following the placement of mLED device structures 810, removed from chemical solution 1200 in FIG. 12D, onto uppermost surface 1302A of adhesion layer 1302 formed above intermediate substrate 1300. In an embodiment, adhesion layer 1302 includes a material such as adhesion tape, commonly used in the packaging industry. The adhesion tape will have known adhesion characteristics, which is then used to determine force needed to release the mLED devices during the second transfer process. In an embodiment, adhesion layer 1302 includes a UV light-sensitive material. During pick-up phase of the mLED transfer process, adhesion layer 1302 may be exposed to UV radiation (not shown on FIG. 13) to reduce the adhesion force between adhesion layer 1302 and the mLED, resulting in more degree of freedom in controlling the electromagnetic force needed to detach the mLED.

In an embodiment, mLED device structures 810 have same or substantially same height, $T_{MD}$. In one such embodiment, lowermost surface 804A of mLED device structures 810 come into contact with uppermost surface 1302A of adhesion layer 1302, when electromagnet 1000 is lowered towards substrate 1300, as shown in FIG. 13.

Figure 14B:
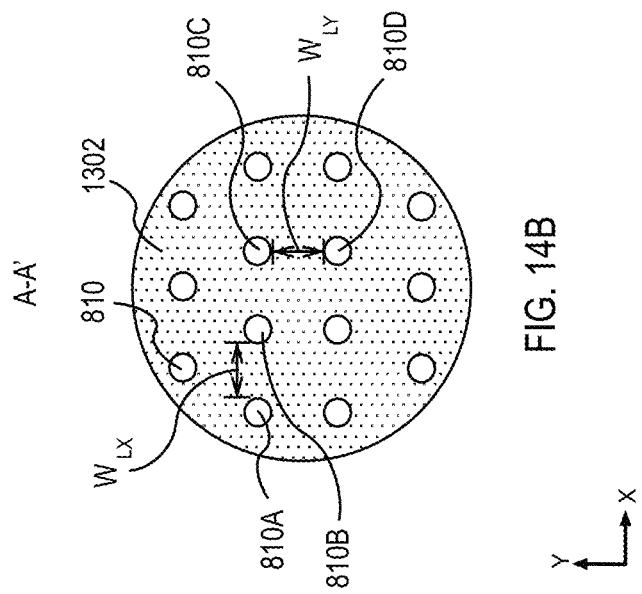
FIG. 14B illustrates a plan view of the structure in FIG. 14A after the electromagnet has placed the mLED device structures onto an adhesion layer.
Figure 14A:
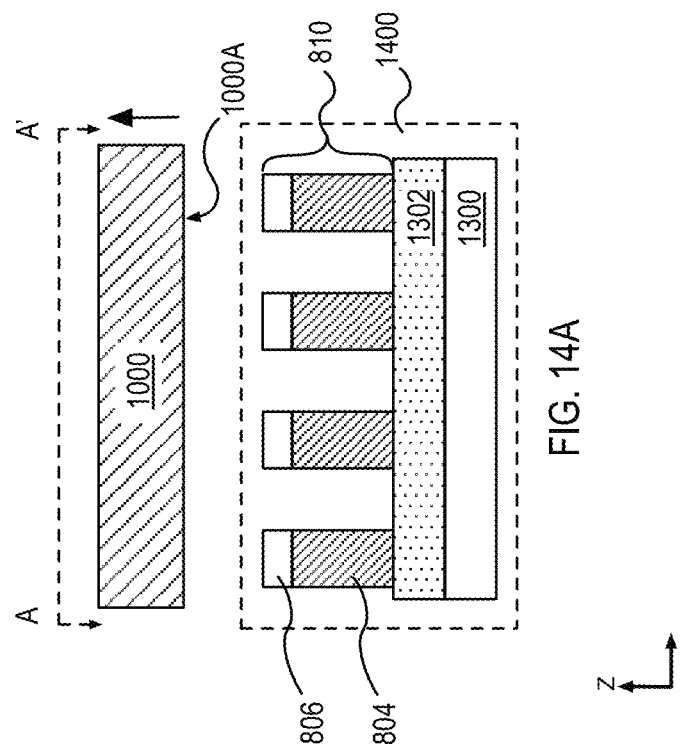
FIG. 14A illustrates the structure of FIG. 13 after the electromagnet is de-energized and removed from the vicinity of the mLED device structures.

FIG. 14A illustrates the structure of FIG. 13 after electromagnet 1000 is de-energized and removed from the vicinity of mLED device structures 810. In an embodiment, the adhesive force between uppermost surface 1302A of adhesion layer 1302 and mLED device structures 810 enables mLED device structures 810 to remain after electromagnet 1000 is removed.

Once mLED device structures 810 are moved onto an intermediate substrate having an adhesion layer such as adhesion layer 1302, one or more mLED device structures 810 may be moved onto an assembly substrate. In the aforementioned discussion, mLED device structures 810 belong to a single type of LED. The method to move LEDs of different colors may be the same as the method described above. In one embodiment, a lapping process of native substrates may be utilized to release mLED devices when inserting a sacrificial layer between the native mLED substrate and mLED devices is not practically feasible. In one such embodiment, electromagnet 1000 provides a strong holding force that maintains spatial distribution of mLEDs during the lapping process. In another embodiment, a combination of lapping and wet etch processes may be used to detach mLEDs from their native substrate. The magnetic force, provided by electromagnet 1000, can maintain spatial distribution of the mLEDs.

FIG. 14B illustrates a plan view of the structure 1400 in FIG. 14A after electromagnet 1000 has placed mLED device structures 810 onto adhesion layer 1302. In an embodiment, X and Y spacing, $W_{LX}$, and $W_{LY}$, respectively, between mLED device structures 810 are maintained relative to native substrate 800, as illustrated. The method to assemble LEDS of different colors, for example, blue, red or green onto a common assembly substrate utilizes one or more of the electromagnetic apparatus described in association with FIGS. 2-4.

In an embodiment of the present disclosure, an electromagnetic apparatus such as electromagnetic apparatus 200 is utilized to remove one or more mLED device structures 810 from an adhesion layer and placed onto an assembly substrate, as illustrated in FIGS. 15A-15F.

FIG. 15A illustrates a cross sectional view of an electromagnetic apparatus 300 directed in the negative Z direction (as denoted by arrow 1501) toward structure 1400. In the illustrative embodiment, electromagnetic apparatus 300 has one head structure 212 (inside dashed box) that will subsequently make contact with uppermost surface 806A of an mLED device structure, for example, mLED device structure 810B. In an embodiment, head structure 212 has width $W_{HS}$, that is same or substantially same as width $W_{MD}$, of mLED device structure 810B.

FIG. 15B illustrates a cross sectional view of the structure of FIG. 15A after head structure 212 of electromagnetic apparatus 300 is in physical contact with mLED device structure 810B. After contact, electromagnet 122 is energized and magnetic flux 1503 (dashed line) is generated. Portions of magnetic flux 1503 is confined to magnetic structures 210A and 210B and forms a closed loop through cap 806, as illustrated. Magnetic flux 1503 may be sufficiently confined within magnetic structures 210A and 210B and cap 806 and may not attract any of adjacent mLED device structure 810A or 810B.

As illustrated, when head structure 212 makes contact with mLED device structure 810, portions of magnetic structure 210A and 210B are separated from adjacent mLED device structures 810A and 810B by gap $G_{HL}$. In an embodiment, gap $G_{HL}$ is approximately half the thickness $T_{MD}$, of mLED device structure 810. In an embodiment, gap $G_{HL}$ that is at least equal to $(\frac{1}{2})T_{MD}$, accommodates thickness variations in mLED device structure 810 and ensures that electromagnetic apparatus 300 only contacts a single mLED device structure 810 during operation.

FIG. 15C illustrates a cross sectional view of the structure of FIG. 15B after electromagnetic apparatus 300 is raised in the positive Z direction (as denoted by arrow 1505) and removed. The magnetic coupling strength between head structure 212 and mLED device structure 810B is greater than an adhesive force between mLED device structure 810B and adhesion layer 1302. As a result, mLED device structure 810B is detached from adhesion layer 1302 when electromagnetic apparatus 300 is moved.

FIG. 15D illustrates a cross sectional view of electromagnetic apparatus 300 and mLED device structure 810B directed in the negative Z direction (as denoted by arrow 1501) towards adhesion layer 1502 on assembly substrate 1500. In an embodiment, adhesion layer 1502 includes a material that is substantially similar to adhesion layer 1302. In an embodiment, adhesion layer 1502 includes a UV light-sensitive material. Assembly substrate 1500 may include a material that is same or substantially same as the material of substrate 118.

FIG. 15E illustrates a cross sectional view of the structure of FIG. 15D after mLED device structure 810B is placed on adhesion layer 1502. Adhesion layer 1502 has a known adhesion strength and mLED device structure 810B is secured on the surface of adhesion layer 1502 after contact. Electromagnetic apparatus 300 is then deactivated. mLED device structure 810B is then released from electromagnetic apparatus 300, such that mLED device structure 810B is decoupled from head structure 212.

After electromagnetic apparatus 300 is deactivated and raised in the positive Z direction (as denoted by arrow 1505), mLED device structure 810B remains on adhesion layer 1502 of assembly substrate 1500 as shown in FIG. 15F.

The method to remove a particular type of mLED device structure 810 from intermediate substrate 1300 and placed on assembly substrate 1500 has been described above in association with FIG. 15A-15F. In an embodiment, same or substantially same method can be applied to remove one or more mLED device structures other than mLED device structure 810 from one or more substrates other than substrate 1300 and then placed adjacent to mLED device structure 810B on adhesion layer 1502.

Figure 16B:
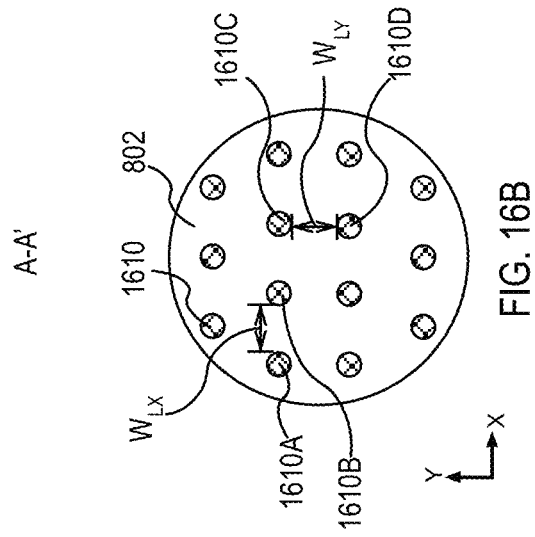
FIG. 16B is a plan-view illustration of the structure of FIG. 16A.
Figure 16A:
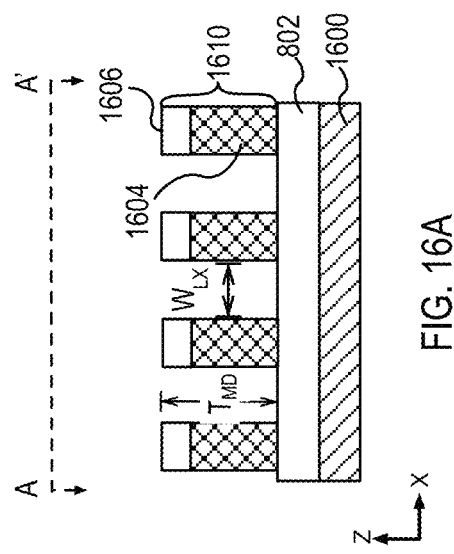
FIG. 16A is a cross-sectional illustration of a plurality of mLED structures formed on a sacrificial layer.

FIG. 16A is a cross-sectional illustration of a plurality of mLED structures 1610 formed above layer 802 that is formed above substrate 1600. Substrate 1600 is different from the substrate 800. In an embodiment, mLED device structure 1610 includes mLED 1604 and cap 1606 formed above mLED 1604. In an embodiment, mLED device structure 1610 has one or more features of mLED device structure 810, for example, having a width $W_{MD}$, and thickness $T_{MD}$. mLED device structure 1610 may be of a different color from a color of mLED device structures 810. In an embodiment, cap 1606 includes a material that is same or substantially same as the material of cap 806. mLED 1604 is fabricated using techniques similar to the fabrication of mLED 804. In an embodiment, substrate 1600 includes a material such as sapphire or silicon.

FIG. 16B is a plan-view illustration of the structure of FIG. 16A. An array including a plurality of mLED device structures 1610 are depicted. Also shown is relative spacing $W_{LX}$, between adjacent mLED device structures 1610A and 1610B (along the X-axis). As shown, $W_{LX}$ is a shortest distance between two adjacent sidewalls of two adjacent mLED device structures 1610. In an illustrative embodiment, spacing along the X-axis between any two adjacent mLED device structures, for example, 1610A and 1610B is uniform. Any two adjacent mLED device structures, such as 1610C and 1610D may be separated along the Y-axis by an amount $W_{LY}$, as shown. In an embodiment, $W_{LY}$ may be same or substantially same as $W_{LX}$.

Figure 17B:
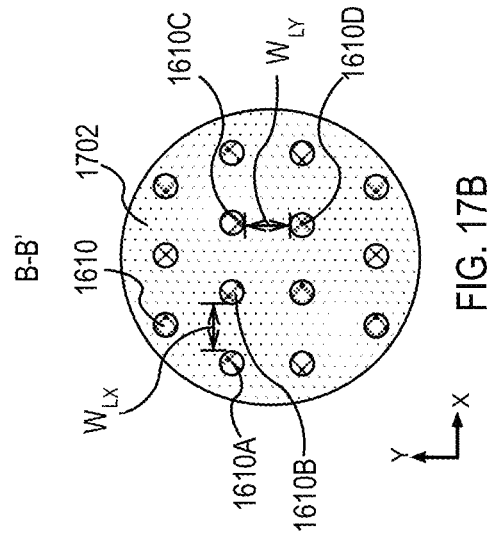
FIG. 17B is a plan-view illustration of the structure of FIG. 17A.
Figure 17A:
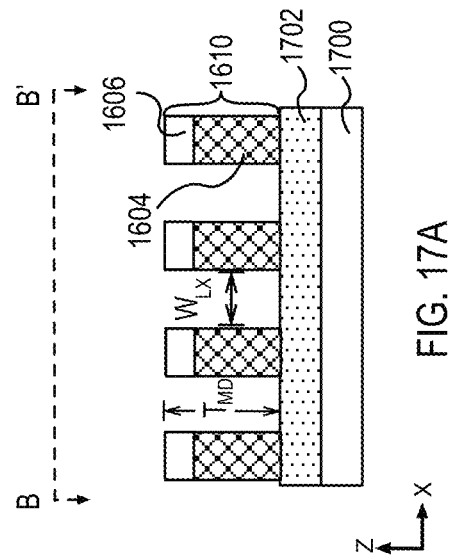
FIG. 17A is a cross-sectional illustration of a plurality of mLED devices on an adhesion layer formed above an intermediate substrate.

After fabrication of the plurality of mLED device structures 1610, a series of transfer operations are performed to transfer a plurality of mLED device structures 1610 to intermediate substrate 1700. The transfer operations are same or substantially same as operations described in association with FIGS. 10-14A. In an embodiment, the arrangement of mLED device structures 1610 on adhesion layer 1702 of an intermediate substrate 1700 after the transfer process is illustrated in cross-sectional illustration of FIG. 17A and in the plan-view illustration of FIG. 17B. In the illustrative embodiment, the arrangement of mLED device structures 1610 on adhesion layer 1702 is same or substantially same as the arrangement of mLED device structures 810 and spacing between mLED device structures 810 on adhesion layer 1302.

Figure 18A:
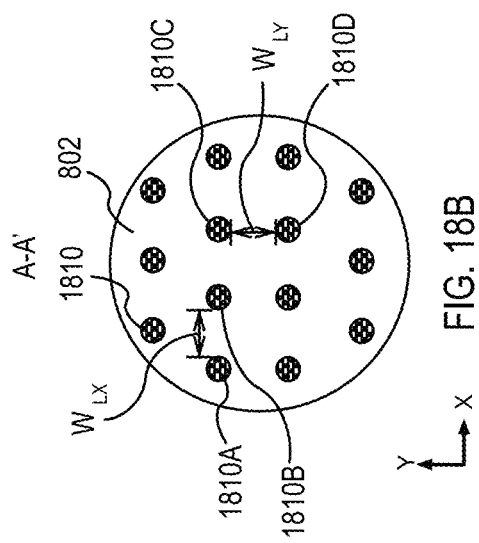
FIG. 18A is a cross-sectional illustration of a plurality of mLED structures on a sacrificial layer.

FIG. 18A is a cross-sectional illustration of a plurality of mLED structures 1810 on layer 802 that is formed above substrate 1800. In an embodiment, mLED device structure 1810 includes mLED 1804 and cap 1806 formed above the mLED 1804. In an embodiment, the mLED device structure 1810 has one or more features of mLED device structure 810 such as having width $W_{MD}$, and thickness $T_{MD}$. mLED device structure 1810 may be a different color from color of mLED device structures 810. In an embodiment, cap 1806 includes material that is same or substantially same as material of the cap 806. mLED 1804 is fabricated above substrate 1800 using techniques similar to fabrication of mLED 804. In an embodiment, substrate 1800 includes a material such as silicon, glass or polymer.

Figure 18B:
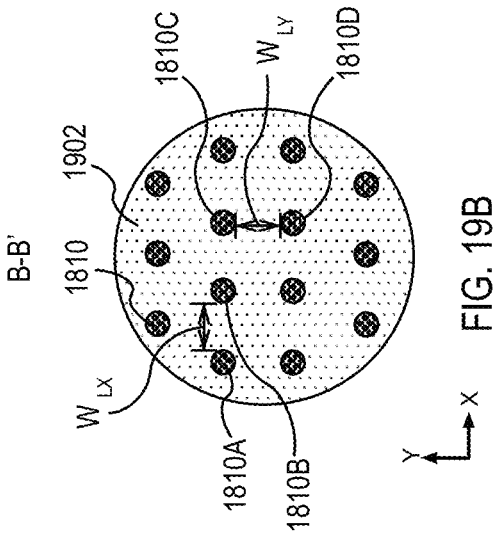
FIG. 18B is a plan-view illustration of the structure of FIG. 18A.

FIG. 18B is a plan-view illustration of the structure of FIG. 18A. An array including a plurality of mLED device structures 1810 are depicted. Also shown is the relative spacing $W_{LX}$, between adjacent mLED device structure 1810A and 1810B (along the X-axis). As shown $W_{LX}$, is a shortest distance between two adjacent sidewalls of two adjacent mLED device structures 1810. In the illustrative embodiment, the spacing along the X-axis between any two adjacent mLED device structures, for example, 1810A and 1810B is uniform. Any two adjacent mLED device structures, such as 1810C and 1810D may be separated along the Y-axis by an amount $W_{LY}$, as shown. In an embodiment, $W_{LY}$ may be same or substantially same as $W_{LX}$.

Figure 19A:
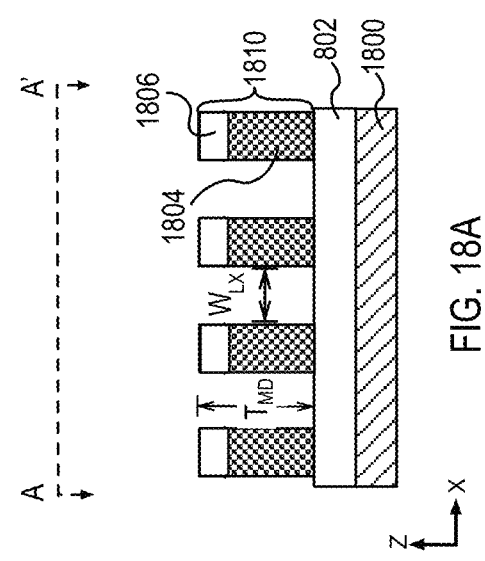
FIG. 19A is a cross-sectional illustration of a plurality of mLED device on an adhesion layer formed above an intermediate substrate.
Figure 19B:
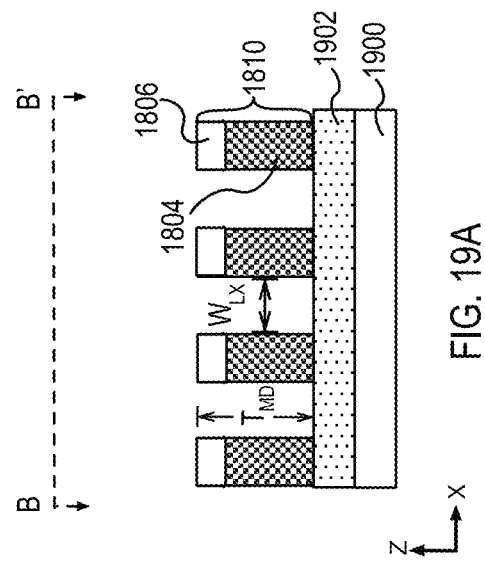
FIG. 19B is a plan-view illustration of the structure of FIG. 19A.

After fabrication of the plurality of mLED device structures 1810, a series of transfer operations are performed to transfer a plurality of mLED device structures 1810 to an intermediate substrate 1900. In an embodiment, transfer operations are same or substantially same as operations described in association with FIGS. 10-14A. In an embodiment, the arrangement of mLED device structures 1810 on adhesion layer 1902 of intermediate substrate 1900 after the transfer process is illustrated in cross-sectional illustration of FIG. 19A and in the plan-view illustration of FIG. 19B. In the illustrative embodiment, the arrangement of mLED device structures 1810 on adhesion layer 1902 is same or substantially same as the arrangement of mLED device structures 810 and spacing between mLED device structures 810 on adhesion layer 1302.

FIG. 20A illustrates a cross sectional view of the structure of FIG. 15F after the placement of mLED device structure 1610 adjacent to mLED device structure 810B. It is to be appreciated that placing mLED device structure 1610 does not affect mLED device structure 810B as the magnetic flux forms a closed loop through magnetic structure 210A, cap 806 associated w mLED device structure 1610 and magnetic structure 210B.

After placement of mLED device structure 1610, electromagnet 122 is deactivated and electromagnetic apparatus 300 is raised and removed (method not shown).

FIG. 20B illustrates a cross sectional view of the structure of FIG. 20A after the placement of mLED device structure 1810 adjacent to mLED device structure 810B. It is to be appreciated that placing mLED device structure 1810 does not affect mLED device structures 1610 or 810B as the magnetic flux forms a closed loop through magnetic structure 210A, cap 806 associated with mLED device structure 1810 and magnetic structure 210B.

In an embodiment, mLED device structure 1810 has one or more features of mLED device structure 810, or mLED device structure 1610 such as including cap 806 and having width $W_{MD}$, and thickness, $T_{MD}$. mLED device structure 1810 is of a different color than a color of mLED device structure 810B, and mLED device structures 1610.

FIG. 20C illustrates a cross sectional view of the structure of FIG. 20B after electromagnet 122 is deactivated and electromagnetic apparatus 300 is raised and removed. In an embodiment, three mLED device structure 810B, 1610, and 1810 are arranged laterally as shown. In an embodiment, there is a separation between the three mLED device structures 810B, 1610 and 1810, as shown. In other embodiments, the arrangement is such that centers of the three mLED device structures 810B, 1610, and 1810 each correspond to an apex of a triangle, as illustrated in FIG. 21.

In an embodiment, intermediate substrates 1300, 1700, and 1900 each include a large collection of mLED device structures that require transfer to a host substrate, such as assembly substrate 1500, depicted in FIGS. 20A-20C. In such an example, an electromagnetic apparatus, such as electromagnetic apparatus 600 may be utilized to perform transfer of a large collection of mLED device structures 810, 1610, and 1810.

FIGS. 22A-22F illustrate a method to transfer a plurality of mLED device structures from an intermediate substrate to a host substrate.

Figure 22A:
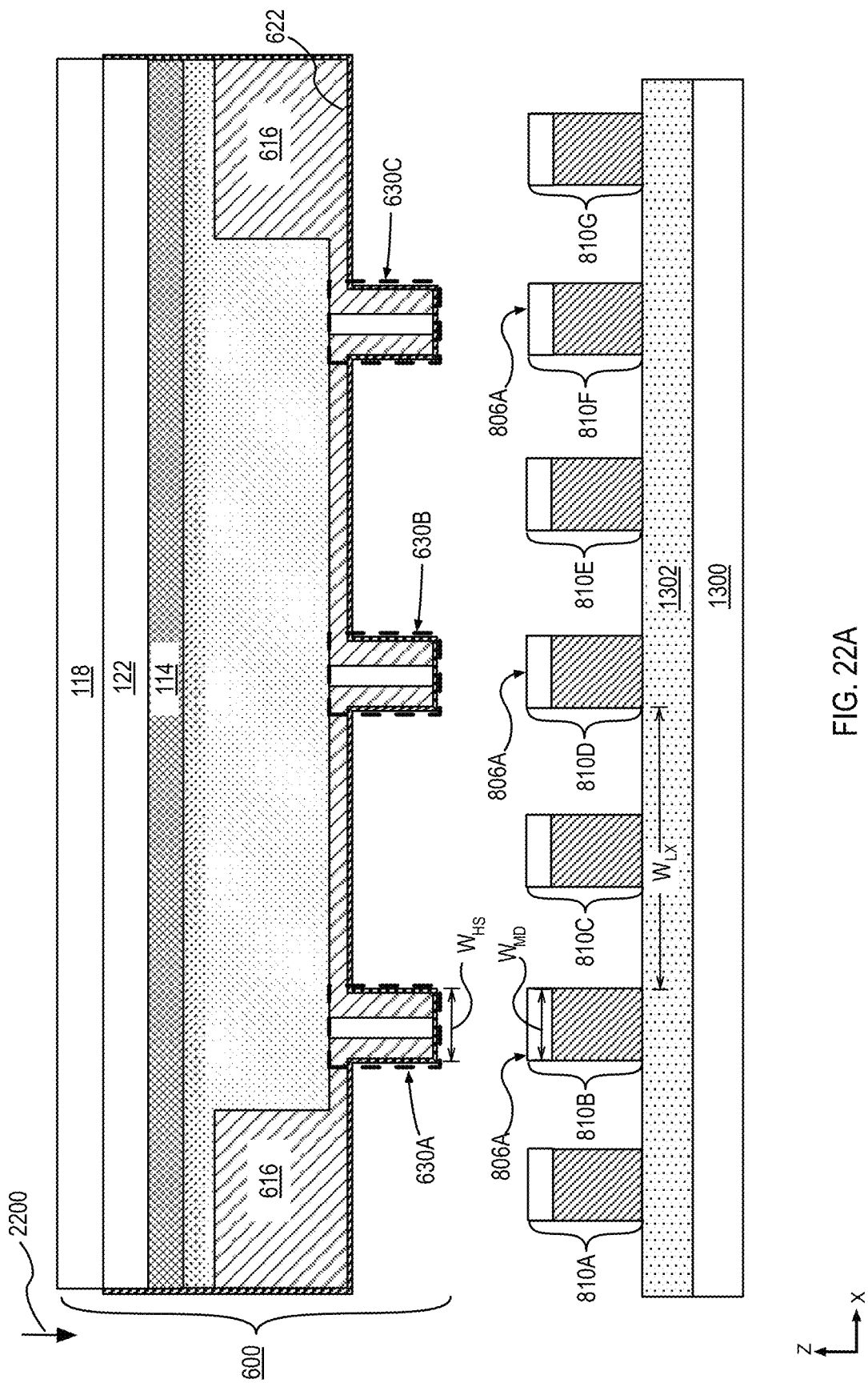
FIG. 22A illustrates a cross sectional view of an electromagnetic apparatus 600 directed towards a plurality of mLED device structures of a first type on an adhesion layer.

FIG. 22A illustrates a cross sectional view of electromagnetic apparatus 600 directed in the negative Z direction (as denoted by arrow 2200) towards a plurality of mLED device structure 810 on an adhesion layer 1302. In the illustrative embodiment, electromagnetic apparatus 600 has three head structures 630A, 630B and 630C that will subsequently make contact with an uppermost surface 806A of three corresponding mLED device structures 810, such as mLED device structure 810B, 810D and 810F. In an embodiment, each head structure 630A, 630B or 630C has a width, $W_{HS}$, that is same or substantially same as the width, $W_{MD}$, of each mLED device structure 810B, 810D or 810F.

Figure 22B:
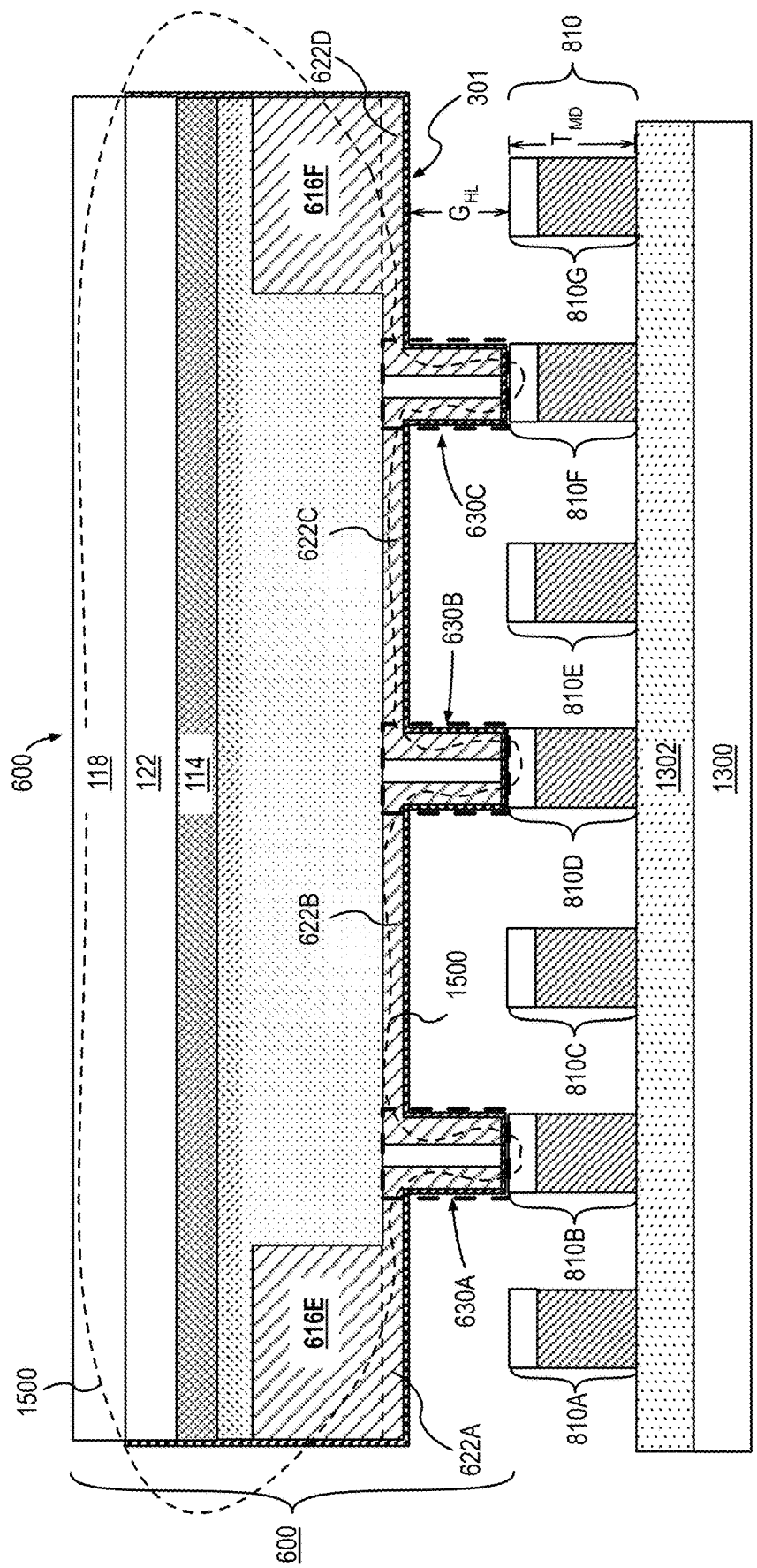
FIG. 22B illustrates a cross sectional view of the structure of FIG. 22A after each head structure in the plurality of head structures is in physical contact with a single mLED device structure of the first type.

FIG. 22B illustrates a cross sectional view of the structure of FIG. 22A after head structures 630A, 630B, and 630C are in physical contact with mLED device structures 810B, 810D, and 810F respectively. After contact, electromagnet 122 is energized, and magnetic flux 1503 (dashed line) is generated.

In an embodiment, the magnetic flux 1503 forms a closed loop through the magnetic structure portions 616E and 622A, head structure 630A, magnetic structure portion 622B, head structure 630B, magnetic structure portion 622C, head structure 630C and through the magnetic structure portions 622C and 616F as shown. The magnetic flux 1503 may be sufficiently confined within the magnetic structure portions 616A and 622A, head structure 630A, magnetic structure portion 622B, head structure 630B, magnetic structure portion 622C, head structure 630C and through the magnetic structure portions 622C and 616B and may not attract any mLED device structures immediately adjacent to mLED device structures 810B, 810D and 810F.

As illustrated, when the head structures 630A, 630B, and 630C make contact with mLED device structures 810B, 810D, and 810F, respectively, magnetic structure portions 622A, 622B, 622C, and 622D are separated from mLED device structures that are not designed to be picked up. In an illustrative embodiment, mLED device structures 810A, 810C, 810E, and 810G are separated by gap $G_{HL}$, from the magnetic structure portions 622A 622B, 622C and 622D, respectively. In an embodiment, gap, $G_{HL}$ is approximately at least half the thickness $T_{MD}$, of mLED device structure 810. In an embodiment, gap $G_{HL}$ that is equal to $(M)T_{MD}$ accommodates for extreme thickness variations in mLED device structure 810 and ensures that electromagnetic apparatus 600 only magnetically couples mLED device structure that are directly below the head structures 630A, 630B and 630C during operation.

Figure 22C:
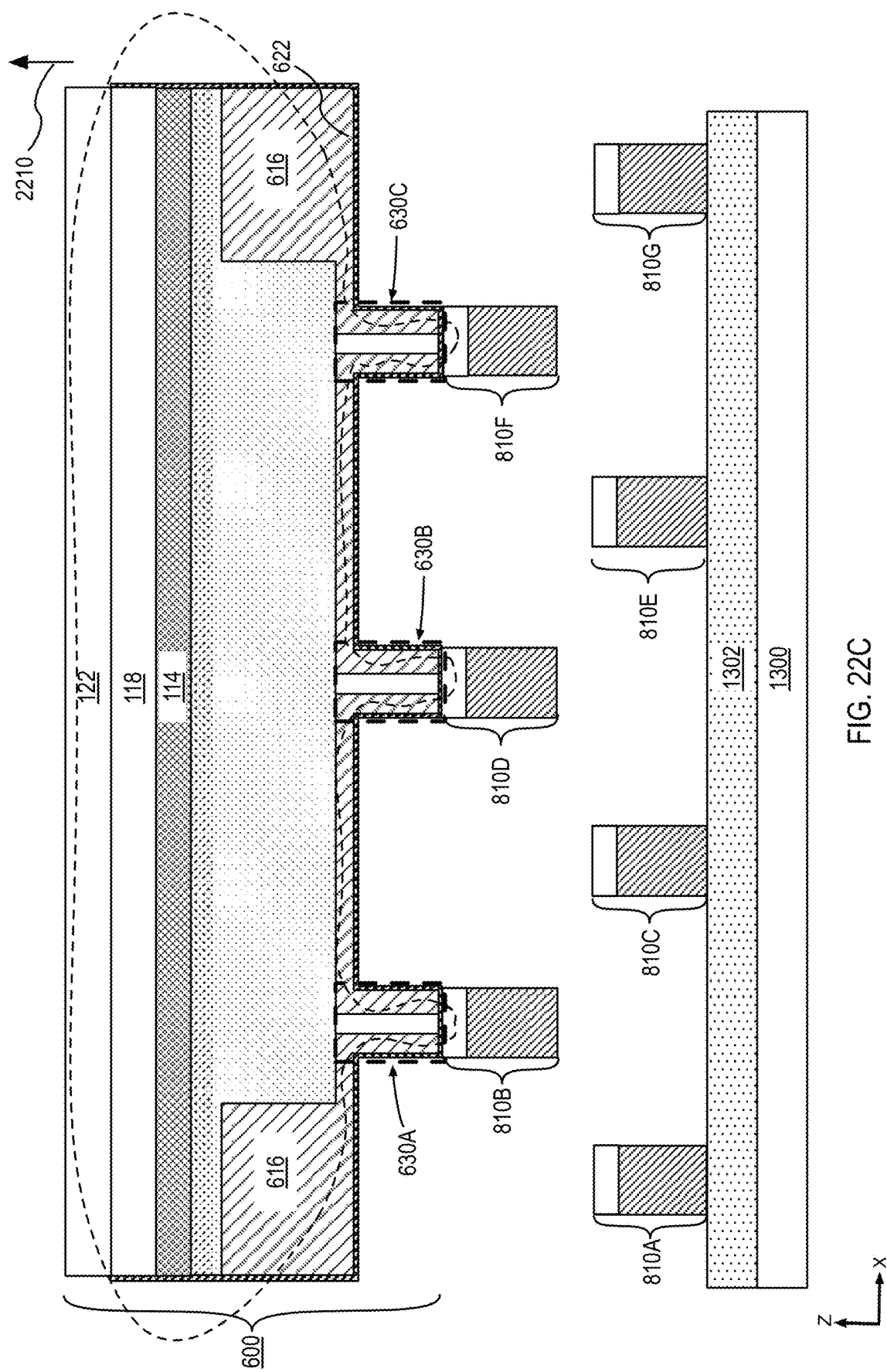
FIG. 22C illustrates a cross sectional view of the structure of FIG. 22B after the electromagnetic apparatus, and the magnetically coupled mLED device structures of the first type are removed.

FIG. 22C illustrates a cross sectional view of the structure of FIG. 22B after electromagnetic apparatus 600 is lifted and removed. The magnetic coupling strength between head structures 630A, 630B, and 630C and mLED device structures 810B, 810D, and 810F, respectively, is greater than an adhesive force between mLED device structure 810B, 810D, and 810F, and adhesion layer 1302. As a result, mLED device structures 810B, 810D and 810F, are removed from adhesion layer 1302 when electromagnetic apparatus 600 is raised (denoted by arrow 2210) for example, in the positive Z-direction, as shown.

Figure 22D:
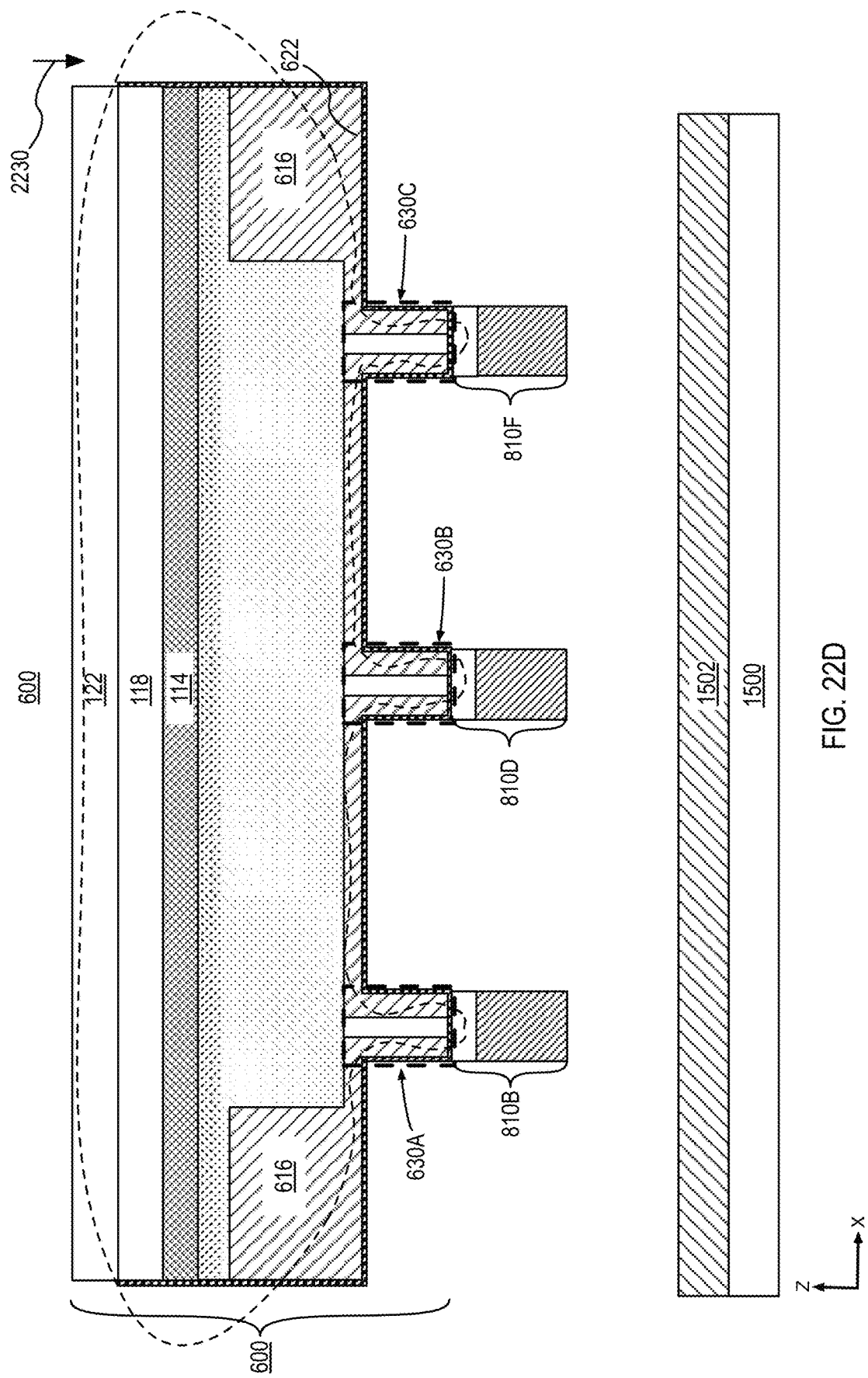
FIG. 22D illustrates a cross sectional view of the structure of FIG. 22C after the electromagnetic apparatus, and the magnetically coupled mLED device structures of the first type are directed towards an adhesion layer on an assembly substrate.

FIG. 22D illustrates a cross sectional view of electromagnetic apparatus 600 and mLED device structures 810B, 810D. and 810F, directed (as denoted by arrow 2230) in the negative Z direction towards assembly substrate 1500 and adhesion layer 1502 on assembly substrate 1500. In an embodiment, adhesion layer 1502 includes a material that is substantially similar to adhesion layer 1302. In an embodiment, adhesion layer 1502 includes a material that is UV light sensitive.

Figure 22E:
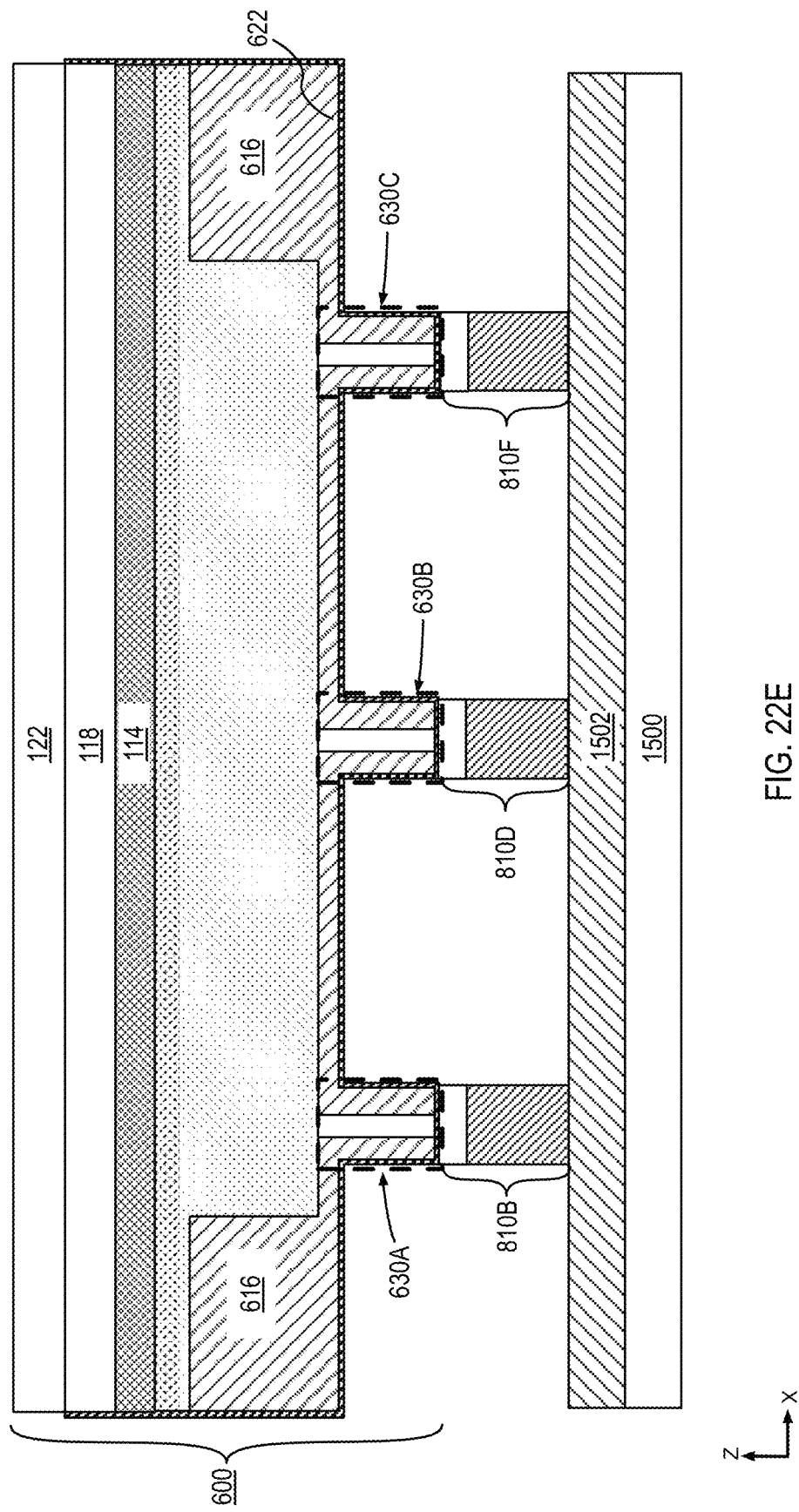
FIG. 22E illustrates a cross sectional view of the structure of FIG. 22D after the mLED device structures of the first type are placed on the adhesion layer.

FIG. 22E illustrates a cross sectional view of the structure of FIG. 22D after mLED device structures 810B, 810D, and 810F, are placed on adhesion layer 1502. Adhesion layer 1502 has a known adhesion strength and mLED device structures 810B, 810D, and 810F, are secured on the surface of adhesion layer 1502 after contact. Electromagnetic apparatus 600 is then deactivated. mLED device structure 810B is then released from electromagnetic apparatus 600, such that mLED device structures 810B, 810D, and 810F are decoupled from head structures 630A, 630B, and 630C, respectively.

Figure 22F:
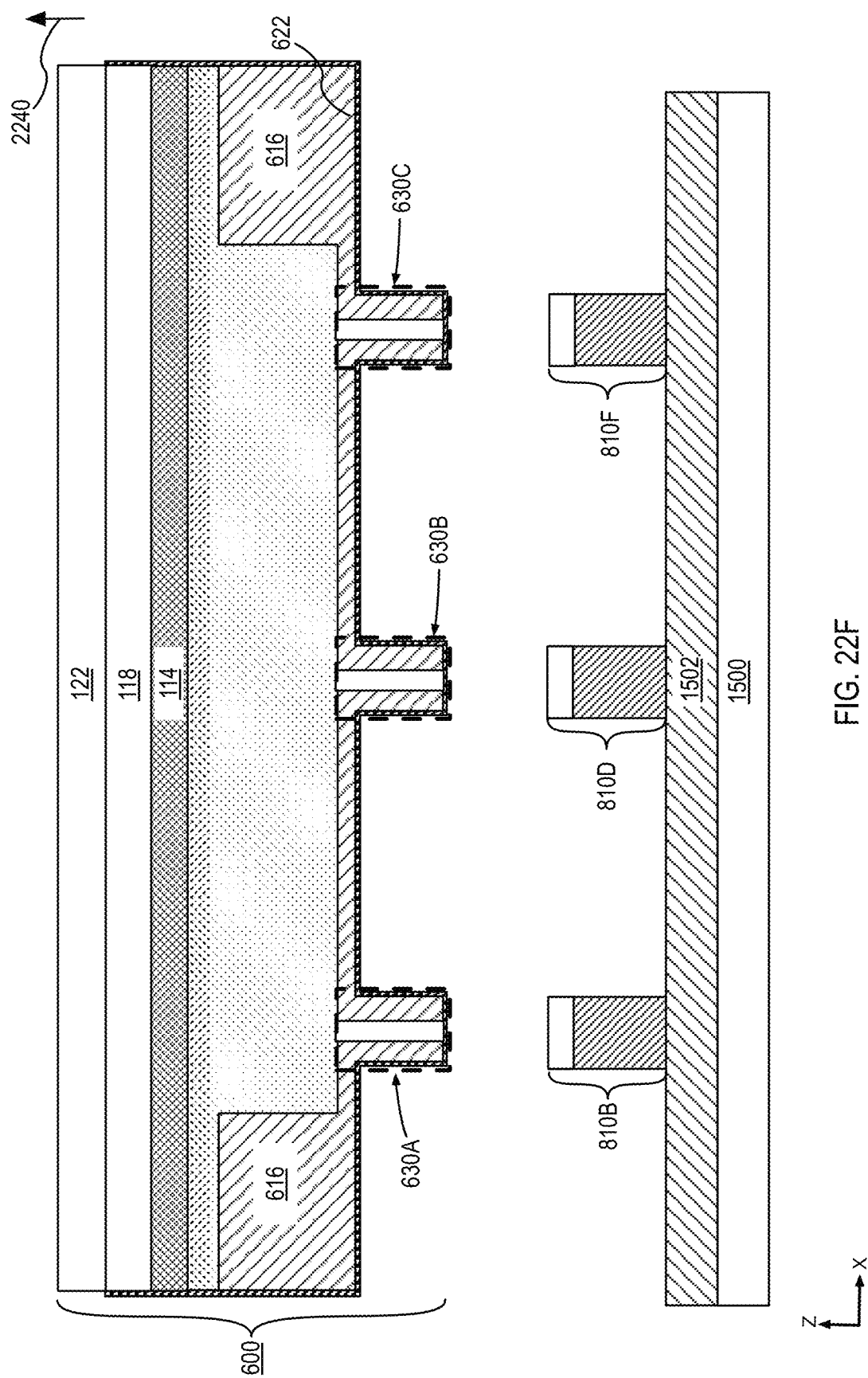
FIG. 22F illustrates a cross sectional view of the structure of FIG. 22D after the electromagnetic apparatus is raised.

Electromagnetic apparatus 600 is then raised (denoted by arrow 2240) for example, in the positive Z-direction, as shown. mLED device structures 630A, 630B, and 630C, remains on adhesion layer 1502 of assembly substrate 1502 as shown in FIG. 22F.

The method described above in association with FIG. 22A-22F, can be applied to removing a plurality of mLED device structures from substrates other than substrate 1300 and placed adjacent to mLED device structures 810B, 810D, and 810F. Depending on the number of head structures of an electromagnetic apparatus, a large collection of mLED device structures can be transferred from an intermediate substrate to host substrate 1500.

Figures 23A, 23B:
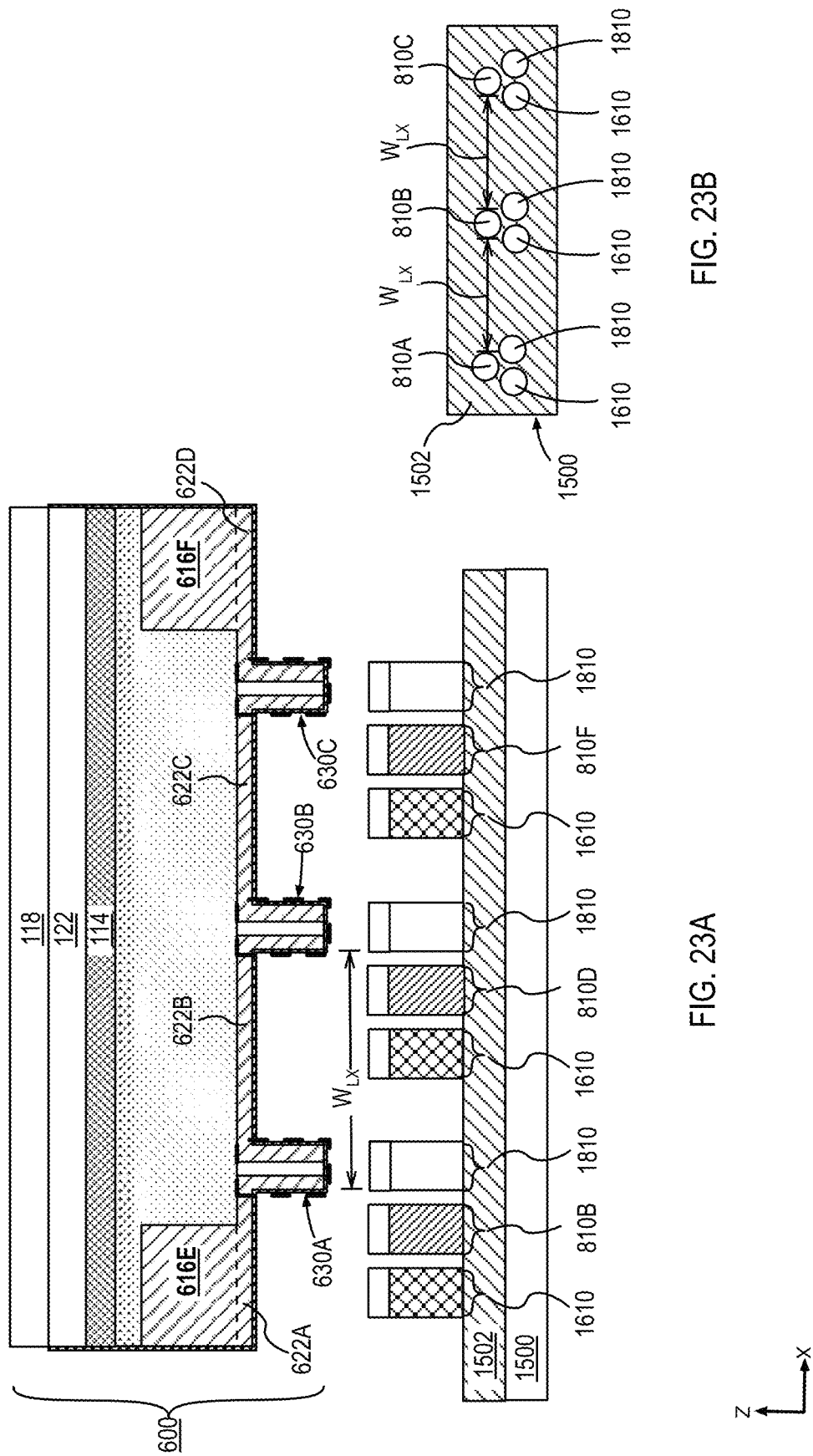
FIG. 23A illustrates the structure of FIG. 22D following the placement of an mLED device structure of a second type and a third mLED device structure of a third type adjacent to each of the mLED device of the first type structure using the electromagnetic apparatus.
FIG. 23B illustrates a plan-view depicting a plurality of arrangements of mLED device structures including mLED device structures of the first, second and third type on an adhesion layer, in accordance with embodiments of the present disclosure.

FIG. 23A illustrates the structure of FIG. 22D following the placement of mLED device structure 1610 and mLED device structure 1810 adjacent to each mLED device structures 810B, 810D, and 810F using electromagnetic apparatus 600. In an embodiment, the placement is performed by using the method described above in association with FIGS. 22A-22F.

In an embodiment, a plurality of mLED device structures 1610 are first removed from adhesion layer 1702 (depicted in FIGS. 17A and 17B) using electromagnetic apparatus 600. The plurality of mLED device structures 1610 all have same size or substantially same size as mLED device structures 810B, 810D, and 810F. In an embodiment, the plurality of mLED device structures 1610 that are removed also have the same spacing between mLED device structures 1610, because the same electromagnetic apparatus 600 is utilized. In another embodiment mLED device structures 810B, 810D, and 810F may have different sizes and spatial distribution. In some such embodiments, a different electromagnetic apparatus 600 is utilized for each type of mLED devices.

Subsequently, the plurality of mLED device structures 1610 are simultaneously placed on adhesion layer 1502 such that a single mLED device structure 1610 from the plurality of mLED device structures 1610 is adjacent to each of mLED device structures 810B, 810D, and 810F as shown in FIG. 23A. It is to be appreciated that the process of placing device structures 1610 adjacent to a corresponding mLED device structure 810B, 810D, or 810F does not impact mLED device structure 810B, 810D, or 810F.

In one such embodiment, the method (described in association with FIGS. 22A-22F) is continued to remove a plurality of mLED device structures 1810 from adhesion layer 1902 (illustrated in FIGS. 19A and 19B) using electromagnetic apparatus 600. The plurality of mLED device structures 1810 all have same or substantially same size as mLED device structures 810B, 810D, and 810F. In an embodiment, the plurality of mLED device structures 1810 that are removed also have same spacing as spacing between mLED device structures 810B, 810D, and 810F.

Subsequently, the plurality of mLED device structures 1810 are simultaneously placed on adhesion layer 1502 such that a single mLED device structure 1810 from the plurality of mLED device structures 1810 is adjacent to mLED device structures 810B, 810D, and 810F as shown in FIG. 23. In the illustrative embodiment, each of mLED device structures 810B, 810D, or 810F is between mLED device structure 1610 and mLED device structure 1810. It is to be appreciated that the process of placing each of the device structures 1810 adjacent to a corresponding mLED device structure 810B, 810D, or 810F does not impact mLED device structure 810B, 810D, or 810F.

In other embodiments, the arrangement of the different mLED device structures leads to a formation of a cluster of mLED device structures. For example, within the cluster centers of each of the three mLED device structures correspond to an apex of a triangle as illustrated in FIG. 23B. In an illustrative embodiment, mLED device structures 810B, 1610, and 1810 form a first cluster, mLED device structures 810D, 1610, and 1810 form a second cluster and mLED device structures 810F, 1610, and 1810 form a third cluster.

While the arrangement between each mLED device structure within a cluster may not be linear such as is depicted in FIG. 23A, the relative spacing between any two mLED device structures from two corresponding adjacent clusters is maintained after transferring from an intermediate substrate to a host substrate.

Figure 24:
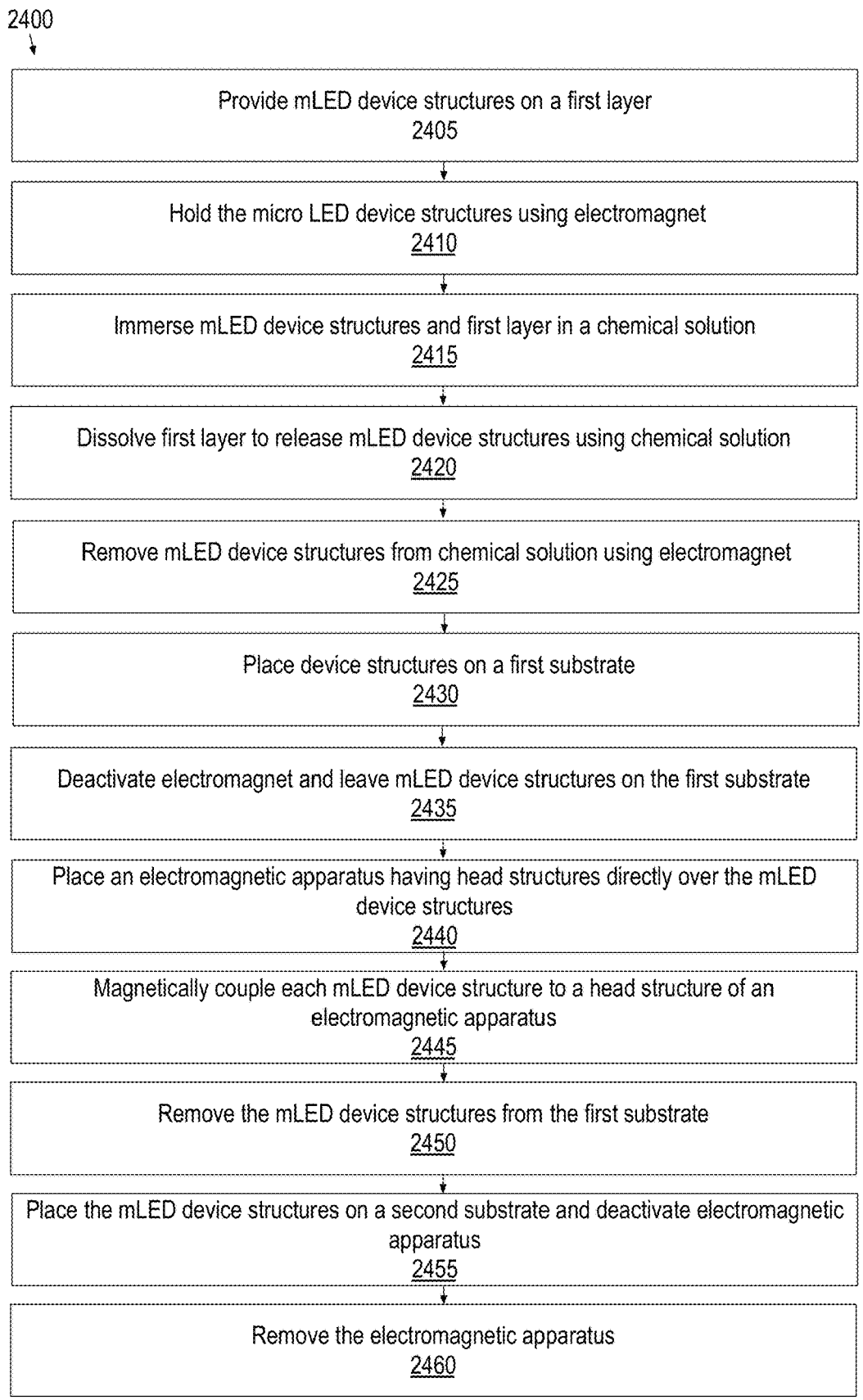
FIG. 24 illustrates a flow diagram depicting a method to transfer mLED device structures from a native substrate to an assembly substrate in accordance with embodiments of the present disclosure.

FIG. 24 illustrates a flow diagram depicting method 2400 to transfer mLED device structures from a substrate to an assembly substrate in accordance with embodiments of the present disclosure. The method begins at operation 2405 by providing a device structure on a first layer over a first substrate as depicted in the cross-sectional illustration of FIG. 10. The method continues at operation 2410 by placing an electromagnet in contact with a plurality of mLED device structures and activating the electromagnet and attracting the device structures to a surface of the electromagnet proximal to the device structures, as depicted in the cross-sectional illustration of FIG. 11. Method 2400 continues at operation 2415 by immersing the substrate and the device structures in a chemical solution, as depicted in the cross-sectional illustration of FIG. 12A. Method 2400 continues at operation 2420 by chemically dissolving and removing the first layer between the device structures and the first substrate, as depicted in the cross-sectional illustration of FIG. 12C. Method 2400 continues at operation 2425 by removing device structures adjacent to the surface of the electromagnet from the chemical solution, as depicted in the cross-sectional illustration of FIG. 12D. Method 2400 continues at operation 2430 by providing a substrate having a first adhesion layer and placing the device structures on a first adhesion layer as depicted in the cross-sectional illustration of FIG. 13. Method 2400 continues at operation 2435 by deactivating and removing the electromagnet, wherein the device structures adhere to the first adhesion layer as depicted in the cross-sectional illustration of FIG. 14A. Method 2400 continues at operation 2440 by placing an electromagnetic apparatus comprising head structures directly over the device structures, as depicted in the cross-sectional illustration of FIG. 22A. Method 2400 continues at operation 2445 by activating the electromagnetic apparatus and magnetically coupling device structures proximal to the head structures as depicted in the cross-sectional illustration of FIG. 22B. Method 2400 continues at operation 2450 by lifting and removing the device structures proximal to the head structures from the first adhesion layer as depicted in the cross-sectional illustration of FIG. 22C. Method 2400 continues at operation 2455 by placing the device structures proximal to the head structures onto a second adhesion layer over a third substrate and de-activating the electromagnetic apparatus as depicted in the cross-sectional illustration of FIG. 22E. Method 2400 concludes at operation 2460 by removing the electromagnetic apparatus from the third substrate, as depicted in the cross-sectional illustration of FIG. 22F.

Figure 25:
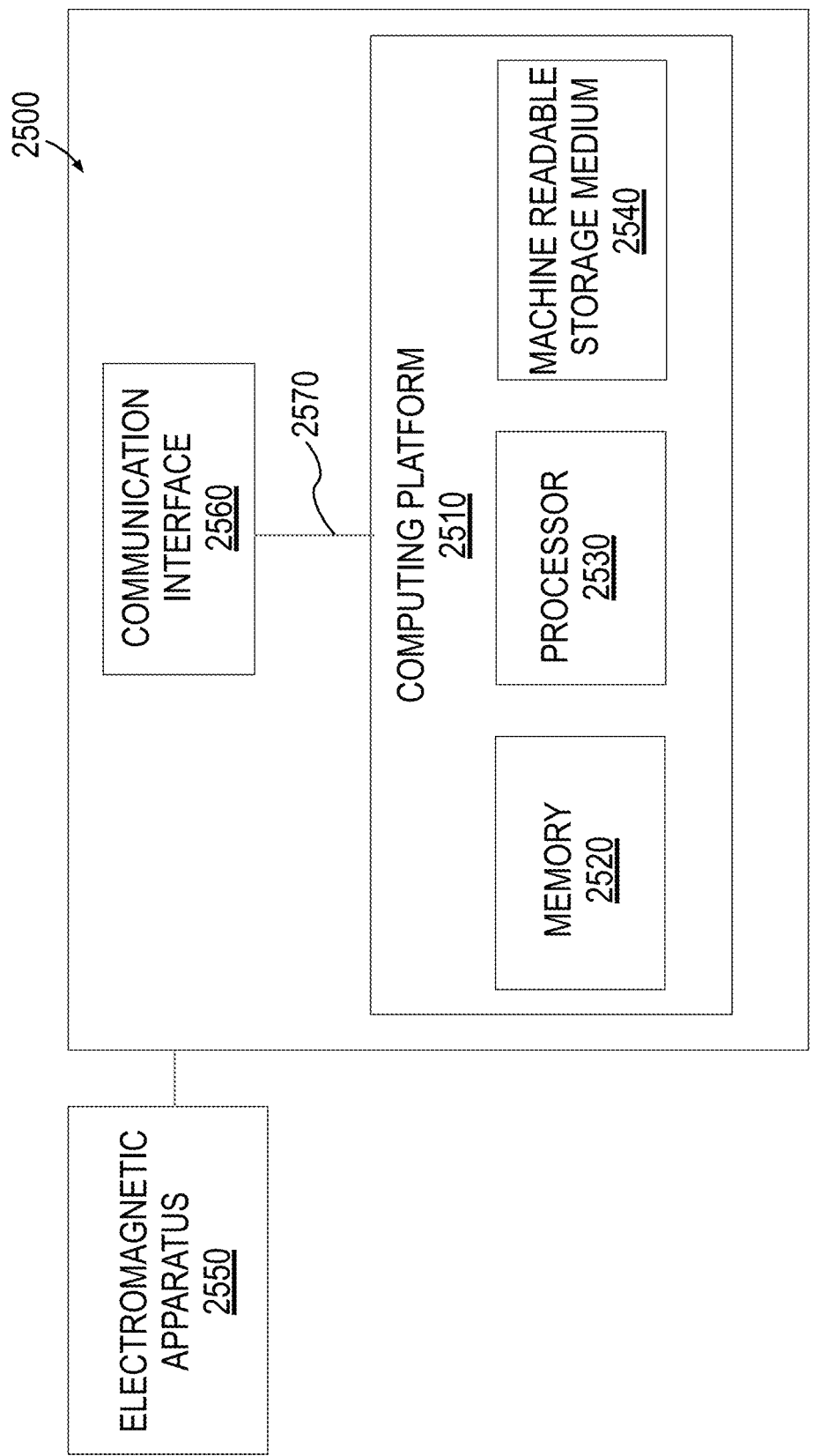
FIG. 25 illustrates a computing device with machine-readable storage media that stores instructions for performing one or more methods to transfer mLED device structures from a native substrate to an assembly substrate, in accordance with some embodiments of the disclosure.

FIG. 25 illustrates a computing device with machine-readable storage media that stores instructions for performing one or more methods to transfer mLED device structures from a native substrate to an assembly substrate, in accordance with some embodiments of the disclosure.

Elements of embodiments (e.g., flowchart 2400, and scheme described with reference to various figures) are also provided as a machine-readable medium (e.g., memory) for storing the computer-executable instructions (e.g., instructions to implement any other processes discussed herein). In some embodiments, computing platform 2510 comprises memory 2520, Processor 2530, machine-readable storage media 2540 (also referred to as tangible machine readable medium), communication interface 2560 (e.g., wireless or wired interface), and network bus 2570 coupled together as shown and with the electromagnetic apparatus 2550 (e.g., electromagnetic apparatus 600).

In some embodiments, Processor 2530 is a Digital Signal Processor (DSP), an Application Specific Integrated Circuit (ASIC), a general purpose Central Processing Unit (CPU), or a low power logic implementing a simple finite state machine to perform the method of flowchart 2400, and scheme described with reference to various figures, etc.

In some embodiments, the various logic blocks of system 500 are coupled together via Network Bus 2570. Any suitable protocol may be used to implement Network Bus 2570. In some embodiments, Machine-Readable Storage Medium 2540 includes Instructions (also referred to as the program software code/instructions) for performing one or more methods to transfer mLED device structures from a native substrate to an assembly substrate as described with reference to various embodiments and flowchart.

Program software code/instructions associated with flowchart 2400 (and/or various embodiments) and executed to implement embodiments of the disclosed subject matter may be implemented as part of an operating system or a specific application, component, program, object, module, routine, or other sequence of instructions or organization of sequences of instructions referred to as "program software code/instructions," "operating system program software code/instructions," "application program software code/instructions," or simply "software" or firmware embedded in processor. In some embodiments, the program software code/instructions associated with flowchart 2400 (and/or various embodiments) are executed by system 2500.

In some embodiments, the program software code/instructions associated with flowchart 2400 (and/or various embodiments) are stored in a computer executable storage medium 2540 and executed by Processor 2530. Here, computer executable storage medium 2540 is a tangible machine-readable medium that can be used to store program software code/instructions and data that, when executed by a computing device, causes one or more processors (e.g., Processor 2530) to perform a method(s) as may be recited in one or more accompanying claims directed to the disclosed subject matter.

The tangible machine readable medium 2540 may include storage of the executable software program code/instructions and data in various tangible locations, including for example ROM, volatile RAM, non-volatile memory and/or cache and/or other tangible memory as referenced in the present application. Portions of this program software code/instructions and/or data may be stored in any one of these storage and memory devices. Further, the program software code/instructions can be obtained from other storage, including, e.g., through centralized servers or peer to peer networks and the like, including the Internet. Different portions of the software program code/instructions and data can be obtained at different times and in different communication sessions or in the same communication session.

The software program code/instructions (associated with flowcharts 2400 and other embodiments) and data can be obtained in their entirety prior to the execution of a respective software program or application by the computing device. Alternatively, portions of the software program code/instructions and data can be obtained dynamically, e.g., just in time, when needed for execution. Alternatively, some combination of these ways of obtaining the software program code/instructions and data may occur, e.g., for different applications, components, programs, objects, modules, routines or other sequences of instructions or organization of sequences of instructions, by way of example. Thus, it is not required that the data and instructions be on a tangible machine readable medium 2540 in entirety at a particular instance of time.

Examples of tangible computer-readable media 2540 include but are not limited to recordable and non-recordable type media such as volatile and non-volatile memory devices, read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs), etc.), among others. The software program code/instructions may be temporarily stored in digital tangible communication links while implementing electrical, optical, acoustical or other forms of propagating signals, such as carrier waves, infrared signals, digital signals, etc. through such tangible communication links.

In general, tangible machine readable medium 2540 includes any tangible mechanism that provides (i.e., stores and/or transmits in digital form, e.g., data packets) information in a form accessible by a machine (i.e., a computing device), which may be included, e.g., in a communication device, a computing device, a network device, a personal digital assistant, a manufacturing tool, a mobile communication device, whether or not able to download and run applications and subsidized applications from the communication network, such as the Internet, e.g., an iPhone®, Galaxy®, Blackberry® Droid®, or the like, or any other device including a computing device. In one embodiment, processor-based system is in a form of or included within a PDA (personal digital assistant), a cellular phone, a notebook computer, a tablet, a game console, a set top box, an embedded system, a TV (television), a personal desktop computer, etc. Alternatively, the traditional communication applications and subsidized application(s) may be used in some embodiments of the disclosed subject matter.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In a first example, an electromagnetic apparatus includes a first structure including non-magnetic material, a second structure including dielectric, where the second structure is above a first portion of the first structure. The electromagnetic apparatus further includes a third structure including a first sidewall portion adjacent to a first sidewall of the second structure and above a second portion of the first structure, where the first sidewall portion includes a magnetic material. The third structure further includes a second sidewall portion adjacent to a second sidewall of the second structure opposite to the first sidewall of the second structure, where the second sidewall portion is above a third portion of the first structure and an electromagnet is below and coupled with the third structure.

In second example, for any of first examples, the third structure includes a magnetic material including one or more of: mu-alloy, perma-alloy, cobalt, iron, nickel, alloy of iron and nickel, or an alloy of two or more of cobalt, iron or nickel.

In third example, for any of the first through second examples, the magnetic material has a permeability greater than 50.

In fourth example, for any of the first through third examples, the second structure has a first width along a first direction, the first sidewall portion has a second width along the first direction and the second sidewall portion has a third width along the first direction.

In fifth example, for any of the first through fourth examples, the first width is less than the second or the third widths.

In sixth example, for any of the first through fifth examples, the first width is between 20% to 30% of the combined total of the first, the second and the third widths.

In seventh example, for any of the first through sixth examples, the combined total of the first, the second and the third widths is between 100 nm-2 micron.

In eighth example, for any of the first through seventh examples, the first structure includes a metal or a metal alloy and has a thickness between 100 nm and 200 nm.

In ninth example, for any of the first through eighth examples, top surfaces of the first sidewall portion, the second sidewall portion and the second structure are co-planar.

In tenth example, for any of the first through ninth examples, the second structure includes a dielectric material including silicon and oxygen, silicon and carbon or silicon and nitrogen.

In eleventh example, for any of the first through tenth examples, the first sidewall and the second sidewall of the second structure are substantially vertical relative to a bottom surface of the second structure.

In twelfth example, an electromagnetic apparatus, includes a first structure including a non-magnetic material, a second structure including a dielectric on a first portion of the first structure. The electromagnetic apparatus further includes a third structure including a first magnetic structure adjacent to a first sidewall of the second structure, where the first magnetic structure extends continuously onto a second portion of the first structure and adjacent to a first sidewall of the first structure. The third structure further includes a second magnetic structure adjacent to a second sidewall of the second structure, opposite to the first sidewall, where the second magnetic structure extends onto a third portion of the first structure and on a second sidewall of the first structure and an electromagnet is below and coupled with the third structure.

In thirteenth example, for any of the twelfth examples, the first magnetic structure and second magnetic structure include a same magnetic material.

In a fourteenth example, for any of the twelfth through thirteenth examples, the first magnetic structure adjacent to the first sidewall of the second structure has a width that is the same as a thickness of the first magnetic structure extending continuously onto a second portion of the first structure.

In a fifteenth example, for any of the twelfth through fourteenth examples, the second magnetic structure adjacent to the second sidewall of the second structure has a width that is the same as a thickness of the first magnetic structure extending continuously onto a second portion of the first structure.

In sixteenth example, for any of the twelfth through fifteenth examples, the first magnetic structure adjacent to the first sidewall of the second structure has a width that is the same as a width of the second magnetic structure adjacent to the second sidewall of the second structure.

In seventeenth example, for any of the fifteenth through sixteenth examples, the second structure has a height that is less than a height of the first structure.

In eighteenth example, for any of the fifteenth through seventeenth examples further includes an encapsulation on a top surface of the second structure, on the third structure and on sidewalls of first structure not laterally adjacent to the third structure.

In nineteenth example, an electromagnetic apparatus includes a first structure including a non-magnetic material, a second structure including a dielectric material on a first portion of the first structure a third structure including the dielectric material on a second portion of the first structure and a fourth structure. The fourth structure includes a first magnetic structure adjacent to a first sidewall of the second structure, where the first structure extends continuously onto a third portion of the first structure and adjacent to a first sidewall of the first structure. The fourth structure further includes a second magnetic structure adjacent to a first sidewall of the third structure, where the second magnetic structure extends onto a fourth portion of the first structure and on a second sidewall of the first structure. The fourth structure further includes a third magnetic structure adjacent to a second sidewall of the second structure, adjacent to a second sidewall of the third structure and extends continuously onto a fifth portion of the first structure between the second sidewall of the second structure and the second sidewall of the third structure. The fourth structure further includes an electromagnet below and coupled with the fourth structure.

In a twentieth example, for any of the nineteenth examples, the second structure and the third structure have uppermost surfaces that are co-planar.

In twenty first example, for any of the twentieth example, a method of making an electromagnetic apparatus includes forming a first structure including a non-magnetic material. The method further includes forming a magnetic structure on sidewalls of the first structure and forming a dielectric layer on the first structure and patterning the dielectric layer to form an isolation structure. The method further includes forming a first magnetic layer on the first structure, adjacent to the isolation structure and on portions of the magnetic structure and formation of a second magnetic layer on sidewalls of the isolation structure and on portions of the first magnetic layer.

In twenty second example, for any of the twentieth through twenty first examples, where forming the first structure includes forming a base structure including a non-magnetic material and forming a core structure including the non-magnetic material on a portion of the base structure.

In twenty third example, for any of the twentieth through twenty second examples, where forming the core structure includes forming sidewalls with vertical profiles.

In twenty fourth example, for any of the twentieth through twenty third examples, where the method further includes planarizing top portions of the isolation structure and top portion of the second magnetic layer to form top surfaces of the isolation structure and the second magnetic layer that are coplanar.

In a twenty fifth example, a method for transferring micro-devices, the method includes providing a device structure on a first layer over a first substrate and positioning an electromagnetic apparatus directly over the device structure. The method further includes activating an electromagnet in the electromagnetic apparatus to generate and confine a magnetic flux into a magnetic structure of the electromagnetic apparatus and magnetically couple the device structure to a surface of the magnetic structure proximal to the device structure. The method further includes lifting and removing the device structure from the first substrate and placing the device structure on a second layer over a second substrate, where the second substrate is separate from the first substrate. The method further includes releasing the device structure from the electromagnet, such that the device structure is decoupled from the electromagnet.

In twenty sixth example, for any of twenty fifth examples, where positioning the electromagnetic apparatus includes physically contacting a top portion of the device structure.

In twenty seventh example, for any of the twenty fifth through twenty sixth examples, the magnetic flux couples a ferromagnetic portion of the device structure to the magnetic structure.

In twenty eighth example, for any of the twenty fifth through twenty seventh examples, where a coupling strength between the magnetic structure and the device structure is greater than an adhesive force between the device structure and the first layer.

In twenty ninth example, for any of the twenty fifth through twenty eighth examples, where placing the device structure on a second layer causes the device structure to adhere to the second layer.

In thirtieth example, for any of the twenty fifth through twenty ninth examples, where the device structure includes a light emitting diode.

In thirty first example, for any of the twenty fifth through thirtieth examples, the device structure is a first device structure, and the electromagnetic apparatus is a first electromagnetic apparatus, and the electromagnet is a first electromagnet and the method includes providing a second device structure on a third layer over a third substrate. The method further includes positioning the second electromagnetic apparatus directly over the device structure and activating a second electromagnet in the second electromagnetic apparatus, where the activating generates and confining a magnetic flux into a second magnetic structure of the second electromagnetic apparatus and magnetically coupling the second device structure to a surface of the second magnetic structure proximal to the second device structure. The method further includes lifting and removing the second device structure from the third substrate, placing the second device structure on the second layer over the second substrate adjacent to the first device structure and releasing the second device structure from the second electromagnet, such that the second device structure is decoupled from the second electromagnet.

In thirty second example, for any of the thirty first examples, the method further includes providing a third device structure on a fourth layer over a fourth substrate and positioning a third electromagnetic apparatus directly over the third device structure. The method further includes activating a third electromagnet in the third electromagnetic apparatus, where the activating generates and confines a magnetic flux into a third magnetic structure of the third electromagnetic apparatus and magnetically couples the third device structure to a surface of the third magnetic structure proximal to the third device structure. The method further includes lifting and removing the third device structure from the fourth substrate and placing the third device structure on the second layer over the second substrate adjacent to the first device structure and the second device structure. The method further includes releasing the third device structure from the third electromagnet, such that the third device structure is decoupled from the third electromagnet.

In thirty third example, for any of the thirty second examples, where the third electromagnetic apparatus is the same as the first electromagnetic apparatus and the second electromagnetic apparatus.

In thirty fourth example, for any of the twenty fifth through thirty second examples, where placing and releasing the third device structure does not affect the position of the first device structure or the second device structure.

In thirty fifth example, a method for transferring micro-devices includes providing device structures over a first substrate and positioning an electromagnetic apparatus including head structures directly over the device structures. The method further includes activating an electromagnet in the electromagnetic apparatus to generate a magnetic flux in the head structures and magnetically coupling device structures proximal to the head structures. The method further includes lifting and removing the device structures proximal to the head structures from the first substrate and placing the portion of the device structures proximal to the head structures onto a second substrate. The method further includes de-activating the electromagnet and removing the electromagnetic apparatus away from second substrate.

In thirty sixth example, for any of the thirty fifth example, where each head structure couples one device structure directly under the head structure.

In thirty seventh example, for any of the thirty fifth through thirty sixth examples, where the head structure makes a physical contact with the device structure.

In a thirty eighth example, for any of the thirty fifth through thirty seventh examples, where the device structures not directly under the head structures are not magnetically coupled and left on the first substrate.

In a thirty ninth example, for any of the thirty fifth through fourteenth examples, where the device structures not directly under the head structures do not come in contact with any portion of the electromagnetic apparatus.

In fortieth example, for any of the thirty fifth through thirty ninth examples, where the first substrate includes a first adhesion layer between the device structures and the first substrate, and the second substrate includes a second adhesion layer on the second substrate.

In forty first example, for any of the thirty fifth, where placing the device structures on the second substrate and deactivating the electromagnetic apparatus causes the head structures to be magnetically decoupled with the device structures.

In forty second example, a method for transferring microdevices includes providing device structures on a first layer over a first substrate and placing an electromagnet over the device structure. The method further includes activating the electromagnet and attracting the device structures to a surface of the electromagnet proximal to the device structures. The method further includes immersing the first substrate and the device structures in a chemical solution and chemically dissolving and removing the first layer between the device structures and the first substrate. The method further includes removing the device structures adjacent to the surface of the electromagnet from the chemical solution and providing a second substrate having a first adhesive layer. The method further includes placing the device structures on a first adhesive layer, and deactivating and removing the electromagnet, where the device structures adhere to the first adhesive layer. The method further includes placing an electromagnetic apparatus including head structures directly over the device structures and activating the electromagnetic apparatus, to generate a magnetic flux in the head structures and magnetically couple device structures proximal to the head structures. The method further includes lifting and removing the device structures proximal to the head structures from the first adhesive layer, placing the device structures proximal to the head structures onto a second adhesive layer over a third substrate and de-activating and removing the electromagnetic apparatus from the third substrate.

In forty third examples, for any of the forty second example, where placing an electromagnet over the device structures causes a lowest surface of the electromagnet to come into contact with a top surface of a plurality of device structure.

In a forty fourth example, for any of the forty second through forty third example, where placing an electromagnet over the device structures causes a gap between the lowest surface of the electromagnet and a top surface of at least one device structure other than the plurality of device structures.

In forty fifth examples, for any of the forty second through forty fourth examples, where chemically dissolving and removing the first layer between the device structures and the first substrate causes the gap to be eliminated as the electromagnet pulls the at least one device structure to the lowest surface.

In forty sixth example, for any of the forty second through forty fifth examples, where a spacing between device structures remains unchanged after being placed on the first adhesive layer.

In forty seventh example, a machine-readable media having one or more instructions, that when executed, causes an apparatus to perform operations including providing a device structure on a first layer over a first substrate. The media further causes positioning an electromagnetic apparatus directly over the device structure and activating an electromagnet in the electromagnetic apparatus. The media further causes the electromagnet to generate and confine a magnetic flux into a magnetic structure of the electromagnetic apparatus and magnetically couple the device structure to a surface of the magnetic structure proximal to the device structure. The media further causes lifting and removing the device structure from the first substrate and placing the device structure on a second layer over a second substrate, where the second substrate is separate from the first substrate. The media further causes releasing the device structure from the electromagnet, such that the device structure is decoupled from the electromagnet.

In forty eighth example, for any of the forty seventh examples, where positioning the electromagnetic apparatus includes physically contacting a top portion of the device structure.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An electromagnetic apparatus, comprising:
   a first structure comprising a non-magnetic material;
   a second structure comprising a dielectric material on a first portion of the first structure;
   a third structure comprising the dielectric material on a second portion of the first structure;
   a fourth structure, comprising:
     a first magnetic structure adjacent to a first sidewall of the second structure, the first magnetic structure extending continuously onto a third portion of the first structure and adjacent to a first sidewall of the first structure;
     a second magnetic structure adjacent to a first sidewall of the third structure, the second magnetic structure extending onto a fourth portion of the first structure and on a second sidewall of the first structure; and
     a third magnetic structure adjacent to a second sidewall of the second structure, adjacent to a second sidewall of the third structure and extending continuously onto a fifth portion of the first structure, the fifth portion between the second sidewall of the second structure and the second sidewall of the third structure; and
   an electromagnet below and coupled with the fourth structure.

2. The electromagnetic apparatus of claim 1, wherein the second structure and the third structure have uppermost surfaces that are co-planar.

3. The electromagnetic apparatus of claim 1, wherein the fourth structure comprises a magnetic material including one or more of: mu-alloy, perma-alloy, cobalt, iron, nickel, alloy of iron and nickel, or an alloy of two or more of cobalt, iron or nickel.

4. The electromagnetic apparatus of claim 3, wherein the magnetic material has a permeability greater than 50.

5. The electromagnetic apparatus of claim 1, wherein the second structure has a first width along a first direction, wherein the first magnetic structure adjacent to the first sidewall of the second structure has a second width along the first direction and the third magnetic structure adjacent to the second sidewall of the second structure has a third width along the first direction.

6. The electromagnetic apparatus of claim 5, wherein the first width is less than the second or the third widths.

7. The electromagnetic apparatus of claim 6, wherein the first width is between 20% to 30% of the combined total of the first, the second and the third widths.

8. The electromagnetic apparatus of claim 7, wherein the combined total of the first, the second and the third widths is between 100 nm-2 microns.

9. The electromagnetic apparatus of claim 1, wherein the first structure comprises a metal or a metal alloy and has a thickness between 100 nm and 200 nm.

10. The electromagnetic apparatus of claim 1, wherein a top surface of the first magnetic structure adjacent to a first sidewall of the second structure, a top surface of the third magnetic structure adjacent to a second sidewall of the second structure and a top surface of the second structure are co-planar.

11. The electromagnetic apparatus of claim 1, wherein the second structure comprises a dielectric material including silicon and oxygen, silicon and carbon or silicon and nitrogen.

12. The electromagnetic apparatus of claim 1, wherein the first sidewall and the second sidewall of the second structure are substantially vertical relative to a bottom surface of the second structure.

13. The electromagnetic apparatus of claim 1, wherein the second magnetic structure adjacent to the first sidewall of the third structure has a width that is the same as a width of the third magnetic structure adjacent to the second sidewall of the third structure.

14. The electromagnetic apparatus of claim 1, wherein the first magnetic structure, the second magnetic structure and the third magnetic structure each comprise a same magnetic material.

15. The electromagnetic apparatus of claim 1, wherein the first magnetic structure adjacent to the first sidewall of the second structure has a width that is the same as a thickness of the first magnetic structure extending continuously onto a third portion of the first structure.

16. The electromagnetic apparatus of claim 1, wherein the second magnetic structure adjacent to the first sidewall of the third structure has a width that is the same as a thickness of the second magnetic structure extending continuously onto a fourth portion of the third structure.

17. The electromagnetic apparatus of claim 1, wherein the first magnetic structure adjacent to the first sidewall of the second structure has a width that is the same as a width of the second magnetic structure adjacent to the second sidewall of the second structure.

18. The electromagnetic apparatus of claim 1, further includes an encapsulation on a top surface of the second structure, on the third structure and on sidewalls of first structure not laterally adjacent to the third structure.

19. The electromagnetic apparatus of claim 1, wherein the electromagnetic apparatus is a first electromagnetic apparatus array, wherein the electromagnet is a first electromagnet and wherein the electromagnetic apparatus comprises a second electromagnetic array separated from the first electromagnetic apparatus array by a dielectric layer, the second electromagnetic array, comprising:
 a fifth structure comprising a non-magnetic material;
 a sixth structure comprising the dielectric material on a first portion of the fifth structure;
 a seventh structure comprising the dielectric material on a second portion of the fifth structure;
 an eighth structure, comprising:
  a first magnetic structure adjacent to a first sidewall of the sixth structure, the first magnetic structure extending continuously onto a third portion of the fifth structure and adjacent to a first sidewall of the fifth structure;
  a second magnetic structure adjacent to a first sidewall of the seventh structure, the second magnetic structure extending onto a fourth portion of the fifth structure and on a second sidewall of the fifth structure; and
  a third magnetic structure adjacent to a second sidewall of the sixth structure, adjacent to a second sidewall of the seventh structure and extending continuously onto a fifth portion of the fifth structure, the fifth portion between the second sidewall of the sixth structure and the second sidewall of the seventh structure; and
 a second electromagnet below and coupled with the eighth structure.

20. The electromagnetic apparatus of claim 19, wherein the first magnetic structure adjacent to the first sidewall of the fifth structure is coupled with the first magnetic structure adjacent to the first sidewall of the first structure by a fourth magnetic structure.

21. The electromagnetic apparatus of claim 20, wherein the first electromagnet and the second electromagnet are coupled.

* * * * *